United States Patent
Koh

(10) Patent No.: US 10,918,150 B2
(45) Date of Patent: Feb. 16, 2021

(54) METHODS AND SYSTEMS FOR CUSTOMIZED GARMENT AND OUTFIT DESIGN GENERATION

(71) Applicant: Original, Inc., San Francisco, CA (US)

(72) Inventor: Chong Jin Koh, San Francisco, CA (US)

(73) Assignee: Bodygram, Inc., Las Vegas, NV (US)

( * ) Notice: Subject to any disclaimer, the term of this patent is extended or adjusted under 35 U.S.C. 154(b) by 47 days.

(21) Appl. No.: 16/491,995

(22) PCT Filed: Mar. 7, 2018

(86) PCT No.: PCT/US2018/021264
§ 371 (c)(1),
(2) Date: Sep. 6, 2019

(87) PCT Pub. No.: WO2018/165239
PCT Pub. Date: Sep. 13, 2018

(65) Prior Publication Data
US 2020/0375293 A1    Dec. 3, 2020

Related U.S. Application Data

(63) Continuation of application No. 15/795,350, filed on Oct. 27, 2017, now Pat. No. 9,949,519.
(Continued)

(51) Int. Cl.
*A41H 1/00* (2006.01)
*A41H 3/00* (2006.01)
(Continued)

(52) U.S. Cl.
CPC ........... *A41H 3/007* (2013.01); *G01B 11/022* (2013.01); *G05B 19/4097* (2013.01);
(Continued)

(58) Field of Classification Search
CPC ..................................................... A41H 3/007
(Continued)

(56) References Cited

U.S. PATENT DOCUMENTS 5,956,525 A    9/1999 Minsky
6,353,770 B1 * 3/2002 Ramsey ................... A41H 1/02
                                                       33/12

(Continued)

FOREIGN PATENT DOCUMENTS

WO    WO2011142655 A2    11/2011
WO    WO2014076633 A1    5/2014

OTHER PUBLICATIONS

Proper Cloth LLC, "Proper Cloth, Design the perfect shirt" webpage, Available at: https://propercloth.com/design-a-shirt/, last accessed on Apr. 10, 2017.
(Continued)

*Primary Examiner* — George B Bennett
(74) *Attorney, Agent, or Firm* — American Patent Agency PC; Daniar Hussain; Xiaomeng Shi

(57) ABSTRACT

Disclosed are methods and systems for generating a customized garment design. The method, when executed by a processor, comprises first retrieving a user signal about a user, identifying a user style comprising at least a preferred garment category for the user by analyzing the user signal, and retrieving a group of features for the preferred garment category, where each of the features is associated with at least one style variable. The method further comprises identifying at least one preferred style value for each of the style variables based on the user signal, generating one or more candidate garment feature sets by selecting one or more combinations of preferred style values for each style variable, and generating the customized garment design by
(Continued)

selecting a garment feature set from the one or more candidate garment feature sets.

30 Claims, 30 Drawing Sheets

Related U.S. Application Data

(60) Provisional application No. 62/467,840, filed on Mar. 7, 2017.

(51) Int. Cl.
*G06F 30/00* (2020.01)
*G01B 11/02* (2006.01)
*G05B 19/4097* (2006.01)

(52) U.S. Cl.
CPC .............. *G06F 30/00* (2020.01); *A41H 1/00* (2013.01); *G05B 2219/35134* (2013.01); *Y02P 90/02* (2015.11)

(58) Field of Classification Search
USPC ........................................................ 33/701
See application file for complete search history.

(56) References Cited

U.S. PATENT DOCUMENTS

| | | | | |
|---|---|---|---|---|
| 6,415,199 B1* | 7/2002 | Liebermann | ............. | A41H 1/02 33/512 |
| 6,490,534 B1 | 12/2002 | Pfister | | |
| 6,546,309 B1* | 4/2003 | Gazzuolo | ........... | G06Q 30/0601 33/512 |
| 6,701,207 B1* | 3/2004 | Gazzuolo | ............... | G06Q 30/02 33/2 R |
| 6,925,350 B2* | 8/2005 | Watanabe | ................ | A41H 1/10 33/12 |
| D806,095 S * | 12/2017 | Koh | ........................ | A41H 3/007 D14/485 |
| 9,949,519 B2* | 4/2018 | Koh | ........................ | G06F 30/00 |
| 2002/0178061 A1 | 11/2002 | Lam | | |
| 2003/0226266 A1* | 12/2003 | Ellis | .......................... | A41H 1/00 33/17 R |
| 2009/0234489 A1* | 9/2009 | Healy | ..................... | G06Q 30/02 700/130 |
| 2010/0023426 A1 | 1/2010 | Wannier et al. | | |
| 2012/0084987 A1* | 4/2012 | Tulin | ....................... | A41H 1/02 33/17 R |
| 2013/0236065 A1 | 9/2013 | Wang et al. | | |
| 2014/0270540 A1 | 9/2014 | Spector et al. | | |
| 2014/0277663 A1 | 9/2014 | Gupta et al. | | |
| 2014/0298667 A1* | 10/2014 | Alkhalaf | ................. | G01B 21/20 33/514.2 |
| 2015/0081468 A1* | 3/2015 | Fenimore | ........... | G06Q 30/0621 705/26.5 |
| 2015/0186419 A1 | 7/2015 | Agrawal | | |
| 2017/0340042 A1* | 11/2017 | Ferrara | .................. | A41H 3/007 |

OTHER PUBLICATIONS

Bit Body, Inc., MTailor webpage and mobile application, Available at https://www.mtailor.com/, last accessed on Apr. 10, 2017.
AFT GMBH, "Tailor4less" webpage, Available at: https://www.tailor4less.com/en/men/custom-dress-shirts/, last accessed on Apr. 10, 2017.
Flex Japan Corporation, "Karuizawa shirt" webpage, Available at: http://karuizawa-shirt.jp/builder, last accessed on Apr. 10, 2017 with Google Translate.

\* cited by examiner

300

302 USER PRESENTED WITH LIST OF DATA-RICH SERVICES HE LIKELY HAS ACCOUNTS WITH

↓

304 USER OPTS-IN AND AUTHENICATES THE APP FOR ACCESS SOME BUT NOT ALL DATA-STORING ACCOUNTS: GOOGLE E-MAIL, FACEBOOK PHOTOS, FACEBOOK TIMELINE EVENTS, FACEBOOK FRIENDS, INSTAGRAM PHOTOS, YOUTUBE VIDEOS, TUMBLR BLOGS, LINKEDIN PROFESSIONAL PROFILE, LINKEDIN CONNECTIONS

↓

306 FOR EACH PHOTO, VIDEO, E-MAIL, CONNECTION, ETC., THE SYSTEM GENERATES A HAPPINESS SIGNAL, A FUNKINESS SIGNAL, AN INTELLECTUALITY SIGNAL, A COLORFULNESS SIGNAL, A COMPLEXITY SIGNAL, AN ADVENTUROUSNESS SIGNAL

↓

308 QUERY FABRICS WHERE THERE EXISTS THE PRESENCE OF THE SAME OR SIMILAR SIGNALS AND THE MAGNITUDES OF THE FABRIC SIGNALS ARE WITHIN 10 UNITS OF THE USER SIGNAL

↓

310 FOR EACH FABRIC RETURNED IN THE QUERY, CREATE AN ASSOCIATION WITH EACH USER SIGNAL

↓

312 CHOOSE TOP 3 FABRICS BY ASSOCIATION STRENGTH AND ASSOCIATION WEIGHT

↓

314 PRESENT ALL 3-TUPLE COMBINATION OF THE CHOSEN FABRICS TO USER FOR PURCHASE

1100
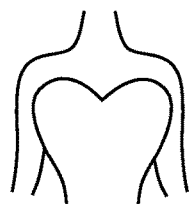
1110
SWEETHEART
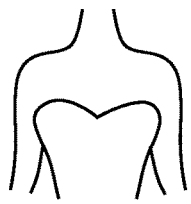
SEMI-
SWEETHEART
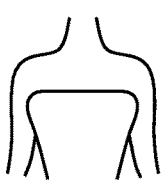
STRAIGHT
ACROSS
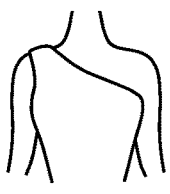
ASYMMETRIC
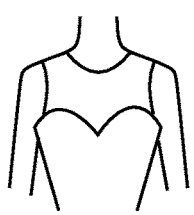
ILLUSION
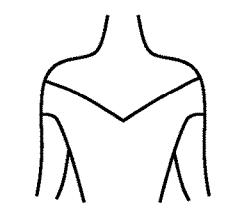
OFF-SHOULDER
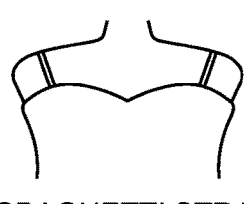
SPAGHETTI STRAP
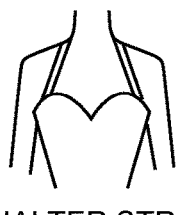
HALTER STRAP
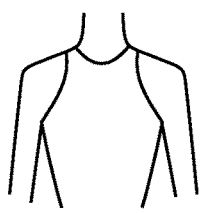
HALTER
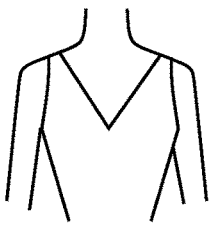
1120 V-NECK
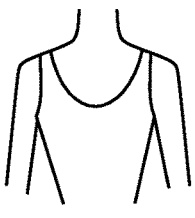
SCOOP
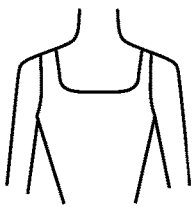
SQUARE
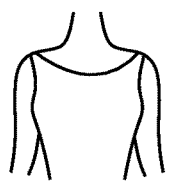
BOAT NECK
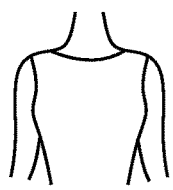
JEWEL
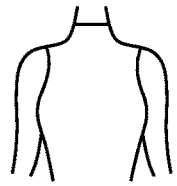
HIGH NECK
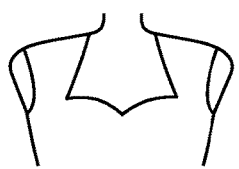
QUEEN ANNE
*FIG. 11*

1300
Generate Your Style Report
Take a photo of your face and wrist for Stylebot to generate your custom style report.
Face:      Wrist:
1310 — 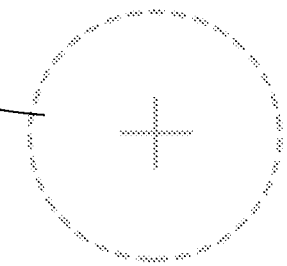    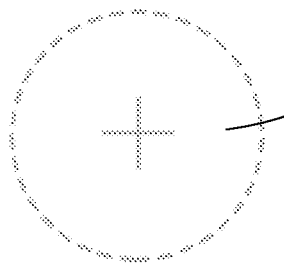 — 1320
1330 — [ GENERATE REPORT ]
*FIG. 13A*

1350
1355 STYLE REPORT
1360 FACE ANALYSIS
GENDER: Male     AGE: 36     SKIN TONE: 
1365 GLASSES: Yes     HAIR TOP: Short     HAIR COLOR: Black
RACE: Asian     BEARD: No     MOUSTACHE: No
1370 Nose Shape: Extra Straight
1375 —— [ f   SHARE REPORT ]
Share to Other Services
1380 RECOMMENDED COLORS
| 1382 Complementary | 1384 Split Complementary | 1386 Triadic | 1386 Analogous |
|---|---|---|---|
|  |  |  |  |
Buy Recommended Shirts
1390
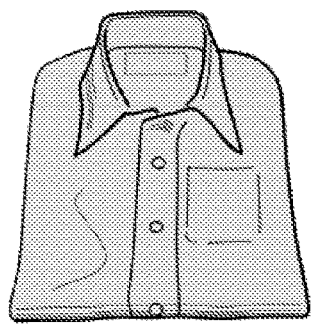
Most Recommended
*FIG. 13B*

1800

1805 START

1810 RECEIVE A RAW IMAGE OF A CLOTHING ARTICLE AND A SCALE REFERENCE, AND RECOGNIZE THE SCALE REFERENCE

1820 USE THE SCALE REFERENCE AND A PROCESSOR TO APPLY PERSPECTIVE CORRECTION TO ADJUST THE RAW IMAGE AND PRODUCE AN ADJUSTED IMAGE

1830 DETERMINE A SCALE OF THE ADJUSTED IMAGE FROM THE SCALE REFERENCE AND DISPLAY THE ADJUSTED IMAGE AND THE LINE MEASUREMENT TOOL

1840 RECEIVE USER INPUT THAT POSITIONS ENDS OF THE LINE MEASUREMENT TOOL ON MEASUREMENT REFERENCE POSITIONS ON THE ADJUSTED IMAGE OF THE CLOTHING ARTICLE

1850 GENERATE A CLOTHING ARTICLE DISTANCE BETWEEN THE MEASUREMENT REFERENCE POSITIONS ON THE ADJUSTED IMAGE OF THE CLOTHING ARTICLE

1860 REPEAT THE RECEIVING USER IMPUT AND THE CLOTHING ARTICLE DISTANCE GENERATING STEPS N TIMES TO GENERATE N+1 CLOTHING ARTICLE DISTANCES

1870 STORE THE CLOTHING ARTICLE DISTANCES FOR USE IN PRODUCING A CUSTOM CLOTHING ARTICLE FOR USE IN PRODUCING A CUSTOM CLOTHING ARTICLE WITH A FIT BASED ON THE FAVORITE CLOTHING ARTICLE

1890 END

*FIG. 18*

METHODS AND SYSTEMS FOR CUSTOMIZED GARMENT AND OUTFIT DESIGN GENERATION

REFERENCE TO RELATED APPLICATIONS

This application claims the benefit of priority to U.S. Ser. No. 62/467,840, filed on 7 Mar. 2017, entitled "Systems and Methods for Style Recommendation by Automated Means," and U.S. Ser. No. 15/795,350, filed on 27 Oct. 2017, and entitled "Methods and Systems for Customized Garment Design Generation."

FIELD OF THE INVENTION

Embodiments of the present invention are in the field of garment and outfit design generation, and pertain particularly to methods and systems for automatically generating customized new garment and/or outfit designs, and automatically delivering highly relevant and personalized style recommendations.

BACKGROUND OF THE INVENTION

The statements in the background of the invention are provided to assist with understanding the invention and its applications and uses, and may not constitute prior art.

There are many ways through which individuals can obtain a customized garment or outfit. One is to work with a tailor. Visiting the tailor in person allows necessary measurements to be taken and appropriate questions asked to create a garment which will please the customer insofar as fit, fabric, color, structural features such as the type and size of buttons, plackets, and pockets, and ornamentation such as beads, sequins and piping. However, not only is in-person tailoring a time-consuming process, but a tailor shop may not offer fabrics and styles that the customer may wish to have.

Instead of visiting a tailor in person, customized garment can be ordered from a custom clothing manufacturer directly via mail, phone, or online orders. Customization can be done by selecting a style from available options, for example, by answering various questions, and providing necessary sizing and other information. Alternatively, customization information can be provided through a personal visit. A combination of methods may also be used, and while online ordering through a website may be convenient, the available style options may be very limited, and any particular service may not have styles that match the customer's preference very well. A customer of such services may wish to have an entirely novel garment design in terms of style, fabric, as well as other structural features and ornamentation based on their personal style, but may not have the time to visit a tailor or the time or skill to create a brand new design for themselves. In addition, such service may not offer designs that are particularly suited and flattering for the facial features, skin tone, or body shape for the user.

Another issue with ordering custom garments online instead of ready-made ones is that the customer may not know his or her best fitting and must take necessary body measurements for upload. Such self-measurements could be inconvenient, annoying and highly inaccurate, with most people not wanting to bother with measuring at all. Some customers are physically unable to take all measurements required for a garment. Measurements provided by an individual may be inaccurate for several reasons, including improper placement of a measuring tape and improper tension on the measuring tape. One measurement of a body length by a first person may not equal to another measurement along the same body length by a different person. Moreover, although some smart phone applications are now available to scan a body map to determine necessary body measurements, such applications often require complicated calibrations, and are only for making very simple shirts instead of other types of garments.

Therefore, in view of the aforementioned difficulties, it would be an advancement in the state of the art to provide methods and systems for automatically generating a properly-sized, customized garment design based on user style preferences, and facial and body characteristics.

It is against this background that the present invention was developed.

BRIEF SUMMARY OF THE INVENTION

The inventors of the present invention have created methods and systems for generating customized garment designs.

More specifically, in one aspect, one embodiment of the present invention is a method for generating a customized garment design, comprising the steps of: retrieving a user signal about a user; identifying a user style comprising at least a preferred garment category for the user by analyzing the user signal; retrieving a group of features for the preferred garment category, wherein each of the features is associated with at least one style variable; for each of the style variables, identifying at least one preferred style value based on the user signal; generating one or more candidate garment feature sets by selecting one or more combinations of preferred style values for each style variable; and generating the customized garment design by selecting a garment feature set from the one or more candidate garment feature sets.

In some embodiments, a style variable associated with a feature is a cut variable or a fabric variable. In some embodiments, each preferred style value is associated with a score computed based on the user signal, and wherein the score indicates an affinity to the user. In some embodiments, each candidate garment feature set is associated with a feature set score computed from style value scores associated with the selected preferred style values. In some embodiments, the selected garment feature set has a highest feature set score. In some embodiments, each feature set score is further computed from at least one inter-style score adjustment.

In some embodiments, the method further comprises providing a graphical user interface to enable a human operator to adjust the features and/or garments in the generated customized garment design.

In some embodiments, the preferred garment category is a shirt, and each of the features for the shirt is selected from the group consisting of collar, collar band, cuff, armhole, yoke, placket, lower front body, upper front body, pocket, front placket, back body, and hem/shirt tail, seam style, embroidery, button, zipper, and Velcro. In some embodiments, the preferred garment category is a dress, and each of the features for the dress are selected from the group consisting of neckline, neck band, bodice, corset, center front, apex, waistline, skirt, pocket, placket, chemise, shoulder seam, arm, armhole, armhole ridge, and hemline, seam style, embroidery, buttons, Velcro, zippers, belts, tassels, flowers, beads, sequins, piping, and laces.

In some embodiments, the method further comprises specifying at least one body measurement of the user for generating the customized garment design, by a process selected from the group consisting of receiving direct user input, three-dimensional body scanning, algorithmic computation based on answers to questions from the user, algorithmic computation based on a user photo, and transfer of data from a professional tailor. In some embodiments, the method further comprises specifying at least one garment measurement for generating the customized garment design, by a process selected from the group consisting of receiving direct user input, algorithmic computation based on answers to questions from the user, algorithmic computation based on a user photo, and transfer of data from a professional tailor.

In some embodiments, the at least one user signal comprises at least one facial feature, and the at least one facial feature is selected from the group comprising skin tone, facial bone structure, hair color, and eye color.

In some embodiments, the method further comprises retrieving public data related to the identified user style, wherein for each of the style variables, the identifying of the at least one preferred style value is further based on the retrieved public data.

In some embodiments, the at least one user signal is retrieved by analyzing user data, and the user data is received from the user and/or from a third-party source. In some embodiments, the user data comprises one or more of a photo of the user, a photo of a garment, a specification of the preferred garment category, description of a favorite style, description of one or more of the pluralities of features, description of a current mood, user social media statuses, social media comments made by the user, social media comments on the user's posts, and text description of a desired garment design.

In some embodiments, the method further comprises determining whether the user data comprises at least one garment photo displaying a preferred garment; in response to determining that the user data comprises at least one garment photo displaying a preferred garment, analyzing the at least one garment photo to determine a group of reference features for the preferred garment; and determining a garment sub-category within the preferred garment category for generating the customized garment design, based on the group of reference features. In some embodiments, the analyzing of the user data comprises determining the user's body shape, and the identifying of the preferred garment category is based on the user's body shape.

In some embodiments, the user style further comprises a preferred garment style. In some embodiments, the preferred garment style is determined from the preferred garment category. In some embodiments, the preferred garment category is determined from the preferred garment style.

In some embodiments, the method further comprises, according to the preferred garment style, determining a preferred accessory category for a customized accessory design that accompanies the customized garment design, wherein the preferred accessory category is a category of a feature that cannot be described by cut or fabric.

In some embodiments, the method further comprises retrieving public data related to the preferred accessory category; retrieving a group of accessory features for the preferred accessory category from an internal database and/or public data; for each of the group of accessory features, identifying at least one preferred style value, by analyzing the user signal and/or the public data, wherein each preferred style value is associated with a style value score computed based on the user signal, and wherein the style value score indicates an affinity to the user; generating one or more candidate accessory feature sets by selecting one preferred style value for each of the group of accessory features, wherein each candidate accessory feature set is associated with an accessory feature set score computed from style value scores associated with the selected preferred style values; and generating the customized accessory design by selecting a candidate accessory feature set with a highest feature set score.

In some embodiments, the preferred user style comprises a preferred outfit style, and a customized outfit design having the preferred outfit style comprises at least the customized garment design. In some embodiments, the customized outfit design comprises a second customized garment design.

In some embodiments, the method further comprises generating one or more candidate outfit feature sets by combining candidate garment feature sets associated with each customized garment design, wherein a candidate outfit feature set score for each candidate outfit feature set is computed from feature set scores for each customized garment design in the outfit, and inter-garment score adjustments; and generating the customized outfit design by selecting a candidate outfit feature set with a highest feature set score.

In some embodiments, the method further comprises, according to the preferred outfit style, determining a preferred accessory category for a customized accessory design that accompanies the outfit, wherein the preferred accessory category is a category of a feature that cannot be described by cut or fabric.

In another aspect, one embodiment of the present invention is a system for generating a customized garment design, including a server having access to at least one processor; and a non-transitory physical medium for storing program code and accessible by the server, the program code when executed by the processor causes the processor to perform the aforementioned steps.

In yet another aspect, the present invention is a non-transitory computer-readable storage medium for generating a customized garment design, the storage medium comprising program code stored thereon, that when executed by a processor, causes the processor to perform the aforementioned steps.

Yet other aspects and embodiments of the present invention include the methods, processes, and algorithms comprising the steps described herein, and also include the processes and modes of operation of the systems and servers described herein. Other aspects and embodiments of the present invention will become apparent from the detailed description of the invention when read in conjunction with the attached drawings.

BRIEF DESCRIPTION OF THE DRAWINGS

Embodiments of the present invention described herein are exemplary, and not restrictive. Embodiments will now be described, by way of examples, with reference to the accompanying drawings. In these drawings, each identical or nearly identical component that is illustrated in various figures is represented by a like reference character. For purposes of clarity, not every component is labelled in every drawing. The drawings are not drawn to scale, with emphasis instead being placed on illustrating various aspects of the techniques and devices described herein.

FIG. 3 is an illustrative flowchart of a process for generating a customized garment design, according to one embodiment of the present invention

FIG. 4D is an illustrative screenshot of a desktop application showing another view of the exemplary representation in FIG. 4B, according to one embodiment of the present invention.

FIG. 11 is an illustrative diagram showing different styles of necklines for a dress, according to one embodiment of the present invention.

FIG. 13A is an illustrative screenshot of the fashion recommendation mobile application showing the screen prompting for user inputs, according to one embodiment of the present invention.

FIG. 13B is an illustrative screenshot of the fashion recommendation mobile application showing the style report output, according to one embodiment of the present invention.

FIG. 18 shows an illustrative flowchart for an exemplary workflow for determining measurements for customized garment design generation, according to one embodiment of the present invention.

DETAILED DESCRIPTION OF THE INVENTION

Illustrative Definitions

Figure 1:
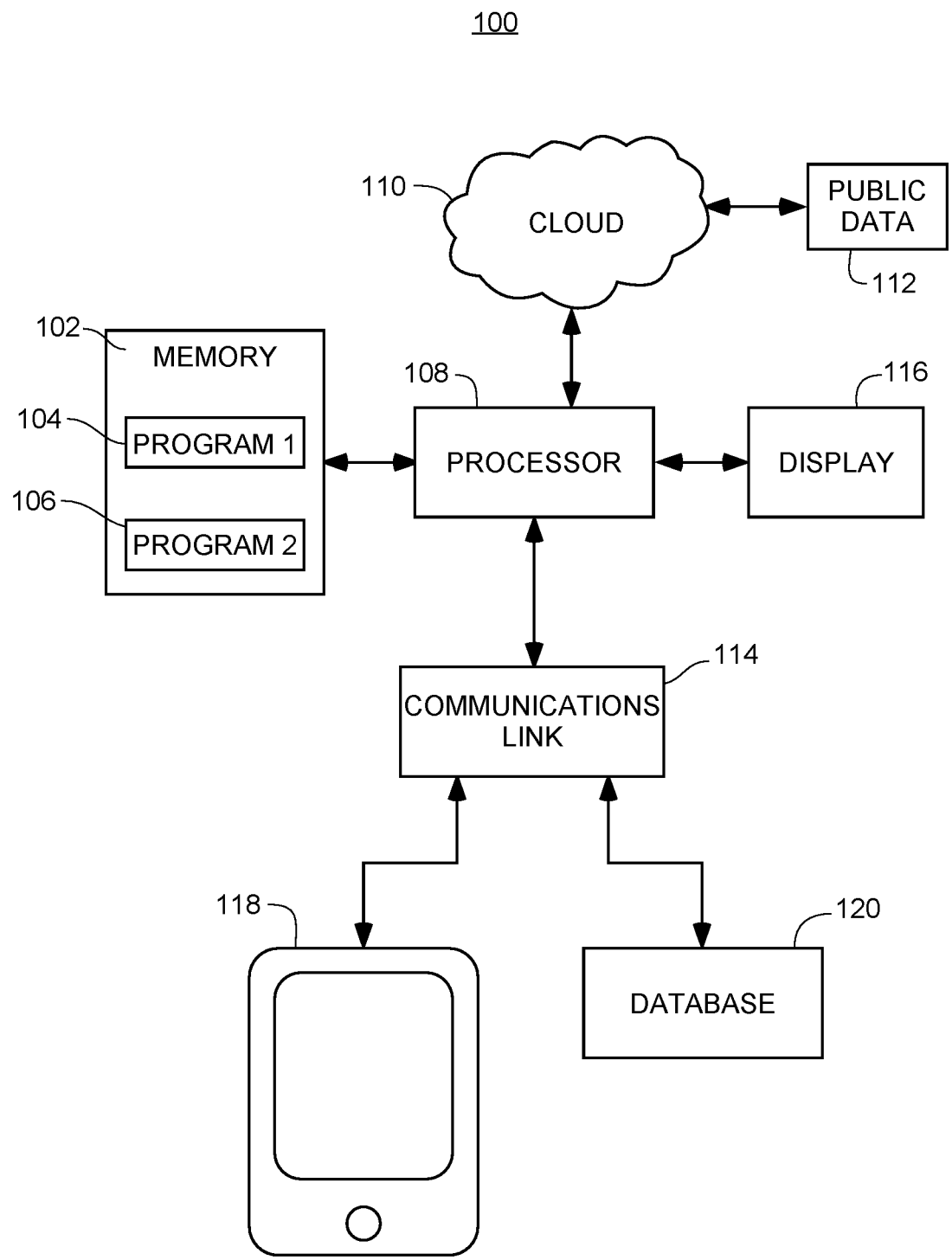
FIG. 1 is a block diagram of a system for automatic style recommendation, according to one embodiment of the present invention.

Some illustrative definitions are provided to assist in understanding the present invention, but these definitions are not to be read as restricting the scope of the present invention. The terms may be used in the form of nouns, verbs or adjectives, within the scope of the definitions.

"STYLEBOT" is a commercial name for embodiments of the present invention, including recommendation engines for taking as input various parameters of a user and generating one or more recommended garment styles, outfit styles, and/or garment/style features according to various embodiments of the present invention. STYLEBOT is a trademark name carrying embodiments of the present invention, and hence, the aforementioned trademark name may be interchangeably used in the specification and drawing to refer to the products/services offered by embodiments of the present invention. The term STYLEBOT may also be used in this specification to describe the overall system and processes of the invention.

"GARMENT CATEGORY" refers to the type of a garment. Exemplary garment categories include shirts, skirts, dresses, suits, trousers and shorts, and many others. Finer categorization may be made in terms of, for example, function, or style. For example, dress sub-categories based on function may include ball gowns and casual dresses, while dress sub-categories in terms of style may include sheath dresses and empire dresses. Similarly, trousers may be divided according to style into jeans, cargo pants, and overalls.

"STYLE" is used in several contexts within the present disclosure. A "garment style" or "feature style" generally refers to a form of a garment or a feature, part, or component of a garment, that characterizes the garment or a part of the garment in terms of its shape, structure, or silhouettes. Garment or feature styles may further refer to the material from which the garment or feature is made, or the visual look of the garment or feature, based on the material. Subcategories of a garment category may also be referred to as styles. In addition, a cut or style of a garment may refer to the way the garment hangs on the body, based on the physical shape of the fabric pieces used to construct it, to the general shape of the garment, for example, "slim fit", "relaxed fit", "fitted through the waist", or to the size or length of a garment. An "outfit style" generally refers to the overall style of an outfit, which comprises at least one piece of garment and optional accessories in the manner described above. A "user style" may be interpreted more generally as how a user expresses his or her personality, preferences, and tastes, for example, an "Elvis Presley" style, or a "Bohemian" style. Such expressions may convey a general feeling by means of the use of fabrics, the overall cut, cut of specific garment features or parts, outfit features or parts, or the design and placement of any functional or ornamental accessories. A user style may explicitly indicate outfit, garment, accessory, or even feature styles that the user prefers. In short, "style" is a term which may be used to describe the cut, fabric, or any other characteristic of a feature of a piece of garment or accessory that may or may not involve any pieces of textile or fabric. A user style is a style specific to a given user.

"FEATURE" or "GROUP OF FEATURES" in this disclosure refers to a particular part or parts of a garment, or a structural detail of such a part. Such features or garment parts may be associated with a cut and a fabric. For example, a shirt may comprise a front panel, a back panel, two sleeves, and a collar, each of which is associated with a specific cut or shape, and a specific fabric, where the fabric may be characterized in terms of color, texture, material, and similar traits. A feature may also refer to an ornamental accessory, its detailed look, size, and position on the garment, means of attachment to the garment, or other similar details.

"CUT" of a feature or garment part refers to a cutting or shape of a feature or garment part, or the way such a garment part hangs on the body based on the shape of the fabric pieces used to construct it. A cut may also refer to the size or length of a feature of a garment. For example, "boat neck" may refer to the shape of the collar, while "deep" and "shallow" may refer to the depth of the collar, and "wide" and "narrow" may refer to its width. Another example may be "mermaid", "flare", or "A-line" for the shape of a dress, and "mini", "knee", and "ankle" may refer to the length. In the present disclosure, the "style" of a garment or feature may comprise the "cut" of the garment or the feature.

"STYLE VARIABLE" is a variable that describes a style, for example, a garment style, of a feature of an individual piece of garment, or a feature of a garment within an outfit. "STYLE VALUE" is a specific instance of a style variable.

"OUTFIT" is a set of one or more pieces or items, which may be a combination of garments and/or textile or non-textile accessories or features.

"BODY SHAPE TYPE" refers to a description of the body shape of the user, for example, pear-shaped, petite, straight, tall, or any combination of descriptions similar to the examples listed.

"SUBJECT", "USER", "CUSTOMER", or "RECIPIENT" refers to the human individual for whom the customized garment design is created.

Overview

With reference to the definitions above and the figures provided, embodiments of the present invention are now described in detail.

In the following description, for purposes of explanation, numerous specific details are set forth in order to provide a thorough understanding of the invention. It will be apparent, however, to one skilled in the art that the invention can be practiced without these specific details. In other instances, structures, devices, activities, and methods are shown using schematics, use cases, and/or flow diagrams in order to avoid obscuring the invention. Although the following description contains many specifics for the purposes of illustration, anyone skilled in the art will appreciate that many variations and/or alterations to suggested details are within the scope of the present invention. Similarly, although many of the features of the present invention are described in terms of each other, or in conjunction with each other, one skilled in the art will appreciate that many of these features can be provided independently of other features. Accordingly, this description of the invention is set forth without any loss of generality to, and without imposing limitations upon, the invention.

While the methods disclosed herein have been described and shown with reference to particular operations performed in a particular order, it will be understood that these operations may be combined, sub-divided, or re-ordered to form equivalent methods without departing from the teachings of the present invention. Accordingly, unless specifically indicated herein, the order and grouping of the operations is not a limitation of the present invention.

When an individual desires a customized garment or entire outfit, he or she may visit a tailor in person, or order from a custom clothing manufacturer. Customization can be done by selecting a style from available existing options and by providing necessary sizing information by telephone or through an internet connection. While online ordering through a website may be convenient, available style options may be limited, and customers of such service may wish to have entirely novel garment designs based on their personal styles, but may not have the time to visit a tailor or the time or skill to create brand new designs for themselves. Moreover, a customer must provide all necessary body or garment measurements to the custom clothing manufacturer. However, many people do not want to bother with or are unable to take the necessary measurements. Also, the measurements provided by the individual may not be accurate.

The present invention proposes to tackle the limitations regarding design and measurements outlined above by providing methods and systems for customized garment design generation, comprising curating, selecting, customizing, and even designing from scratch a finished garment, with a style or design that has high affinity to the user or customer, that is, matched to the user's preferences and/or body traits or attributes, while also possibly conforming to current fashion trends.

In addition to generating a new garment design based on user data, third-party data, and/or public data, embodiments of the present invention also allow sizing customization of such a design based on user input or extracted sizing information. Size information may help in determining a user's body shape type and thus in customized design of the garment or outfit. In some embodiments, sizing information is derived from user body measurements. In some embodiments, sizing information is derived from measurements of a reference garment, which may be a preferred clothing item such as a favorite shirt with a very good fit. In other embodiments, sizing information is derived from one or more of user input, three-dimensional body scans of the user, algorithmic computation based on answers to questions from the user, algorithmic computation based on a user photo, or transfer of data from a professional tailor.

In one specific example, sizing information may be specified by measuring a reference garment provided by the user, for example, an old shirt that fits the user extremely well. This reference garment may be referred to as a favorite garment or a preferred garment. In some embodiments, instead of requiring direct measurement of the reference garment by the user, embodiments of the present invention may perform computer vision functions on photos of the reference garment, to determine the desired sizing information, with the help of a scale reference.

Implementations of customized garment design systems embodying the present invention have several uniquely beneficial characteristics. First, the automated system and corresponding garment and outfit design processes provide significant amount of savings in cost and time compared to traditional tailoring services, or dedicated searches for garments with pleasing styles fit for the user.

Unlike conventional garment design systems where the user is asked to select or choose preferred designs for every single feature, part, or attribute of the garment, in a sequence of steps, embodiments of the present invention is much less time consuming because they automatically consider combinations of garment features, matching pairs and sets of styles such as fabric colors, cuts, accessories, materials, and further take into account of user preferences, thus limit the total number of irrelevant options that the user has to examine.

Second, the automated system is much more comprehensive than conventional systems, as it not only offers readily available garment feature options stored internally within the system, but also utilizes other user, third party, and public data to analyze user preferences, current fashion trends, designs suitable for the user's traits, and incorporate the result of the analysis in the customized garment design process. The user's traits may include physique, body shape, facial features, skin tone, complexion, and hair color. The user preferences may describe or indicate, for example, how colorful the user would like the garment to be, whether an unconventional or a traditional style is desired for the cutting or style of the garment, whether the user preferred conservative styles or otherwise, whether ornamental accessories are preferred, and if so, in what shapes, sizes, colors, and textures, and at what locations on the garment. Using such user preferences or signals, the system automatically matches to stylistic options for the garment to be designed, while allowing user input to further modify, revise, or update such user preferences. Moreover, the user data on which analyses are performed may be of many forms and may come from a wide variety of sources. For example, they may be textual, photographic, and may be extracted from specific contexts such as social media platforms, while conventional systems typically consider browsing or shopping history alone. Furthermore, as current fashion trends or other public data are taken into account during the design process, the system allows the garment customization process to introduce new trends, surprises, and other design choices that may otherwise by overlooked by the user.

As a specific example, some embodiments of the present invention provide customized garment or outfit designs that are both flattering for the user's traits such as facial features and body shapes, and suited for a particular occasion or function such as cocktail or work, while still catering to the user's preferences for style. For instance, color schemes may be coordinated among different parts of the garment, among different pieces of garments to be matched and worn together, or according to the user's preferred cuts and styles. A professional male user may provide photos of himself in various business occasions, from which formal dress shirts with particular color schemes and textile choices may be designed. An adventurous female user with a full figure may get suggestions of fabrics with big and bold patterns of black and white, which are known to be slimming, instead of fabrics with small patterns of bright yellow and pink; a slimmer user with similar preferences may get garment designs with both types of fabrics.

Third, methods and systems implemented according to some embodiments of the present invention quantify garment features and attributes numerically, thus enabling the consolidation of the many types of data as described above, and direct comparison and ranking of multiple designs. For example, the system may generate scores for different styles, such as cuts and fabrics, and for other attributes of garment parts, features, or accessories; and combine these scores to formulate feature set scores for an overall garment. The system may then select one or more garment designs with high feature set scores for recommendation to the user. Such scores may be further fine-tuned or adjusted according to interactions and compatibility among different colors, fabrics, textures, cuts, user traits, and user preferences. For instance, traditional cuts of all parts of a garment may work well for a user with a high conservative preference, but surprising features may be put together for a more adventurous user. Lace and leather may have a favorable score adjustment for the more adventurous user but an unfavorable score adjustment for the more traditional user, even though keeping a fabric with laces for the entire garment may work well for the conservative user. Other embodiments may employ methods such as machine learning, deep learning, other artificial intelligence techniques such as neural networks, or other methods of analyses rather than scoring, but may achieve similarly superior effects compared to conventional methods.

Customized Garment Design Generation

FIG. 1 is a block diagram of an exemplary system 100 for automatically generating a style recommendation, according to one embodiment of the present invention. System 100 may include a central processor 108, a memory unit 102 which maintains one or more programs, 104 and 106, a display or output 116 such as a Liquid Crystal Display (LCD) panel, a communication link 114, a user or input device 118 capable of interacting with a user, and a database 120 for storing product information. Processor 108 may access public data 112 via a network or network cloud 110. Although shown as a stand-alone system, embodiments of the present invention may be implemented using hardware and/or software, and may be server-based. Many components of the system, for example, network interfaces, have not been shown, so as not to obscure the figure. However, one of ordinary skill in the art would appreciate that the system necessarily includes these components.

When the system is in operation, memory unit 102 is loaded with one or more routines, programs, or applications. Public and user data may be loaded into memory unit 102 under the control of processor 108, either ad-hoc, or as a result of a data caching operation or other operations that require such placement of data.

Processor 108 is a hardware component configured to execute instructions and carry out operations associated with computer system 100. Examples of such a processor could be a CPU of any architecture (CISC, RISC, EDGE, 8-bit, 32-bit, 64-bit, etc.), a combination of CPU's of any architecture performing operations in parallel, a combination of specialized CPU's such as a microcontroller coupled with a digital signal processor, the hardware of which is efficiently designed to process certain signals (such as graphics in a GPU), or perhaps a vector processor, or any other processing device that can carry out the task of executing instructions and carrying out operations associated with style generation system 100.

Memory unit 102 may represent random access memory (RAM) devices comprising a main storage of the hardware, as well as any supplemental levels of memory, for example, cache memories, non-volatile or back-up memories (e.g. programmable or flash memories), and read-only memories. In addition, memory may be considered to include memory storage physically located elsewhere in the hardware, e.g. any cache memory in the processor, as well as any storage capacity used as a virtual memory, e.g., as stored on a mass storage device.

Communications link 114 may be any method of exchanging data between processor 108, database 120, and receiving device 118, including but not limited to a physical connection, a wireless network connection, 3G, 4G, a cloud service, or a virtual communication link, such as between a host operating system and a virtual operating system. Networks may also be implemented as a local area network (LAN), a wide area network (WAN), a wireless network, and/or the Internet, among others, to permit the communication of information with other computers coupled to the network. Network communication is also achieved by connecting processor 108 to network cloud 110. Processor 108 is then able to access or communicate with remote public data set 112. One of ordinary skill in the art will appreciate that network cloud 110 may be implemented in the same way as communications link 114. It should be appreciated that the hardware typically includes suitable analog and/or digital interfaces to communicate with each other. Remote public data set 112 may represent any kind of remote data set accessible over communication protocols such as HTTP/HTTPS, FTP, etc. In some embodiments, additional third-party data (not shown) may also be accessed by processor 108 via network cloud 110, where such third-party data may comprise user data controlled by third-party data service providers.

The hardware for input device 118 may include, for example, a keyboard, a touch pad, a touch screen, a mouse, a scanner, a microphone, or a web camera; display 116 may be a Liquid Crystal Display (LCD) panel or other forms of display including a touch screen. For additional storage, the hardware may include one or more mass storage devices not shown in FIG. 1, e.g., a floppy or other removable disk drive, a hard disk drive, a Direct Access Storage Device (DASD), an optical drive (e.g. a Compact Disk (CD) drive, a Digital Versatile Disk (DVD) drive, etc.) and/or a tape drive, among others. Database 120 is any unit, for example, a SQL database, capable of storing, sharing, and updating user information, product information, recommendation information, weights, signals, associations, fabric data sets, fabric groups, etc. The data may be stored in any structure; some possibilities include a relational database, e.g. SAP, Oracle, MySQL, PostgreSQL, IBM DB2, Microsoft SQL Server, SQLite; a NoSQL database such as MongoDB; or writable files in a file system.

The hardware in FIG. 1 may operate under the control of an operating system, and executes various computer software applications, components, programs, codes, libraries, objects, modules, etc. indicated collectively by reference numerals to perform the methods, processes, and techniques described herein.

Embodiments of the present invention may be implemented in a client server environment. User devices on the client side may include input device 118 and display 116, which may access the service of a system server comprising processor 108, memory 102, database 120, which in turn utilize public data 112, through some network link or cloud 110 such as the Internet.

Figure 2:
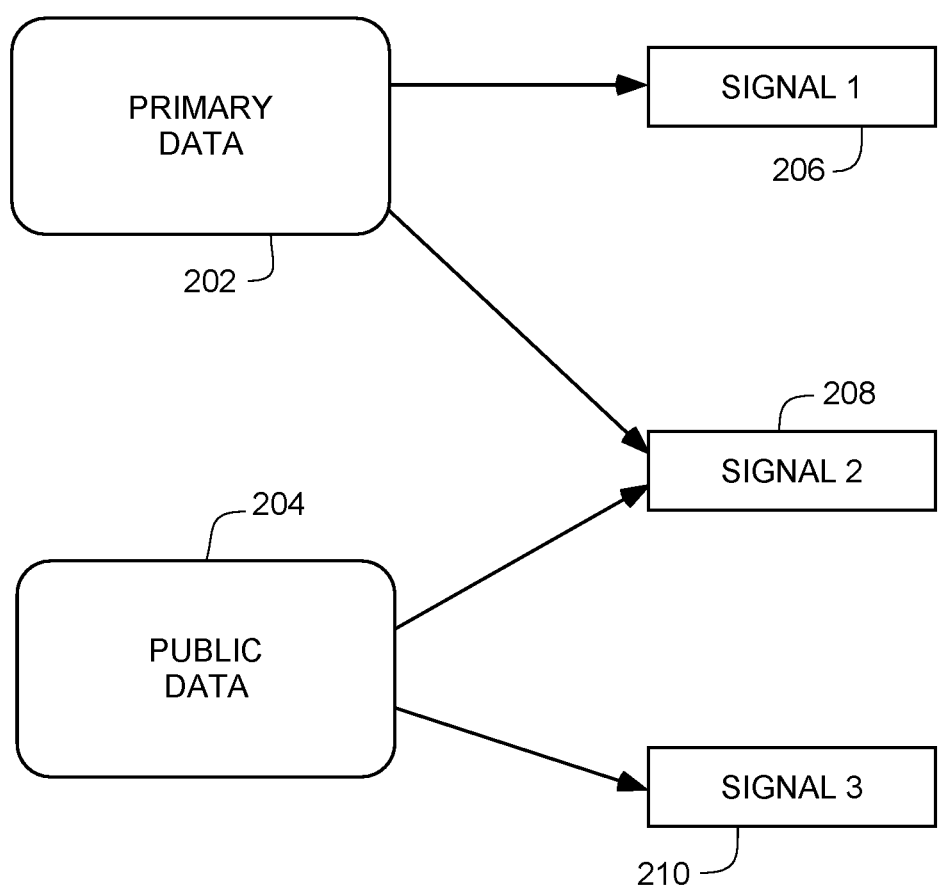
FIG. 2 is an illustrative diagram showing relationships among user data, public data, and generated signals, according to one embodiment of the present invention.

Accordingly, FIG. 2 illustrates an exemplary process 200 for generating signals from primary data, public data, or a combination of primary and public data, according to one embodiment of the present invention.

Primary data may be user primary data, or primary data about possible or available garment features and styles, for example, fabric primary data. User primary data may comprise user data owned by the user, or third-party user data collected and stored by third-party data providers about the user. Such user primary data may be collect from different sources over extended period of time and stored locally in a database internal to the garment design system. Examples of primary data may include but are not limited to photos of the user or garments preferred by the user, user specification of garment category, description of a favorite style, description of preferred features including cuts and fabrics, description of current mood, user social media statuses, social media comments made by the user, social media comments on the user's posts, and any other open ended text description of the user state, preferences, or the desired garment design. A user's social media data may be considered third-party user data, and may be derived from opt-in data, for example, by setting up one or more connected accounts that reveal some subset of the identity and preferences of the subject of recommendation, which may comprise the step of providing a username and password, which may further comprise the step of providing personally identifiable information, and which may further comprise the step of providing other private information.

In various embodiments, user primary data may be collected through direct user inputs, and/or indirect user data collection. Direct user inputs include, but are not limited to, user upload of past photos containing a preferred style or fabric, user selection of desired styles and fabrics, or the like. User data may alternatively be collected indirectly from a number of different sources including but not limited to (a) conversion actions taken on existing e-commerce websites, (b) browsing behavior on said e-commerce websites, (c) e-mail opens for relevant e-mails sent to the subject, (d) social network data such as photos, videos, comments, connections to other users, relative strengths of relationship to other users, location check-ins, likes, dislikes, derivation of a time series of emotions through emoticons, usage of connected apps, content of chat communication, counter-parties to chat communication, frequency of usage, medium of usage (e.g. desktop vs. mobile), click interest, and other social data, (e) job searches made, (f) bookmarks saved, or even (g) time spent on certain Internet destinations. User data may pertain to any entity and typically the subject of primary data is a person or product. For example, user data may be content that the user has posted on public social networks or even private e-mails they have sent. Primary data may also be product data, such as a product's ISBN number, cost, color, size, dimension, weight, reviews, and ratings. As already alluded to earlier, one of ordinary skill in the art will recognize that the subject of primary data can also extend beyond people and products.

From primary data such as user data, and possibly public data, the system may generate various signals or user signals, which may be identical or equivalent to the user data as described above, or may quantify a user's preferences, traits and attributes, and other pertinent information necessary for garment design. These may be mapped onto a scale from which any two or more elements may be compared. An example of a user signal that may be generated from primary data may be a user profile photo. Another example of a user signal that may be generated from primary data such as user profile information including user photos may include fields such as gender, age, skin tone, hair length, hair color, nose shape, and the like. Yet another example of a signal that is generated from primary data may be a happiness signal on a 0-100 scale, where the highest level of happiness is 100 and the lowest level of happiness is 0. This metric may also be calibrated using public image data from news sources, confirmed by nearby article text that describes the happiness level of the subject in an image. For example, an image showing people negatively affected by war is unlikely to show a level of happiness in the subjects of photographs and such photographs may be used to calibrate a lower end of the happiness metric scale. On the other hand, a news photograph about an Oktoberfest celebration is likely to show images of people at high happiness levels and these images may be used to calibrate a higher end of the happiness metric scale.

The user data used to create this exemplary happiness scale could be photo or other data opted in by authenticating Facebook and Instagram profiles, or other data sources where there is a high concentration of lifestyle photos available. Aside from a scale of happiness to sadness, other examples of scales by which signals are measured could be: a scale of funky to proper, a scale of intellectual to practical, a scale of colorful to monochrome, a scale of dark to light, a scale of adventurous to prudent. Generally, the subject of the primary data can be people, or it can be things. Examples of people are ordinary individuals with Facebook accounts, and examples of things may be fabrics that are used as building blocks for an apparel product. One of ordinary skill in the art will recognize that these scales can extend far beyond the ones already mentioned, to capture any measurable property of any person, object, concept, or thing.

What is shown in FIG. 2 is a single piece of primary data 202, which could be an image of a user, for instance, and a single piece of public data 204 being considered in light of each other during signal generation. One of ordinary skill in the art will recognize that there could be various primary data and public data considered simultaneously, or even the omission of public data, or in another embodiment, the omission of primary data, and still signals can be generated. In this example, user data 202 is the sole determining factor for deriving signal 206, perhaps through an image transformation such as color analysis. Signal 206 could in that case be called "percent_black" and carry a value of 37%.

In this example, public data 204 is the sole determining factor for deriving signal 210. Public data 204 could be an OEM thread count for a fabric that the user of primary data 202 is known to have worn before, represented as a signal derived from another piece of primary data (not shown) or even primary data 202 itself. The signal 210 generated may be a pattern profile for a fabric, such as "checkered" carrying a value of "true", or "plaid in trend" carrying a value of "no."

Finally, signal 208 is derived from a combination of analysis done on both primary data 202 and public data 204. For example, signal 208 may be a measure of happiness of the user associated with primary data 202 when wearing a fabric described by public data 204. An exemplary happiness level may be 78, or 0.78 is normalized to between 0 and 1. Signal 208 may alternatively comprise field describing the user's facial and/or body features such as height, waist size, face shape, and the like. As another example, signal 208 may comprise a user style such as "chic," "sexy," "casual,", "bohemian," or the like.

From these user data and/or signals, the system may identify a user style, which is a general description of what kind of look the user may prefer. The system may also identify a preferred garment style or preferred garment category for which the user would like a customized garment design, for example, a dress or a coat. For example, one or more photos showing the user or someone else wearing preferred garments may be provided as input, and the system may identify a category of the preferred garment, and for that particular category and/or style, identify candidate styles for the overall shape, representative features of the category. These features and styles may then be scored according to signals previously generated according to FIG. 2. Collectively, the system may then generate one or more sets of features to put together a garment design with a high score indicating a likelihood that the garment design complies to user preferences, and/or are complementary to the user's facial and body traits, where facial and body traits such as eye color and body shape or built may be analyzed from user photos, or determined by direct user input or other means. Fine tuning of such scores and adjustments may take place, and may further improve the affinity between the finished design and user preferences, traits and current fashion trends. Some embodiments of the system may enable a more general design for an entire outfit comprising multiple garments, or design for one or more pieces of garments to match existing garments owned by the user for putting together as an outfit.

FIG. 3 is an illustrative flowchart of an exemplary process for generating a customized garment design, according to one embodiment of the present invention. In this example, the objective is to select a three-fabric set for a men's shirt. This specialized case is illustrative, and may be extended to much more general cases with other types of garments and user or primary data.

Upon initialization, a user is presented at steps 302 and 304 with a list of data-rich services he or she is likely to have accounts with. Such services may include, but are not limited to, photo sharing services like Instagram, life event timelines and social networks like Facebook, video databases such as YouTube, blogs such as Tumblr, professional profiles like LinkedIn, or even one or more e-mail accounts. A common factor among any service the user may be asked to opt-in is that it would provide a rich data set of user-generated content that would constitute user data to the system.

The next step 306 describes a process of taking all these user data and generating user signals from them. The signals described are a happiness signal (on a scale from happy to sad), funkiness signal (on a scale from funky to proper), intellectuality signal (on a scale from intellectual to practical), colorfulness signal (on a scale from colorful to monochrome), complexity signal (on a scale from complex to simple), and adventurousness signal (on a scale from adventurous to prudent). Each signal may be appropriately quantized, for example to a value between 100 and 0, or 1 and 0. There are many sub-processes that may happen in order to derive signals, such as but not limited to, image manipulation and transformation, color space projection, Fourier image analysis, facial and body feature extraction, image comparisons, natural language processing, natural language understanding, and many others.

The next step 308 describes a specific way in which the user signals may be used to determine a fabric value score. In this example, both user signals and fabric signals have been normalized into a scale of 0-100 for their respective dimensions, and a distance threshold of 10 has been chosen as a tolerance for determining whether to match a user signal to a fabric signal. This leads to step 310, where for each fabric that has been matched with a user signal, an association is created. At this step, the system may also ascribe and derive a weighting and additional metric by which to qualify and later prioritize the association. It would be especially useful to do so to compare associations with each other.

The next step 312 describes an example where 3 fabrics are chosen by a metric of strength. For example, the strength metric may measure the correlation or tie between the user signal and the fabric signal, perhaps through a distance calculation, and choosing the ones that produce the three minimum distances in the set. Then in step 314, this embodiment of the present invention chooses to present all combinations of the three chosen fabrics to the user for purchase.

Figure 4A:
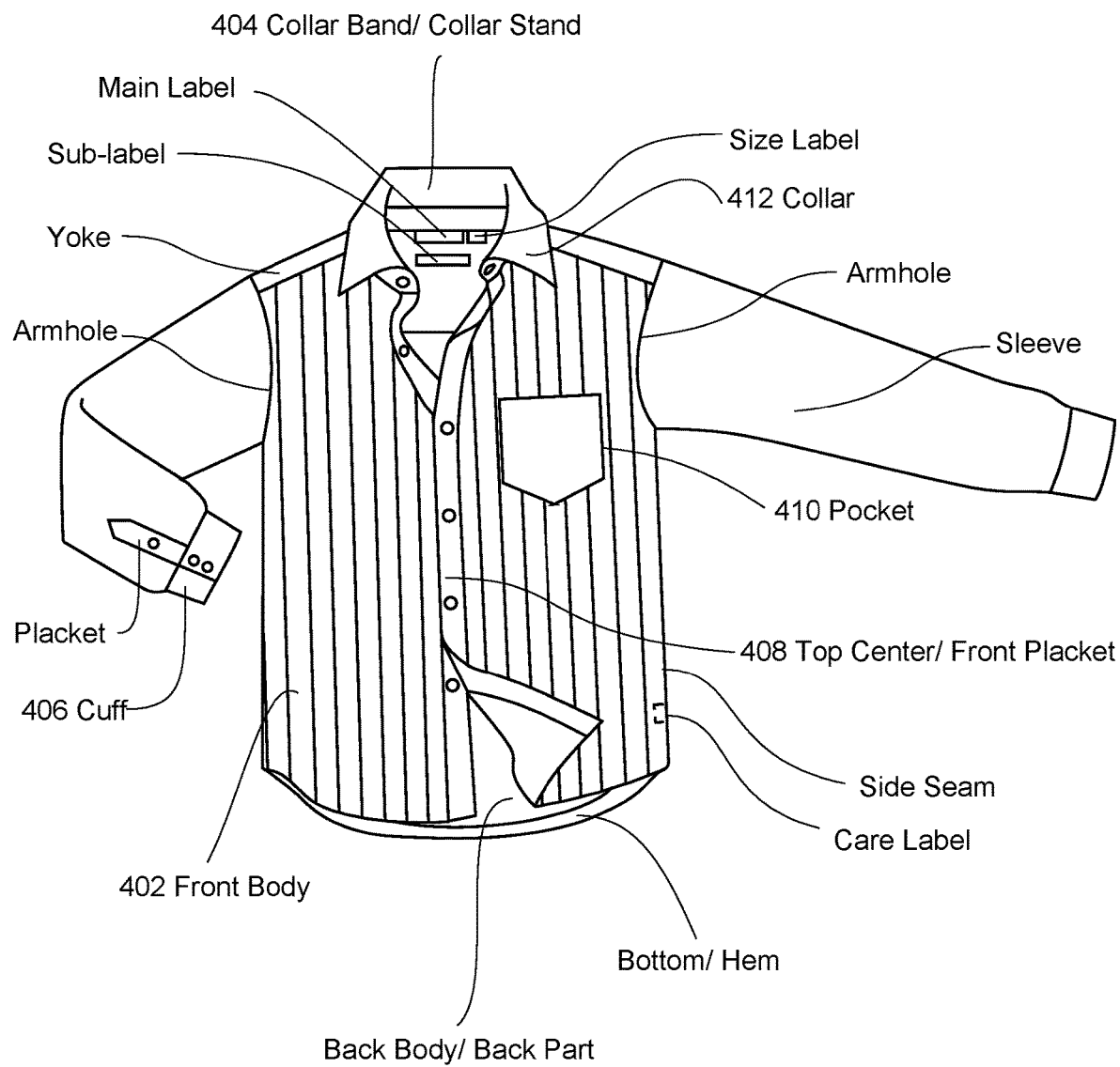
FIG. 4A is an exemplary representation of a customized shirt design generated by the system, according to one embodiment of the present invention.

FIG. 4A illustrates an exemplary image 400 comprising a fabric set for a customized shirt, as rendered for a user to review, according to one embodiment of the present invention as described in FIG. 3. In this particular example, "fabric set" is used instead of a "feature set," assuming that features of the shirt, also known as the components and parts of the shirt are already determined, for example to include a collar, two long sleeves, a front body portion, and a back body portion. Also, a style, cut or shape for each feature is graphically presented as well.

Image 400 helps the user understand how fabrics are put together in his shirt. For illustrative purposes only, different shirt components or features are labeled with part names, such as collar band 404, collar 412, and pocket 410. In most embodiments, feature names are not presented to the user unless requested, while cut and fabric choices including color and texture may be illustrated graphically as shown in FIG. 4A. In some embodiments, such cut and fabric choices may be classified under style variables for each identified feature. In other words, the "style" of a feature may refer to a form of the feature, part, or component of a garment, that characterizes the feature in terms of its shape, structure, or silhouettes. In addition, the style of a feature may refer to the material from which the feature is made from, or the visual look of the feature, based on the material. For example, the color, sheerness, thickness or stiffness of a feature such as a shirt collar may be described by a corresponding style variable.

Note that FIG. 3 and FIG. 4A illustrate a special case of how the system may design a fabric set for a shirt with a known set of features having predetermined cuts. In general, the present system may design a garment in its entirety, namely, a combination of respective feature style values, or cuts and fabric choices for every garment part when applicable. A "feature" here refers to a particular part of a garment, or a structural detail of such a part. Such features or garment parts may each be associated with one or more style variables, which in turn may comprise a cut and/or a fabric. For example, a shirt may comprise a front panel, a back panel, two sleeves, and a collar, each of which is associated with a specific cut or shape, and a specific fabric, where the fabric may be characterized in terms of color, texture, material, and similar traits. A feature may also refer to an ornamental accessory, its detailed look, size, and position on the garment, means of attachment to the garment, or other similar details. A "cut" of a feature or garment part refers to a cutting or shape of a feature or garment part, or the way such a garment part hangs on the body based on the shape of the fabric pieces used to construct it. A cut may also refer to the size or length of a feature of a garment. For example, "boat neck" may refer to the shape of the collar, while "deep" and "shallow" may refer to the depth of the collar, and "wide" and "narrow" may refer to its width. Another example may be "mermaid", "flare", or "A-line" for the shape of a dress, and "mini", "knee", and "ankle" may refer to the length.

As disclosed above, features may be described in terms of feature styles, or style variables. A style of a feature with a fabric component may describe the cut or fabric of the feature. Such cut variables or fabric variables may take on various values, and have associated scores in some embodiments. For example, the collar of a dress shirt may be a feature that has a cut variable with possible values such as "pin" or "button-down," and possible fabric values such as "silk in solid lavender" or "blue polka dots on white cotton." To each of these cut or fabric values, a score may be assigned according to one or more user signals which capture user preferences and traits, such as facial or body characteristics. Other features described by one or more style variables may not have associated cuts or fabrics. In some embodiments, such features may be considered accessories, whose designs may be optimized together or separately with features involving cuts and fabrics. In other embodiments, such features without cuts and/or fabrics may take on style variable names and style values as well, such as "small round black buttons", also with associated scores. Embodiments of the present invention may score a garment design by assigning a score to the entire set of features by combining respective feature style scores, and select the one or more highest scored garment designs to present to the user. Again, such a score may be calculated according to user data and signals including user preferences, facial features, and body shape, and fine-tuning may be achieved with score adjustments, as explained in FIG. 5.

In some embodiments, a customized garment or outfit design may be implemented by means of artificial intelligence techniques instead of any explicit scoring. Note also that in the broader context of designing parts of an outfit or entire outfits, accessories or features not involving any textiles may be mandatory parts of some of the garments, for example, buttons on a shirt, or they may be a separate item, such as a scarf or jewelry which match the outfit.

In FIG. 4A, cuts for different parts of the customized shirt design are clearly presented, with a striped base fabric 402 for the front body, and white fabric for other parts of the shirt. Textures for each part are omitted because of the difficult in representing such fine details without cluttering the image. In some embodiments, fabric 402 may be used as a customized base fabric used throughout the majority of the final product, including not only the front body, but also the back body, the sleeves, and the collar. Similar, in some embodiments, a first non-white fabric may be recommended as an inner collar fabric that line the inside of collar 402; a second fabric may be recommended for the cuff 406; a third fabric may be presented as an inner button fabric that lines the inner buttons in the top center/front placket region 408; a fourth fabric may be presented for the pocket 410; a fifth fabric may be presented for the collar lining of the outer collar 412, showing contrast against the base fabric in the design. Each of these shirt features could use a different fabric, or some may use the same fabric. A combination of fabrics may be shown to the user in a set as shown in FIG. 4A, as a customized shirt design choice.

Figure 4B:
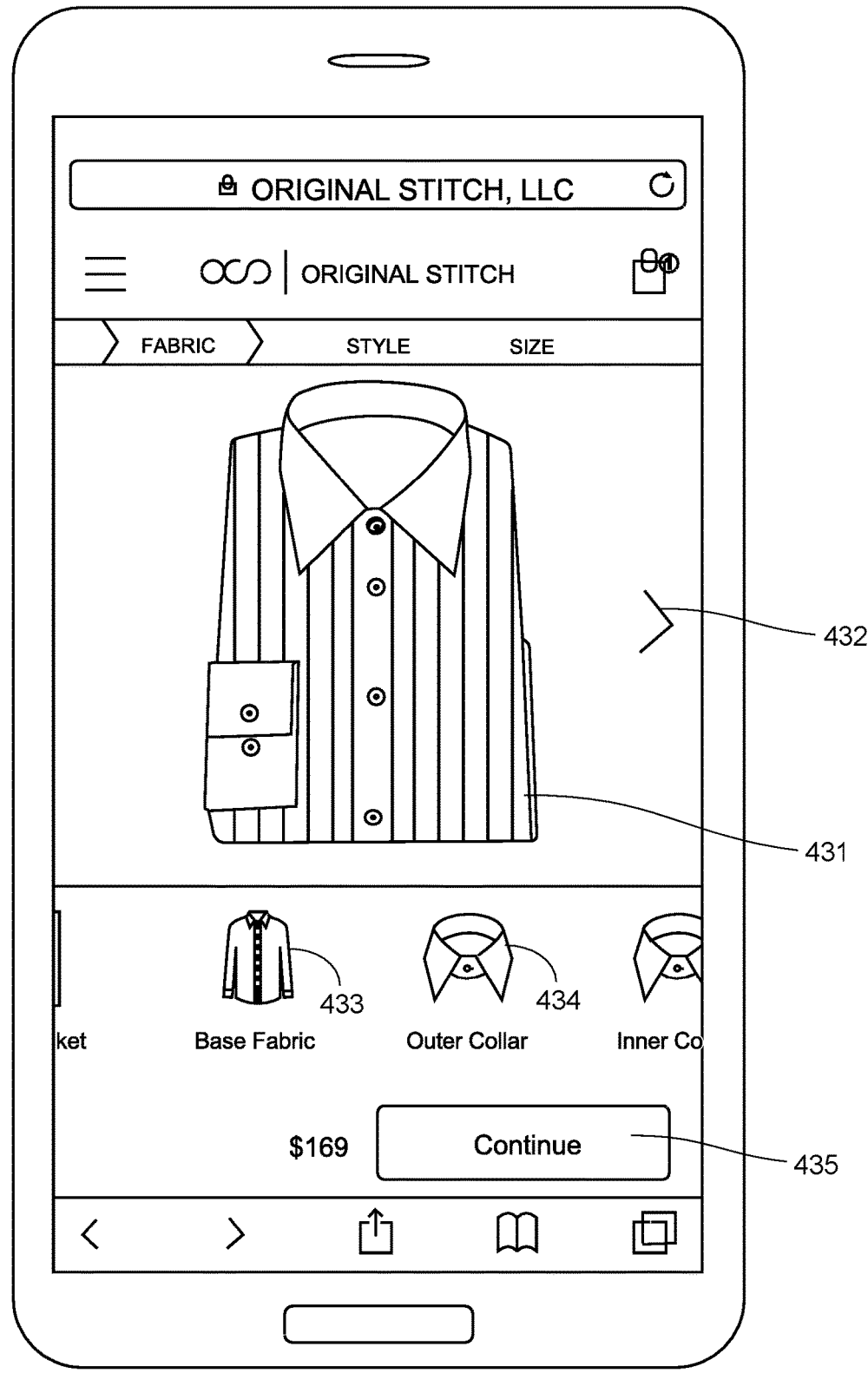
FIG. 4B is an illustrative screenshot of a mobile application showing another exemplary representation of the customized shirt design in FIG. 4A, according to one embodiment of the present invention.
Figure 4C:
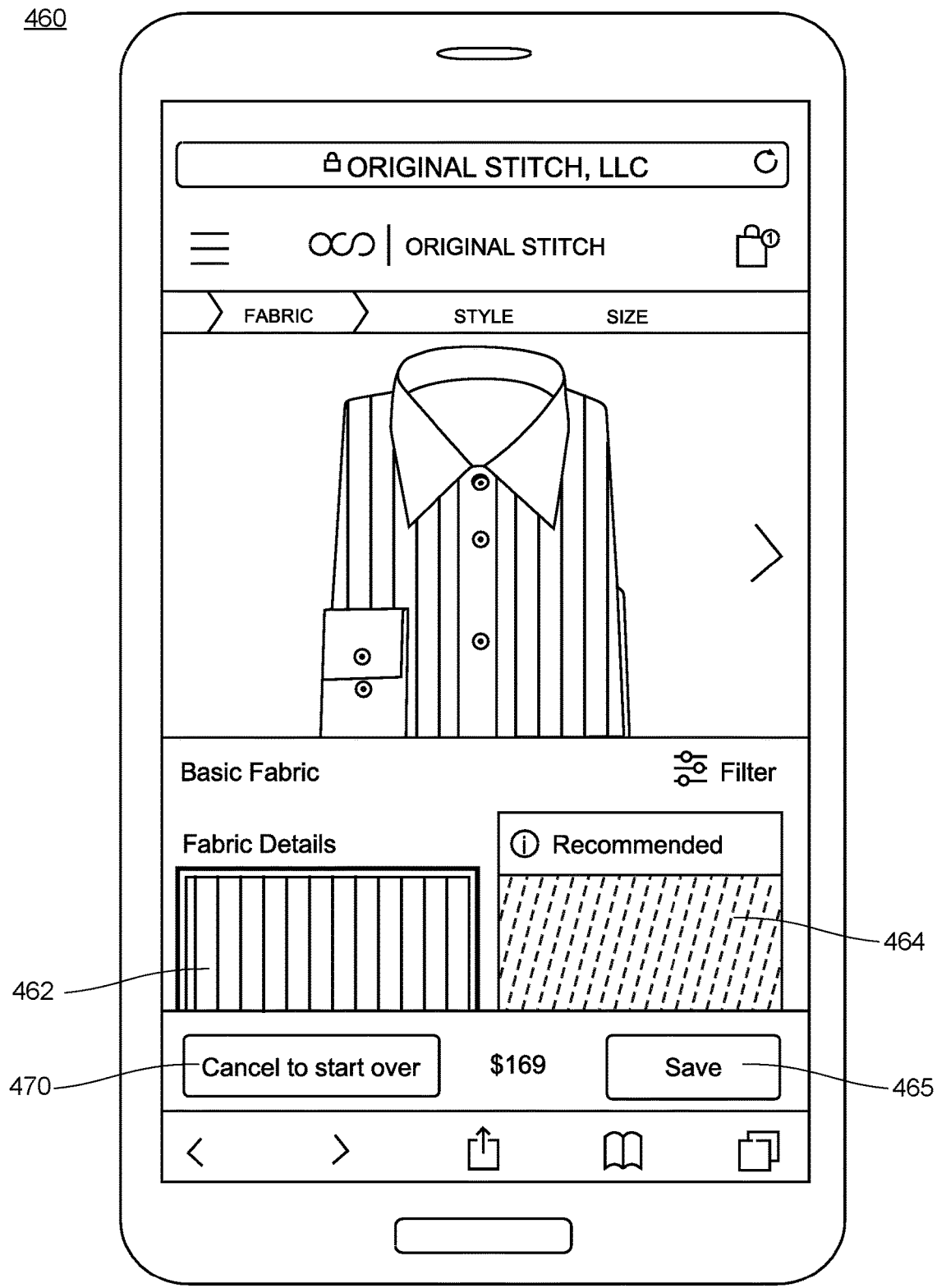
FIG. 4C is an illustrative screenshot of the mobile application showing another view of the exemplary representation in FIG. 4B, according to one embodiment of the present invention.
Figure 4D:
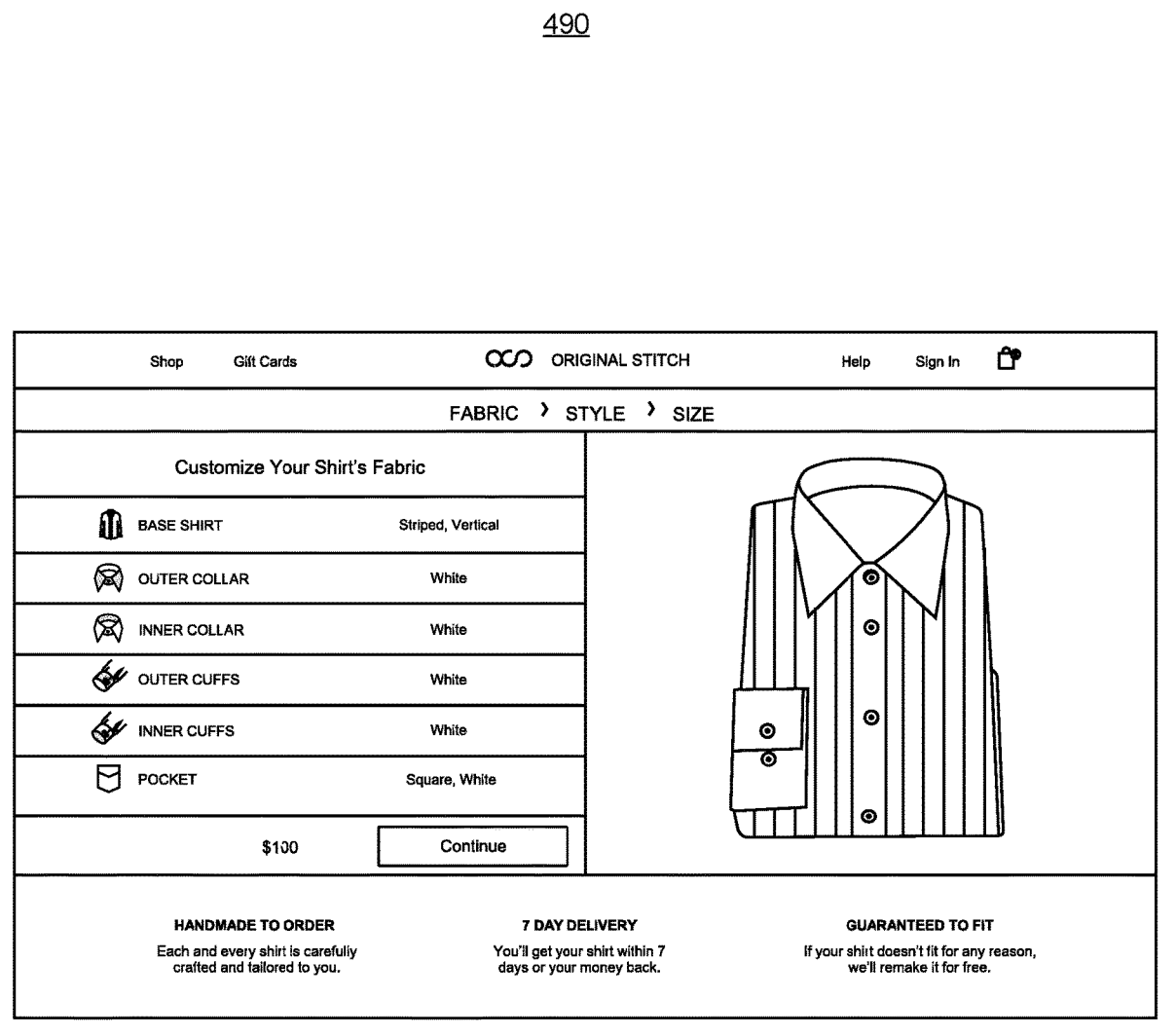

FIG. 4B through FIG. 4D show other ways of presenting the fabric set in FIG. 4A to the user, where the fabric set may have a highest set score calculated based on user preferences, traits, and current fashion trends. FIG. 4B is an illustrative screenshot 430 of a mobile application showing another exemplary representation 431 of the customized shirt design in FIG. 4A; according to one embodiment of the present invention. As previously discussed, a shirt design may be viewed as a set of fabrics and cuts for respective parts of the shirt. In this particular case, design 431 is shown as a folded shirt, with the collar and front portion clearly visible. The pocket style and size shown in this figure differ from that shown in FIG. 4A, as embodiments of the present invention may allow manual selection of individual features, and present such selections visually to the user such as shown in FIG. 4B. In addition, at the bottom of the display, the user may confirm fabric details of the shirt design by clicking on the "continue" button 435. In some embodiments, the user may click on a forward arrow 432 to choose to view other fabric sets with a second highest score, a third highest score, and the like. In some embodiments, the user may use icons such as 433 and 434 to revise portions of the design by substituting a recommended feature, including cuts, fabrics, and other shirt accessories.

FIG. 4C is an illustrative screenshot 460 of the mobile application showing another view of the exemplary representation in FIG. 4B, when base fabric icon 433 has been clicked. In this example, the user may confirm, accept, or save the base fabric with the given fabric details for different parts of the shirt by clicking the "save" button 465, or provide alternative user data including user preferences by clicking on "cancel to start over" button 470. Details 462 of the fabric are shown on the bottom left, while another recommended fabric 464 or a slightly lower fabric score is shown on the bottom right as an alternative choice, so that the user may select another fabric for just the base fabric, for example, from purple oblique stripes to a solid baby blue, while keeping the rest of the fabric set. Once an alternative choice for the base fabric is selected, an overall fabric set score may be updated, by not only substituting the fabric score of the previous choice with the new one, but also taking into account whether the new choice matches the rest of the fabric set. In other words, inter-fabric adjustments may be applied to the overall fabric set. Similar to the base fabric presented here, the user may manually change or adjust fabric preferences for other individual parts of the shirt. Fabric choices may be presented in a decreasing order of fabric scores. Such scores may be presented to the user directly, or may be presented in descriptive terms such as "good match," "good substitution," "acceptable match," or "not recommended." Moreover, instead of altering individual fabrics, the user may change his or her preferences in a more general way, for example, from preferring "bold patterns" to preferring "stripes", for the cuff and outer collar of a shirt. After the change, the system may recalculate scores for possible feature sets by taking into account both old and new user data and signals to generate new or adjusted recommendations.

FIG. 4D is an illustrative screenshot 490 of a desktop application showing another view of the exemplary representation in FIG. 4B, according to one embodiment of the present invention. This is the desktop version of FIG. 4B serving the same purpose.

In some embodiments of the present invention, fabrics may be recommended for garments other than shirts; for example, dresses, skirts, jackets, pants, skirts, blazers, jackets, coats, sweaters, T-shirts, polo shirts, and even shoes and belts. In some embodiments, different garment types may be suggested to the user, possibly depending on the current style trends, fabric inventory, cost, or even production time. In some embodiments, recommended designs or fabric sets may be matched to ready-made garments available on third-party sites such as Amazon and ASOS, for suggestion to the user.

In some embodiments, deep learning may be performed on individual users to automatically learn the users' lifestyle, for presenting multiple products for a user to buy, where such products may come from different categories, and may be available from multiple third-party sites. In some embodiments, such product recommendations may be made based on fabric, garment, or style choices made by the user.

Figure 5:
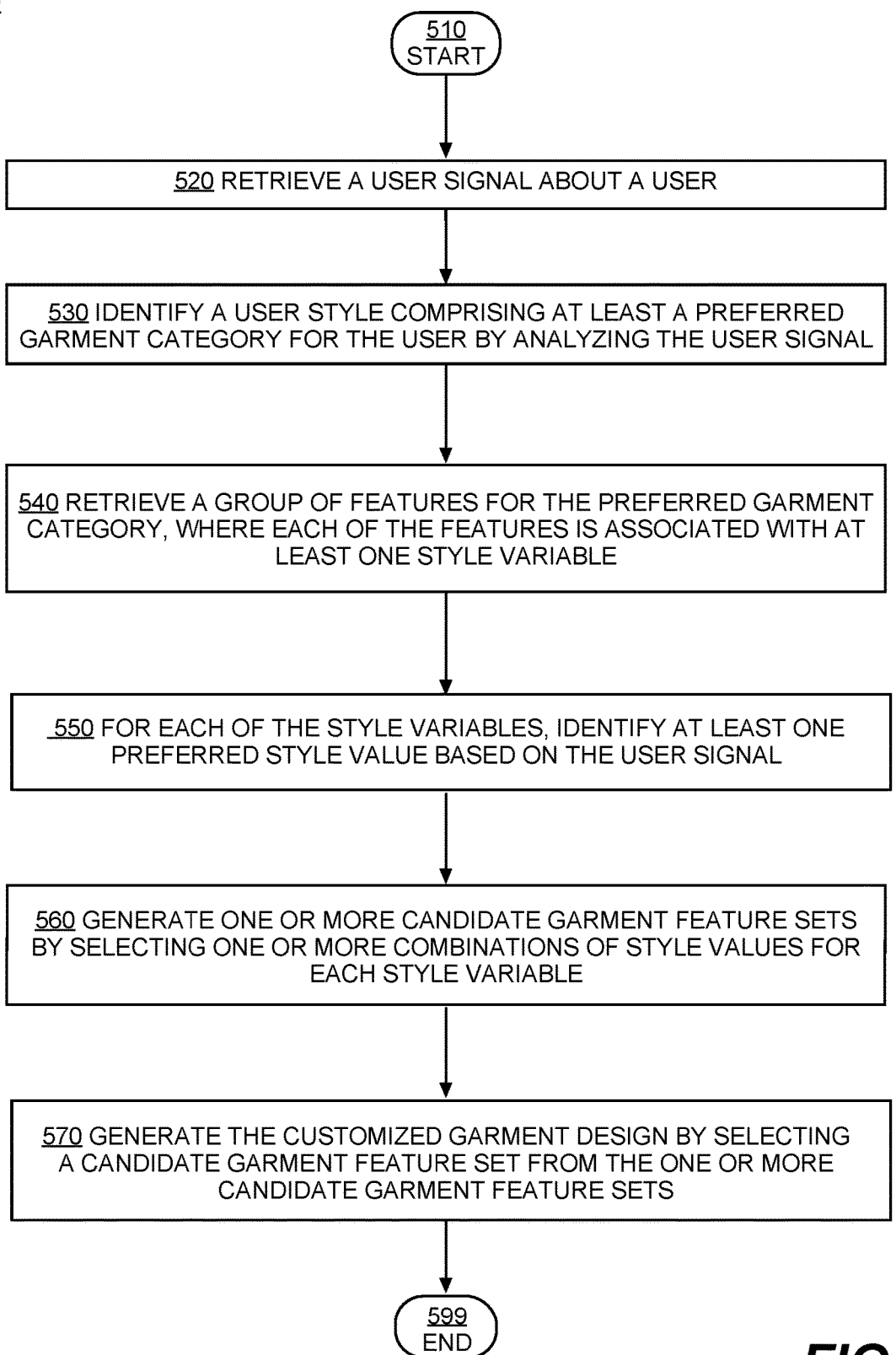
FIG. 5 is a flowchart illustrating a process for customized garment design generation, according to one embodiment of the present invention.

FIG. 5 is a flowchart 500 illustrating a process for customized garment design generation, according to one embodiment of the present invention. Upon initiation at step 510, the system may retrieve, at step 520, a user signal about a user for whom the customized garment is to be designed. In some embodiments, there may be more than one user signal, and at least one user signal may be retrieved by analyzing user data, where the user data is received from one or more data sources, including the user, third-party data sources, and the like. In some embodiments, such user data may be retrieved concurrently from multiple sources in real time. In some embodiments, such user data may be received from corresponding data sources at different time instances across extended time periods, and stored in memory or databases associated with the garment design system. An example of how user signals may be generated from user data and public data is discussed with reference to FIG. 2. The system may then identify a user style comprising at least a preferred garment category by analyzing the user signal at step 530. More details about garment categories are discussed with reference to FIGS. 6 and 7.

In this exemplary embodiment, a user style broadly describes a type of look to express the user's personality, for example, "adventurous but elegant." Alternatively, it may describe a more functional aspect of the user's garment needs, such as "business casual". The user style may further comprise a preferred garment style, such as "Beyoncé Single Ladies style" in terms of user expression, or "classic cocktail style in a taupe theme", which is more for describing the garment's purpose. In some embodiments, the preferred garment style is determined from the preferred garment category; in some embodiments, the preferred garment category is determined from the preferred garment style. In some embodiments, the identification of the preferred garment style may comprise the identification of a preferred outfit style. An outfit comprises at least one garment. In some embodiments, one or more items within an outfit may be customized according to various embodiments as disclosed herein.

In some embodiments, the system may also retrieve public data related to the identified user style, preferred garment category, or preferred garment style, or preferred outfit style; such public data may be used to assist the design in ways to be described below.

At step 540, the system may retrieve a group of features for the preferred garment category, where each of the features is associated with at least one style variable. For example, if the system has determined that the user wants a customized shirt design, the system may retrieve a list of features for a shirt, including collar, sleeves, front body, back body, cuff, buttons, and pocket. If a dress is desired, a different list of features may be retrieved. Such a feature list may be detailed, or may be relatively simple, with only a few number of essential features. The retrieval of these variables may be from an internal database or some other source, where "Internal" refers to a virtual relationship to the system. An internal database may be physically placed at a remote location, yet still be considered internal, as long as it provides storage services to the system and is readily accessible.

In some embodiments, some features may be parts of the garment or outfit made of textiles. Thus, each of these features is cut into a particular form, structure, or shape, and affiliated with one or more textile or fabric properties such as color, texture, material, strength and durability, water resistance level, and the like. Thus, as mentioned in the description of FIG. 3, a style variable for one of these features may be a cut variable, or cut attribute, which refers to the shape or style of the feature, or may be a fabric variable or fabric attribute refers to the feature's material, texture and color, and possibly other textile-related fabric details.

A feature may have many style variables, which may each take on one of many values. For example, the feature "collar" may have a cut variable that may take a cut value of "spread," and a fabric variable that may take on the value "organic cotton in lavender." Exemplary features of the first type for a shirt include collar, collar band, cuff, yoke, placket, lower front body, upper front body, pocket, front placket, back body, and him/shirt tail; exemplary features of the second type for a shirt include button, monogram, care label, and the like. Exemplary features of the first type for a dress includes neckline, neck band, bodice, corset, center front, apex, waistline, skirt, pocket, placket, chemise, shoulder seam, arm, armhole ridge, and hemline; exemplary features of the second type for a dress include laces, sequins, trimmings, and the like. Such feature classifications may be different in different embodiments of the present invention. For example, a feature present in one system may be omitted in another system, and one feature classified as the first type in one system may be classified the second type in another system. Exemplary classifications of features discussed above are for illustrative purposes only, and should not limit the scope of the invention.

Other types of style variables may refer to parts of the garment, garments, or outfit that are not made of textiles, for example seams, embroidery, buttons, Velcro, zippers, belts, tassels, flowers, beads, sequins, piping, and laces. Such features are generally not directly associated with cuts and fabrics. Instead, they may each have specific style values. For example, feature style values for an ornamental accessory may refer to its detailed look, size, position on the garment, and its means of attachment to the garment. In a specific example, one such may refer to an embroidery on the pocket of a shirt. The style value for such the embroidery may be "red rose in silk." For each feature, whether associated with a textile component or not, there may be at least one associated style variable, each of which may take on many possible style values.

At step 550, for each of the style variables, the system may identify at least one preferred style value based on the user signal. In some embodiments, this may be done by analyzing the user data and the public data, where each preferred cut value is associated with a cut value score computed based on the user signals indicating an affinity to the user.

For example, for a textile-associated feature, the system may identify at least one preferred fabric value, where each preferred fabric value may in some embodiments be identified from a source selected from the group consisting of the user data, the internal database, and the public data. In some embodiments, each preferred fabric value is associated with a fabric value score computed based on the user signals to indicate an affinity to the user. Similarly, the system may do the same for each cut variable and other types of style variables, where each of the preferred cut values or style values is similarly associated with a score computed based on the user signals. In other embodiments, there may not be a need for any scoring, as the final design may be achieved by a means not involving scores, such as artificial intelligence methods such as deep learning. Steps 550 will be discussed in more detail with reference to FIGS. 8-11 later.

At step 560, following at least some of the above steps, the system may generate one or more candidate garment feature sets by selecting one or more combinations of preferred style values for each style variable, where any of these style variables may be a cut variable, a fabric variable, or other type of style variable. In some embodiments, each garment feature set may optionally be associated with a feature set score computed from cut scores associated with the selected preferred cuts, fabric scores associated with the selected preferred fabrics, and other style scores associated with the selected styles. In some embodiments, the feature set score may furthermore include inter-style score adjustments, which may be inter-fabric score adjustments, and inter-cut score adjustments, fabric-cut score adjustments, and other style-fabric or style-cut score adjustments. Such score adjustments may be positive, zero, or negative, where a positive score indicates a good combination, while a negative score indicates a bad match or a bad combination. In some embodiments, inter-fabric or inter-cut score adjustments are zero or negative, where a zero score indicates a good or an optimal match, and a negative store indicates a less desirable match.

At step 570, the system may generate a customized garment design by selecting a candidate garment feature set from the one or more candidate garment feature sets. In some embodiments, the feature set with the highest feature set score may be selected. Feature set scores may be normalized, for example to a scale of 0-100, with 100 being a perfect fit for the user, and 0 being a very poor choice, or −1 to 1, with 1 being an ideal design for the user and −1 being a mismatch. In some embodiments, feature set scores may be derived from an average or weighted combination of cut scores, fabric scores, and feature scores associated with different features of the garment. In other embodiments, such feature set selection is not based on any scoring, as already mentioned above.

In an illustrative example, a user may provide five input photos containing dresses with asymmetric skirts and having vibrant, bright colors. A high user funkiness signal of 94 out of 100 may be derived from the user input data by comparing a detected color of the dress to a known spectrum where each color is assigned a funkiness score. A preferred garment category of asymmetric skirts may also be determined from the user input data. Thus, any skirt portion of a dress may be assigned a cut score of 100 out of 100 if it is asymmetric, and a royal blue and turquoise fabric with bold patterns may have a fabric funkiness signal of 85, which may in turn translates or coverts to a very high fabric score for this user. For example, in some embodiments, the fabric score may be computed from the funkiness signal by subtracting the difference between user funkiness and fabric funkiness from 100. In this case where user funkiness is 94 and fabric funkiness is 85, the fabric score may be computed as 100−|94−85|=91. Note in this definition for the fabric score, if both user funkiness and fabric funkiness are high, or both are low, the computed fabric score is high. If one is high and the other is low, the computed fabric score is low. Thus, indicating an affinity of the chosen fabric to the user or user preferences. Other similar definitions for fabric scores, cut scores, and feature scores may be defined in similar embodiments of the present invention, to measure respective affinities of a given cut, fabric, or feature to the user, in terms of a correlation between user and fabric signals.

Similarly, for the user above, a black cotton fabric may have a low fabric funkiness signal and a corresponding low fabric score of 26; a pencil skirt part of a dress may be symmetrically shaped, with a relatively low cut score of 30. If the dress is made from one fabric only, a single "body" feature may describe the dress, with a fabric variable indicating the textile used for making the dress, and a cut attribute indicating a cut of the skirt portion of the dress. In this simplified case, only a single textile-associated feature is considered. The fabric score and cut score as stated above can be averaged or weighted, to provide an initial or pre-adjusted feature set score of (100+91)/2=95.5 for a dress having an asymmetric skirt made from a royal blue and turquoise fabric with bold patterns, (100+26)/2=63 for a black dress with an asymmetric skirt, (30+91)/2=60.5 for a dress with a pencil skirt made of a royal blue and turquoise fabric with bold patterns, or (30+26)/2=28 a black dress with a pencil skirt. Clearly the first blue and gold asymmetric-skirted dress with the highest feature set score matches the user's preferences the best, and may be presented as a customized dress design to the user.

In some embodiments, default or pre-determined values for features, cuts, fabrics, and other components of the garment may be loaded and used in the garment design process, if no explicit values are extracted from the user data. For example, the cut values in step 570 and the feature values in step 580, such as the color and size of the buttons, may be pre-determined, regardless of other features of the shirt, may be directly selected by the user, or may be assigned a default value that based on another feature, for example, on the color of the front body portion of the shirt.

It should be noted that FIG. 3 illustrates an implementation that embodies a special case of the general process described in FIG. 5. In FIG. 3, the garment category is a shirt, with predetermined cuts for respective features of the shirt when applicable. Thus, in this example, the only aspect that needs a design is the set of fabrics to be used for the different parts of the shirt. In the context for FIG. 5, steps 302 and 304 are used to retrieve user data from third-party data sources, which are data-rich services that the user has accounts with. Retrieved user data may include one or more of Google Email, Facebook photos, Facebook timeline events, Facebook friends, Instagram photos, YouTube videos, Tumblr blogs, LinkedIn professional profile, and LinkedIn connections. Such user data may comprise a direct garment category input having the value of "shirt." Step 306 lists specific user signals that may be extracted from the user data. Steps 308 and 310 provide a specific two-step process for determining fabric scores, as in an optional action in step 550. A limited number of candidate fabric values are retrieved in step 308, based on a distance metric between the user signals and some fabric signals. Determining the association between user signals and fabric signals may be viewed as the process of determining fabric scores. For example, at step 308, user and fabric signals may both be normalized to a maximum value of 100, and a single pair of same or similar user signal and fabric signals, for example, happiness signals, may be compared to see if they are within some distance threshold, such as 10. For any fabric with a fabric signal within 10 units of the user signals, an association may be created at step 310 and a corresponding fabric score may be established, where a distance of 0 may be converted to a fabric score of 100 indicating a perfect match or association, and a distance of 10 may be converted to a fabric score of 50 indicating a mediocre match or association.

In some embodiments, there may be many different user and fabric signals, including but not limited to, user or fabric happiness signal, funkiness signal, intellectuality signal, colorfulness signal, complexity signal, conservativeness, and adventurousness signal. At step 310, the system may create associations based on signal distances, and generate a score for each queried or retrieved fabric by weighing the degrees of association between corresponding pairs of user and fabric signals. For example, a fabric score may be computed based on distances between pairs of user and fabric happiness and conservativeness signals, where the weighting for happiness vs. conservativeness may be 0.5 and 0.5, 0.8 and 0.2, or the like. Subsequent choosing of fabrics with high association strength and weights is equivalent to choosing fabrics with high fabric scores.

In another illustrative example where there are five pairs of user and fabric signals, an equal weighting of 0.2 is equivalent to taking an average. In case when no corresponding fabric signal is available for a user signal, the system may adjust the weighting so the unmatched pair has a zero weighting. For example, if no fabric intellectual signal is available while a user intellectual signal has been determined, the other four pairs of user and fabric signals may each be reassigned a new weighting of 0.25. Alternatively, a pair of user and fabric signals where the user signal value is very high may be reassigned a larger weighting, such as 0.4, while others are maintained at 0.2. Apart from these two variations, fabric scores may be calculated from user data, user signal, and various other signals in similar ways.

Steps 312 and 314 are a special case of step 585. In this case, a feature set having three fabrics is formed by choosing top-scored fabrics, where a feature set score may be computed by averaging the fabric scores, but with 0 inter-fabric adjustments. In other words, no inter-fabric adjustments are performed. In the more general scenario shown in FIG. 5, Inter-fabric adjustments or inter-cut adjustments may indicate which fabrics and/or cuts look good together, with positive score adjustments awarded to pleasing combinations and negative score adjustments for ill-matched combinations according to some metric or public data. For example, black- and white-colored fabrics may be associated with a positive adjustment value of 5, purple and gold may be associated with another positive adjustment value of 3, while red and green may be associated with a negative adjustment value of −5. Even though inter-fabric score adjustments are listed in a pair-wise fashion in this example, in some embodiments, such score adjustment ay be specified for other tuples of fabrics, or in terms of logical conditions on the available fabric characterizes.

In step 314, all three-tuple fabric combinations or sets may be presented to the user for purchase. In some embodiments, only N combinations having top feature set scores may be presented, where N may be determined by the user of the system. In the more general embodiment illustrated by FIG. 5, such ranking of fabric combinations or feature sets is performed at step 570.

As previously discussed, in some embodiments, received user data may comprise an explicit textual statement indicating a preferred garment category for which a customized garment is to be designed. In other cases, for example when only graphical data are available, computer vision algorithms may be performed at step 540 by the system to identify the preferred garment category.

Figure 6:
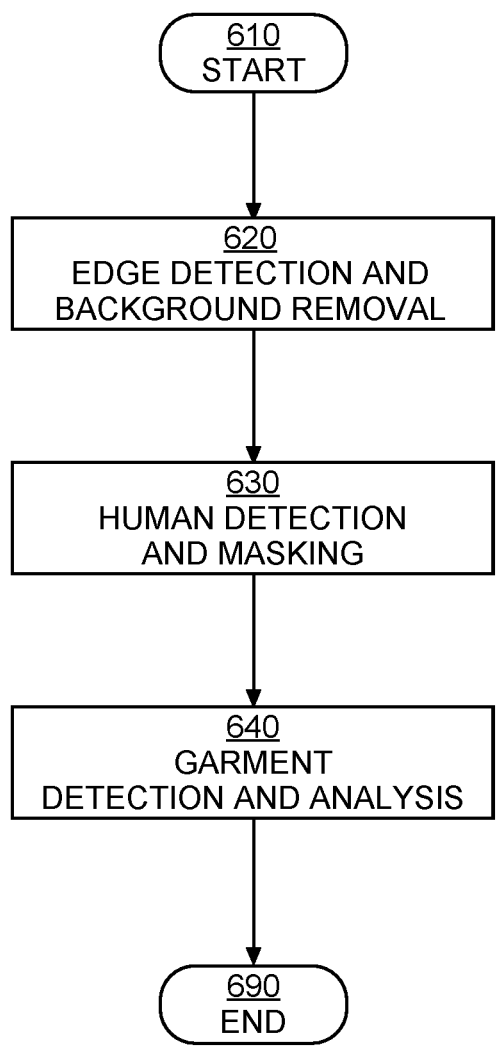
FIG. 6 is a flowchart describing an illustrative algorithm for garment category classification based on photograph of a garment, according to one embodiment of the present invention.

Correspondingly, FIG. 6 is a flowchart 600 describing an illustrative algorithm for garment classification given a photograph showing a garment of interest by the user, which may be provided by direct user input or by automatic retrieval from social media, according to one embodiment of the invention. Assume the photograph shows an image of the user wearing a favorite garment, for which a similar garment is to he designed. Upon initiation at step 610, the system may perform edge detection to remove an image background at step 620, leaving only portions of the image that shows the user. Next at step 630, the system may perform human detection by search for the face, hands and feet, and/or skin areas on the limbs. Upon detecting parts of the user not covered by the garment, such parts may be masked. Thereafter, the system may analyze what. remains in the photo, which contains the garment only, to perform a machine learning analysis for classifying the garment into a category or sub-category at step 640. The overall process terminates at step 690. In some embodiments, upon determining the category for the garment in a photo, the system may proceed to identify features of the garment. In some embodiments, garment categorization may alternatively be done by first determining cuts and features of the garment.

Note that while the shirt design process illustrated in FIG. 3 is a special case of the garment design process illustrated FIG. 5, embodiments of the present invention may be further generalized to design entire outfits comprising any number of garments and/or accessories, or to design one or more pieces of garment and/or accessories to match existing garments owned by the user. Note also that in the broader context of designing parts of an outfit or entire outfits, accessories or features not involving any textiles may be mandatory parts of some of the garments, for example, buttons on a shirt; or they may be a separate item which are additional accessories, such as a scarf, shawl, brooch, tie clip, cuff links, hair accessories, earrings, necklace, bracelet, rings, other jewelry, hat, belt, sash, glasses, sunglasses, jewelry, gloves, shoes, boots, or tattoo stickers. These accessories may be designed in the same way in which a garment to make up an outfit is designed by either choosing a generic accessory among those available for purchase that goes well with the other features of the garment or outfit, or by designing a custom accessory by selecting the features of the accessory category individually via scoring various style values or other techniques. In some embodiments, for ease of description, individual non-textile accessories may be called "garments" as well, with "garment styles" and "style variables" describing their general shape or make. Similar to designing a customized garment based on component features, a customized outfit may be designed based on component garments, each with a garment score, or individual feature scores, that maybe be tallied and compared to find a best design.

More specifically, two exemplary approaches are provided to design either part of an outfit or an entire outfit. The first is to generate garment feature sets, and calculate feature set scores of outfit feature sets by a sum or weighted sum of the garment feature set scores, together with inter-garment score adjustments. For example, a leather jacket may not go well with loose-fitting overalls for an outfit of a "clubbing" outfit style and/or user style, and thus the inter-garment score for this combination is negative. On the other hand, for the same "clubbing" outfit style for a male user, the inter-garment score may be a large positive number for a pair of slim jeans and a sleek slim-fit shirt with a flamingo patterned fabric. For the design of part of the outfit, information on existing pieces may be utilized, and included in the inter-garment score adjustments. The second approach is to generate part or all of an outfit by having outfit feature sets containing every feature of every item in the outfit, such that the style values for the style variables of every feature of the same piece or between different pieces in the outfit may be optimized together and inter-style score adjustments between different features are scored together. In some embodiments of each of these approaches, the system may normalize the outfit score to the number of items it is designing, so as to avoid a bias which favors an outfit with a large number of items. Otherwise, a poorly matched outfit with five components may still score higher than an elegant two-piece outfit, for example.

A design of one or more pieces of an outfit may be generated by one of the two aforementioned approaches. Note that the approaches are valid with or without scoring. Using other techniques, designs may be generated by first taking into account pieces of garments or other accessories, and then putting these together. Alternatively, the features of every piece may be designed together in a clustering or other type of machine learning method.

In FIG. 6, edge detection, human detection, and garment detection may each be viewed as special cases of object recognition, pattern recognition, and feature extraction algorithms from the field of machine learning and imaging processing. Such algorithms are well known in the art. For example, machine learning techniques such as decision trees may be utilized to determine whether a garment is a dress or a suit. The system may also further identify a garment sub-category or garment style within the garment category for generating the customized garment design.

More specifically, the system may determine a garment category first by clustering or other machine learning techniques. Training sets with photos of garments of various shapes may be fed into the system so that it learns to categorize the garments by experience with training data. For example, the system may recognize a dress shirt to be the garment in the photo at hand. Once the garment category is determined, features of the garment may be detected subsequently. For example, once it is determined that the garment at hand is a dress shirt, it is known that several features must exist, including collar, cuff, and sleeves, etc. The system may hone in to these parts and identify, for example, that the collar has a button-down cut. The system may also detect that the fabric is a violet silk. By analyzing the photos provided by the user, the system may identify not only the garment category the user is interested in, but his preferences for colors and textures of fabrics as well as style. The system may also be able to analyze whether the user is looking for formal attire for business or for partying, by analyzing how traditional or bold the various features like cuts and fabrics are. Numerical values for user signals like funkiness may be assigned accordingly.

Another route to categorize a pictured piece of garment is by determining the features first and then coming up with the category. For example, the system may be acquainted with shapes of garment parts like skirts, sleeves, collars, etc. By identifying different parts of a garment, for example, the presence of collars, buttons down the middle, long sleeves, cuffs, and no sign of pants or a skirt, the system may recognize from an internal database or public data containing a simple list of parts of various types of garments, that the garment pictured is a dress shirt for men, or a shirt dress for women. In this second approach, features are readily available for analysis by the time the garment is categorized.

Figure 7:
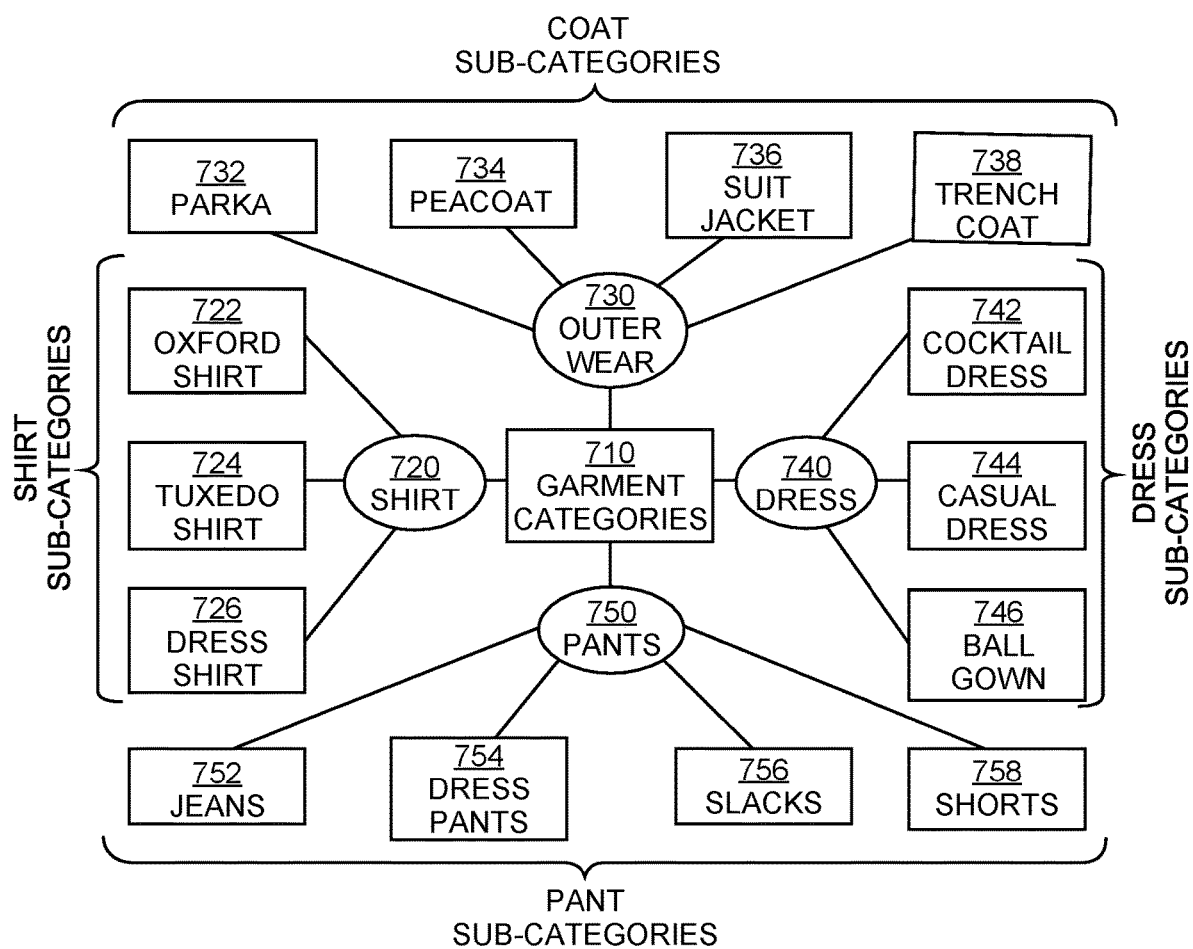
FIG. 7 is an illustrative diagram showing exemplary garment categories and sub-categories, according to one embodiment of the present invention.

FIG. 7 is an illustrative diagram 700 showing exemplary garment categories and sub-categories that garments may be classified into, according to one embodiment of the present invention. For example, garment categories 710 may include shirt 720, outerwear 730, dress 740, and pants 750. Each category may further branch out into sub-categories. Such subcategories ma may be based on function or occasion. For example, under dress category 740, exemplary sub-categories include, but are not limited to, cocktail dress 742, casual dress 744, and ball gown 746. Alternatively, the sub-categories may he based on style, for example, under shirt category 720, there may be sub-categories Oxford shirt 722, Tuxedo shirt 724, and dress shirt 726. The sub-categories may also be classified based on a mix of function and style. For example, under pant category 750, there may be sub-categories jeans 752, dress pants 754, slacks 756, and shorts 758.

Figure 8:
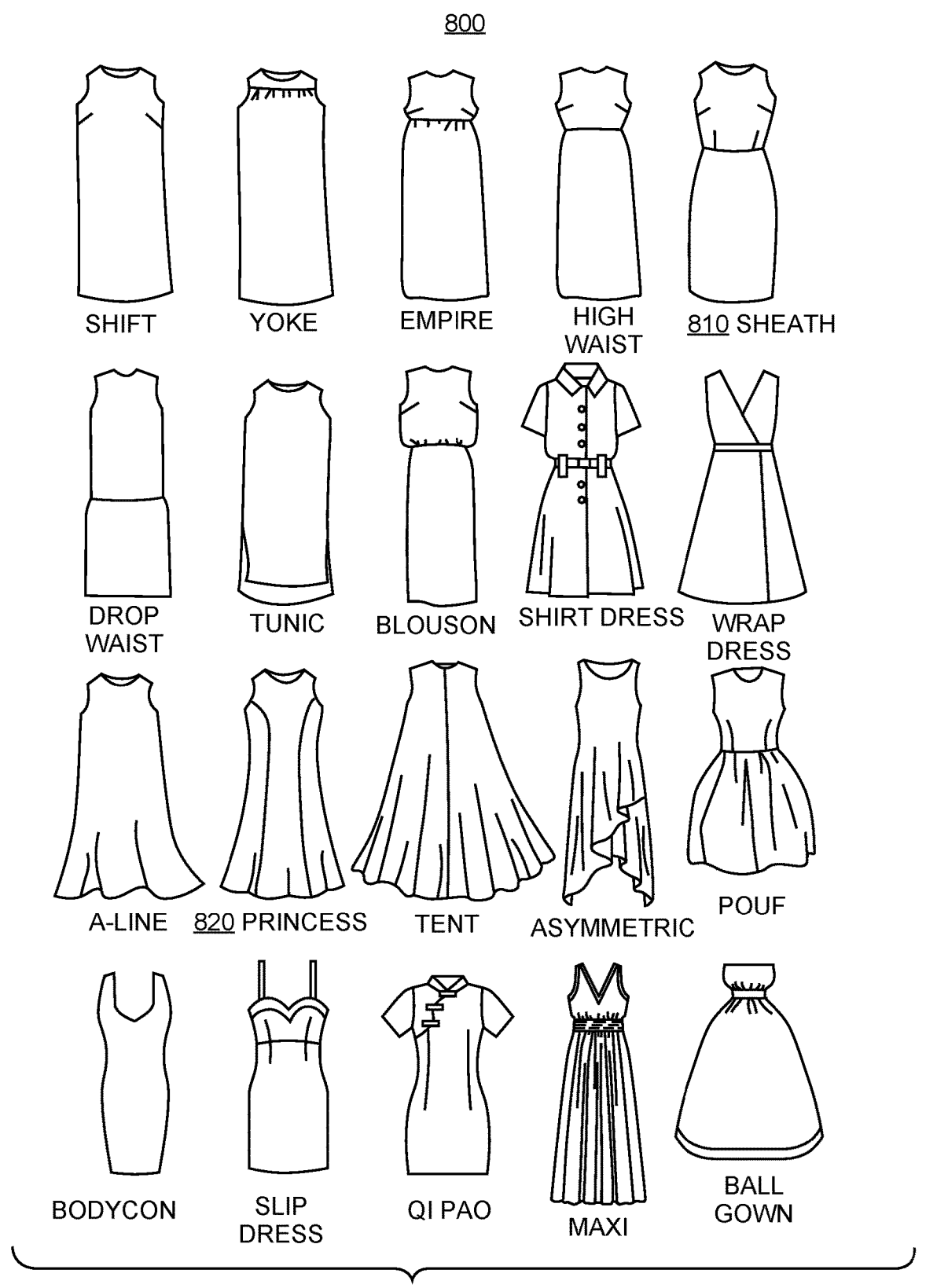
FIG. 8 is an illustrative diagram showing dresses with different silhouettes, according to one embodiment of the present invention.

There may sometimes even be more refined sub-categories, which may be called micro-categories. For example, different dresses have different overall shapes, and such a shape is called the "silhouette" of a dress. FIG. 8 is an illustrative diagram showing micro-categories of dresses with different silhouettes, such as sheath 810 and princess 820. Each micro-category of a given category of garment may have some necessary and optional parts, with corresponding features. In some embodiments, the system may populate the style variables for these features at step 560 of the process shown in FIG. 5, thereby determining a set of candidate cuts, candidate fabrics, and other candidate style values, and assigning scores for values for these variables using all available signals. In some embodiments, garment category, sub-category, or micro-categories may be presented to the user, who may in turn be prompted to select preferred ones for customized garment design generation.

Figure 9:
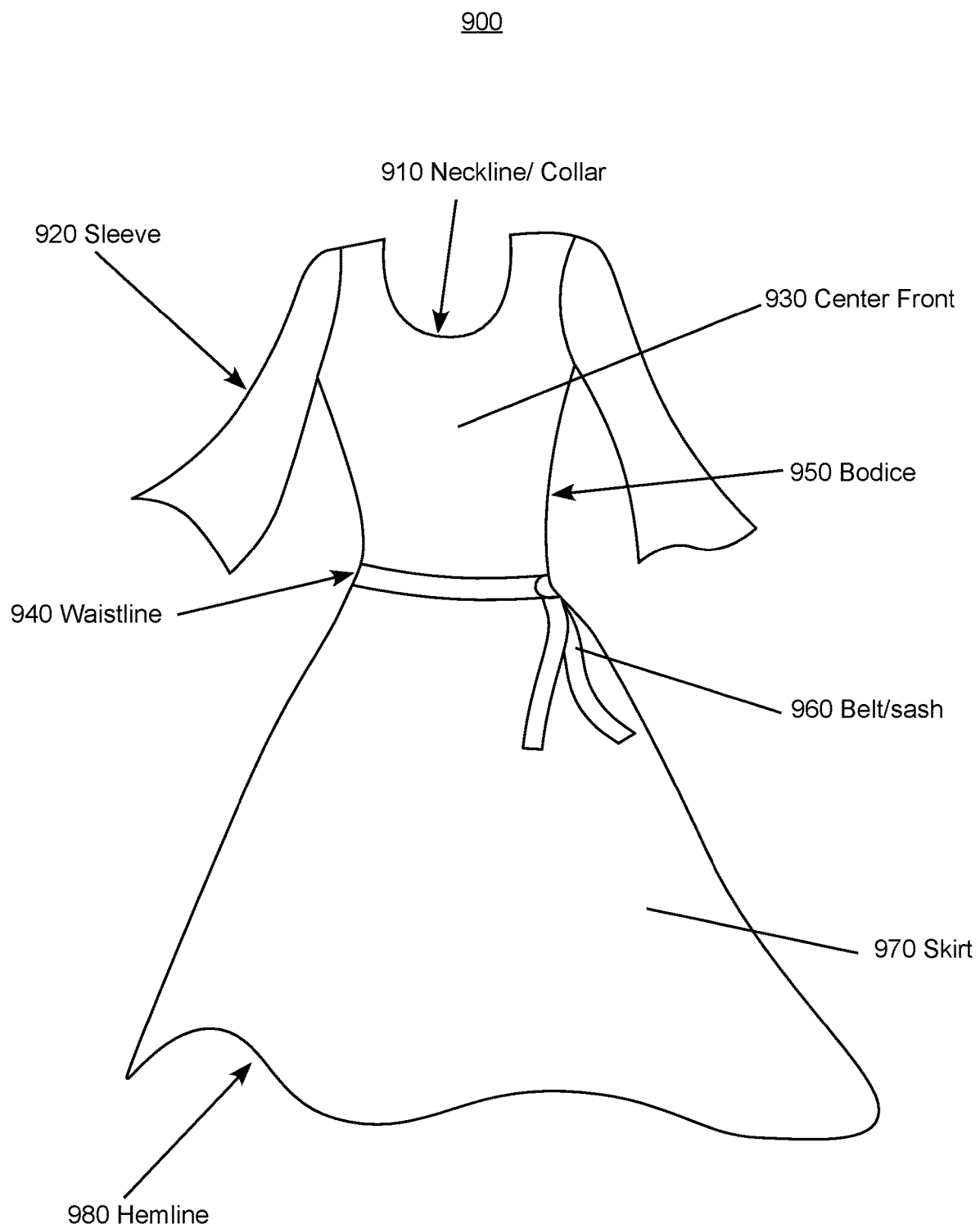
FIG. 9 is an illustrative diagram showing labeled parts of a dress, according to one embodiment of the present invention.

FIG. 9 illustrates parts or features of a dress, according to one embodiment of the present invention. This depiction is intended for illustrative purposes only, and does not cover all styles of dressed. Shown in FIG. 9 are necessary features such as neckline 910 and skirt 970, and optional features such as a sash 960. For other dresses, there may be optional features such as a lace frill in its hemline. Notice that the dress does not have to be made in one single fabric. The system may come up with a feature set where sleeves 920 have a sheer grey chiffon fabric, the bodice part consisting of center front 930 has a white silk fabric with baby blue dots, skirt 970 has a navy-blue organza fabric, and belt 960 is made of a rope braided with grey and blue silk threads.

Figure 10:
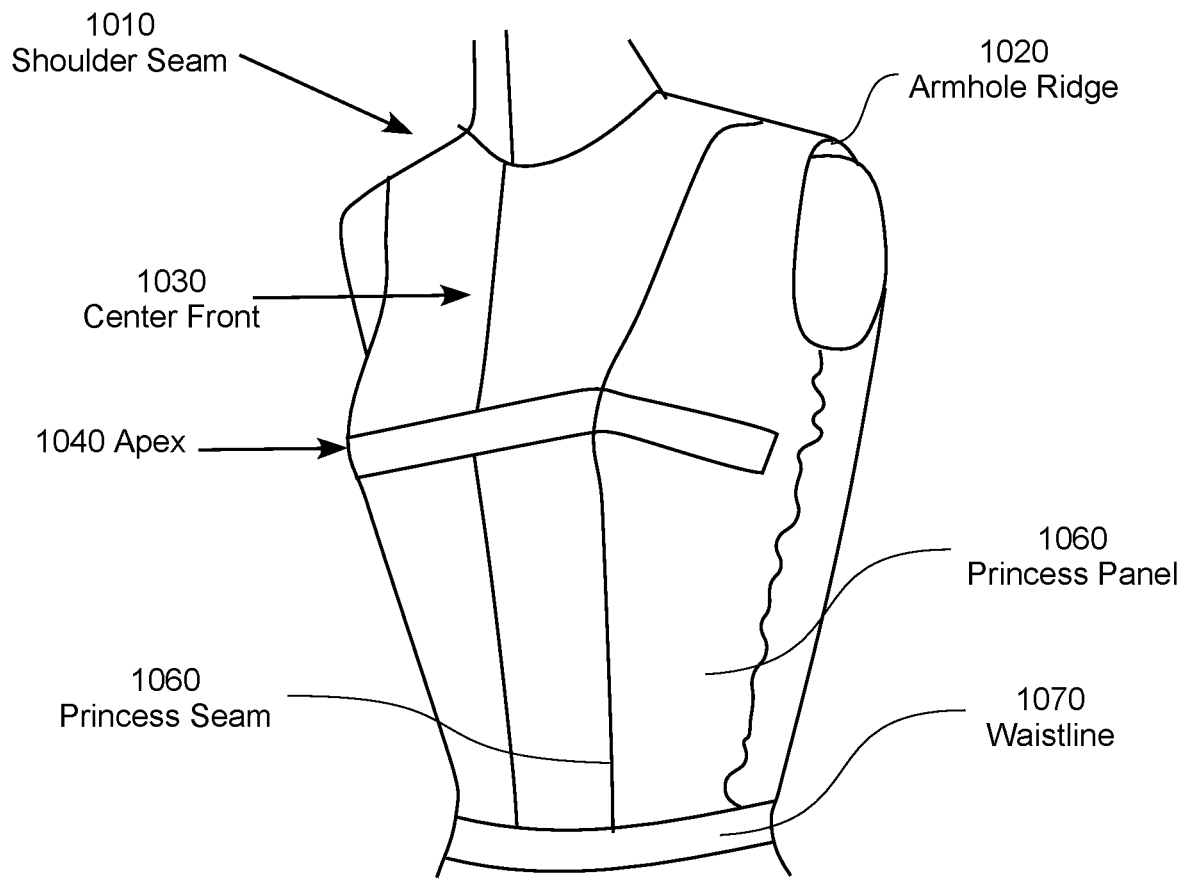
FIG. 10 is an illustrative diagram showing labeled parts of the bodice of a dress, according to one embodiment of the present invention.

FIG. 10 is an illustration of labelled parts of the bodice of a dress, such as shoulder seam 1010, apex 1040, and waistline 1070. Some finer divisions of features shown in FIG. 10 may be optional. For example, princess seam 1060 may not exist in every dress. Each of these features in FIGS. 9 and 10 may have cut variables and fabric variables associated with them, or other feature value(s) associated with them, for example, a decorative pocket in the skirt may be associated with a position, depth, and a particular style of lacings.

FIG. 11 illustrates some commonly found styles for the necklines of dresses, and these styles, such as sweetheart 1110 and V-neck 1120, are examples of cut values that may populate the cut variable for a feature "neckline".

As another specific example of garment features, recall from FIG. 4A that a shirt necessarily has a collar 404 and a cuff 406, and optionally, decorative embroidery details on the pocket. The collar is a feature that has a cut attribute or variable, which may take cut values of, for example, spread, forward-point, club, cutaway, to name just a few. The cuff as a feature may have a cut attribute or variable that takes cut values such as round, square, Portofino, French, for instance. The fabric variable for any structural feature such as the collar and the cuff may take values such as "white cotton" and "blue-green plaid flannel." These are features of the first type as previously discussed. Features of the second type have no associated cut or fabric, and may be a decorative accessory or a necessary part such as a button, whose style variable may take as its value a description of style such as "small, circular, black, to be sewn onto the cuff".

As another illustrative example of the garment design process, consider the case where an input of three dresses of very different structural shapes or cuts are received as user or public data, the system may output a design that has intermediate cut features, which may involve an element of surprise by mixing and matching styles, but still in accordance with user preferences. Given an input of four shirts with similar cuts but different fabrics, the system may generate a shirt with a similar cut but with a completely different fabric that still has a high score according to user signals, and may generate another option which has different fabrics in different areas. This is a very convenient way of generating brand new designs in a smart and automatic way.

Sophisticated designs may be achieved with embodiments of the present invention by means of score adjustments, which may be positive or negative values added to the score of a feature set directly or with weightings. For example, the system may perform coordination of colors and texture of fabrics as well as cuts by taking into account of colors or types of fabrics that look good together, as captured by inter-fabric score adjustments, colors that pair well with cuts, as captured by cut-fabric score adjustments, and fabrics that look good with other fabrics, as captured by inter-fabric score adjustments. These score adjustments may be positive, negative, or zero, depending on whether the respective combination is favorable.

Other score adjustments may depend on one or more factors, including current fashion trend, whether particular cuts, colors, or fabric textures are flattering or suitable for the function of the garment, the body shape type of the user as captured by cut-bodytype score adjustments, fabric-bodytype score adjustments, and feature-bodytype score adjustments, or the user's overall facial features including but not limited to eye color, hair color, skin tone, facial bone structure and other facial features, as captured in cut-facial score adjustments, fabric-facial score adjustments, and feature-facial score adjustments. Again, these score adjustments may be positive, negative, or zero, depending on whether the combination is favorable and flattering or not, with positive values indicating good and flattering combinations.

For example, it may be known from public data that sweetheart and V-neck necklines, instead of cowl necklines, are flattering for a round face; bright blues, pinks, and purples are flattering for cool skin tones, but not oranges; clear, bright colors look good for deep blue eyes; and linen and crisp cotton with bold patterns and prints or dark colors are suited to fuller body shapes. Score adjustments may be made accordingly for a full-figured female with a round face, cool skin tone, black hair, and deep blue eyes. For a crisp cotton fabric with red and black large print linens, the fabric-bodytype score adjustment may be a large positive number, for example, 8 out of 10, since both the texture, the colors and pattern are suitable. Similarly, for a ponte fabric in a light pink, the fabric-bodytype score adjustment may be a positive number close to 0, such as 2, since the color is too light, but the texture is great. A crepe fabric in solid bright orange may have a fabric-bodytype score of a large negative number, for example, −10, since both the color and texture are unsuitable for the user.

Analogously, for the same user, a cut-facial score adjustment for V-neck may be 6, and for cowl neckline, −5. The fabric-facial score adjustment for a flannel in deep turquoise may be 6 due to the color, but the fabric-bodytype score adjustment for the same fabric may be −9 due to the stiff fabric, and these two score adjustments for the fabric may be simply added, or any large negative adjustments may be more strongly weighted to avoid especially unflattering features.

Assuming the user prefers a dress with an asymmetric skirt as in the earlier example discussed with reference to of FIG. 5, where the user has a user funkiness signal of 94. Then a dress with an asymmetric skirt made of a crisp cotton fabric with royal blue and turquoise bold patterns may have a fabric-bodytype score adjustment of 8, and a fabric-facial score adjustment of 7, which together may increase the feature set score to above 100. Such a feature set score may be capped at 100, indicating that this is a very good design for the user.

There may be other ways to combine the scores, for example, by weighting very negative score adjustments more strongly, to avoid especially unflattering combinations. In another example, a black asymmetric dress may have an initial feature set score of 60, but because of positive score adjustments for being flattering for a full body type and round face, with +9 for fabric-bodytype score adjustment, and +7 for fabric-facial score adjustment, the feature set score ends up being 76 if the adjustments are combined with the initial feature set score by simple addition.

So far, design of the customized garment has been focused on the look of the garment. In what follows, methods and systems are describes for making the customized garment with size and fit that are best tailored to the user. Thus, embodiments of the present invention provide the user with a uniquely designed garment in accordance to his or her preferences, facial features and body traits, and tailored to his or her body measurements. Garment sizing information may be obtained directly from a user, from a professional tailor, by algorithmic analysis of answers to questions from the user, or algorithmic analysis of user photos showing a reference garment and a scale reference.

Figure 12:
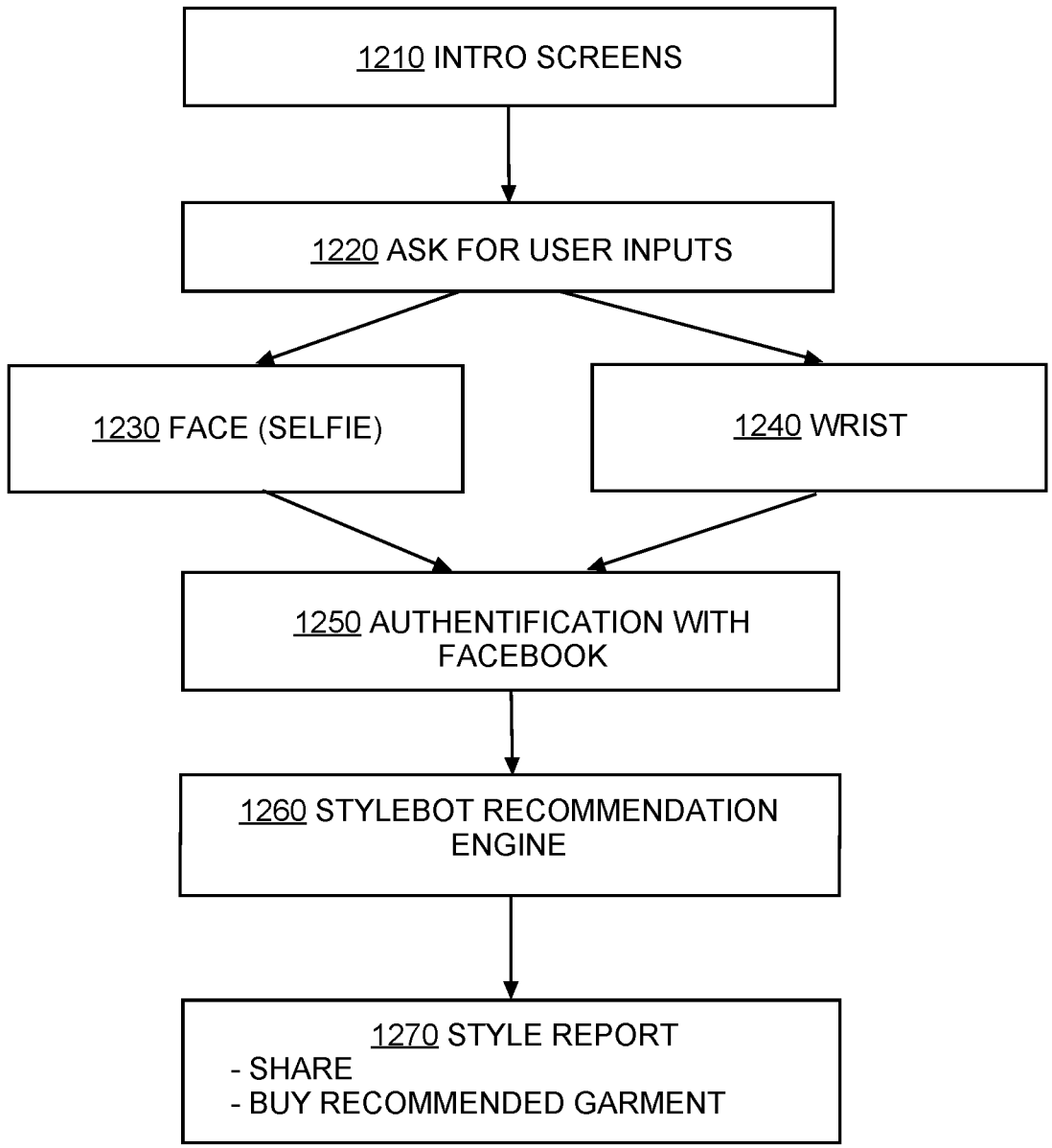
FIG. 12 is a flowchart illustrating a process of generating fashion recommendations for a user interacting with an application, according to one embodiment of the present invention.

FIG. 12 is a flowchart 1200 illustrating a process of generating fashion recommendations for a user interacting with an application based on one embodiment of the present invention. Such fashion recommendation may be the design for a custom garment such as a shirt suitable for the user. At step 1210, an introductory screen for the app may be displayed. Then, the app may ask for user inputs at step 1220. An example of requested user input may be a selfie of the user's face such as shown at step 1230 in order to gather user data to generate user signals such as facial profile and hair color. Another example may be a photo of the wrist of the user such as shown at step 1240, which may provide data on the user's skin tone. At step 1250, the app may ask for the user's authentication to a database, such as to the social network Facebook or other similar social media systems. Following this step, the app may gather more user data from the user's social account, for example from the user's biographical information, likes, statuses, reactions, and photos. At step 1260, the STYLEBOT Recommendation Engine of the app may perform some internal processing on all user data gathered, for example, to process facial features and skin tone. The processing of facial features may include generating facial qualities and signals regarding the user's bone structure. In an embodiment for shirt style recommendation, the app may generate recommended shirt colors based on complementary, split complementarity, triadic, or analogous colors based on the user's skin tone. Furthermore, recommended collar types may be determined based on the shape of the user's head. Other aspects of the recommendation, such as matching pieces for the shirt, or other garments and styles, may be obtained by processing the user data obtained from the user's social account. Finally, a style report for fashion recommendation summarizing the results of the internal processing is presented to the user in step 1270, where the user is given the option to share the results of this analysis, to buy the designed or recommended shirts, other garments, or outfits.

FIG. 13A is an illustrative screenshot 1300 of a fashion recommendation mobile application showing a screen prompting for user inputs according to one embodiment of the present invention. The user may click on facial selfie addition button 1310 to take a selfie of his or her face, or click on wrist photo addition button 1320 to take a picture of his or her wrist, so that the application may receive user data for analysis at internal processing step 1260 to determine features such as user complexion, hair color, prominent facial features, age, hairstyle, skin tone, and whether they have glasses or moustaches or beards. Such user data may be used to generate user signals for fashion recommendation. The user may click on the generate report button 1330 to view the report showing the results of the analysis.

FIG. 13B is an illustrative screenshot 1350 of the fashion recommendation mobile application showing the style report output, according to one embodiment of the present invention. The results of the internal processing step 1260 based on user data such as the selfie of the user's face, wrist color, and Facebook data, may be presented in the form of a Style Report 1355. Style Report 1355 may have sections such as Face Analysis 1360, which shows, for example, whether the user wears glasses 1365, and the user's nose shape 1370. The user may share the style report on Facebook by clicking on a share report button 1375, or share the results to other services. The Style Report may also have a section of Recommended Colors 1380, which in this examples shows a complementary color 1382, split complementary colors 1384, triadic colors 1386, and an analogous color 1386, to the user's skin tone, which may be based on data such as wrist color or user selfie. Finally, there may be a fashion recommendation section 1390, which shows one or more pieces of garment, possibly for purchase. In the example shown here, there is a photo of a "most recommended shirt" that the user may simply click on to purchase. Such a "most recommended shirt" may be custom designed by the internal processing of the application, or may be a ready-to-wear shirt. In other embodiments, such fashion recommendation may not be limited to a shirt, but other types of garments and entire outfits may be generated according to various embodiments of the present invention as disclosed herein, and suggested for purchase.

Exemplary Implementation of the Customized Garment Design System

Figure 14:
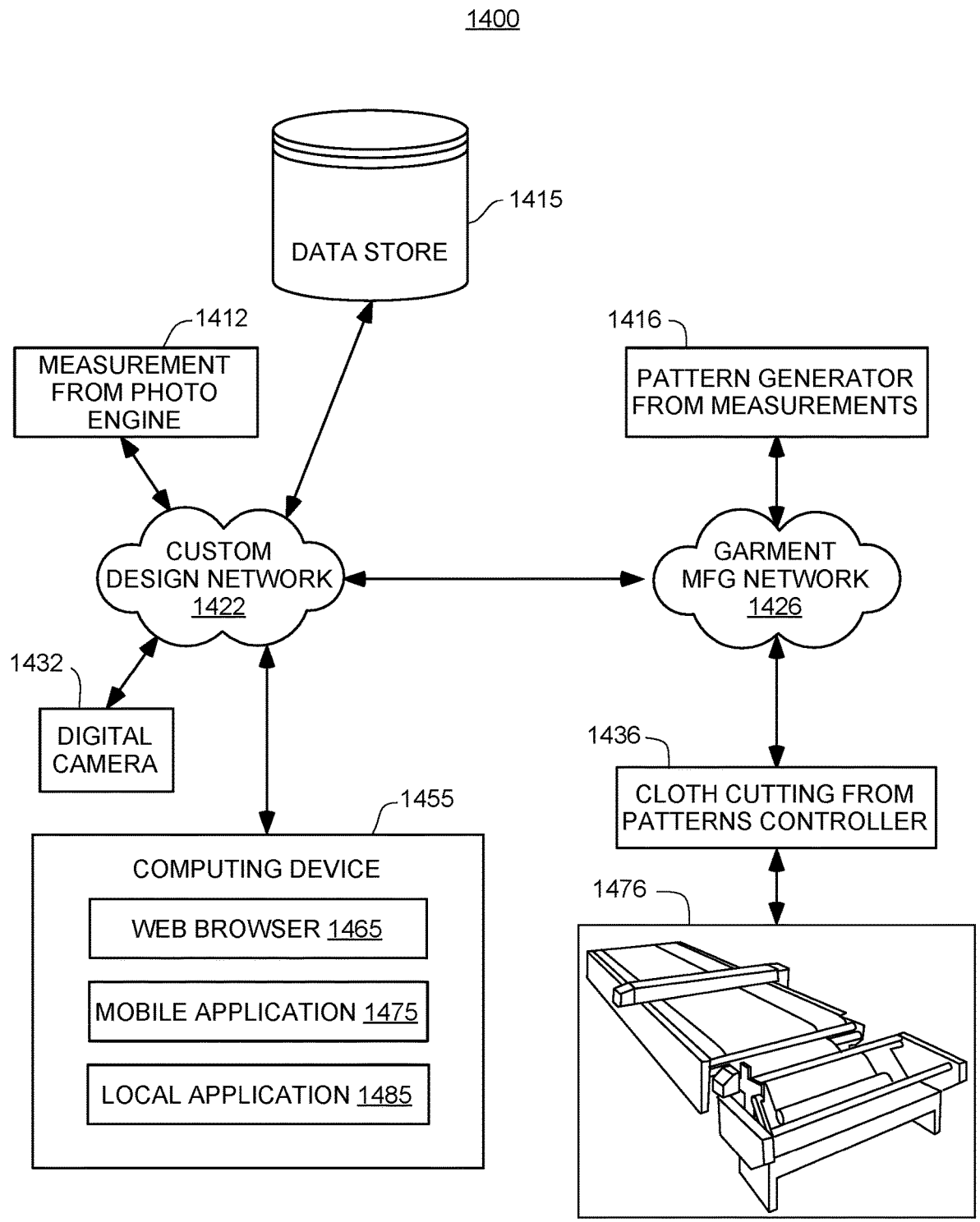
FIG. 14 is an illustrative schematic diagram for a customized garment design and manufacture system, according to one embodiment of the present invention.

FIG. 14 is an illustrative schematic diagram for a customized garment design and manufacture system, according to one embodiment of the present invention.

In FIG. 14, system or environment 1400 comprises data store 1415, measurement-from-photo engine 1412, custom design network or server 1422, digital camera 1432 and computing device 1455 which may be used to access a web browser 1465, a mobile application 1475 and a local application 1485. System 1400 may also include a pattern generator from measurements 1416, a garment manufacturing network 1426, a cloth cutting from patterns controller 1436 and one or more cloth cutting machines 1476. In one example, cloth cutting machines 1476 may include multi-ply conveyorized cutting, single-ply conveyorized cutting and single-ply static cutting machines by Gerber Technology. In another example, cloth cutting machines 1476 may be Shima Seiki multi-ply cutting machines, or another cutting machine.

Digital camera 1432 is usable to capture images of garments such as a reference garment, and may be a stand-alone camera or part of another device, such as an Internet-connected computing device with a camera, such as what is commonly presently referred to as a smart phone, including, for example, an iPhone® from Apple Computer and Android-based phones from Samsung and LG. Other devices such as tablets are also usable to capture and transfer an image of a reference garment. The image can be delivered on paper and re-digitized or delivered electronically. In some embodiments, digital camera 1432 is part of computing device 1455.

Measurement-from-photo engine 1412 generates measurements based on images of garments received from digital camera 1432 as described later. The measurements may be stored in data store 1415, and may be transferred from measurement-from-photo engine 1412. In some implementations, measurement-from-photo engine 1412 is a module within custom design network 1422. In some implementations, measurement-from-photo engine 1412 is a local application 1485 on computing device 1455. Thus, measurements from a reference photo may be made by a user device used to capture the image, by a user device used to upload the image to a design server, or by the design server itself.

Data store 1415 may include primary signals; cut, fabric, style values and scores; as well as feature set values and scores. It may also include measurements for an assortment of garments such as pants, shirts, blazes, jackets, sweaters, T-shirts, polo shirts, dresses, shoes and boots. Data store 1415 may be implemented using a general-purpose distributed memory caching system. In some implementations, data store 1415 may store information from one or more garment engineers into tables of a common database image to form an on-demand database service (ODDS), which can be implemented in many ways, such as a multi-tenant database system (MTDS). A database image can include one or more database objects. In other implementations, the databases can be relational database management systems (RDBMSs), object-oriented database management systems (OODBMSs), distributed file systems (DFS), no-schema database, or any other data storing systems or computing devices.

In some embodiments, pattern generator from measurements 1416 may accept garment distance measurements via garment manufacturing network 1426, for generating patterns for making the customized garment. In some embodiments, pattern generator from measurements 1416 may provide patterns to custom design network 1422, as fabric choices for generating customized garment designs. In some embodiments, custom cloth cutting from patterns controller 1436 may control cloth cutting machine 1476 to cut cloth using garment distance measurements received for the favorite garment.

The raw image of the garment from digital camera 1432 may be imported or uploaded to a computer-based system using one of multiple transfer technologies including but not limited to direct image upload, text message, email or social media message: via a Wi-Fi hotspot or a network. The raw image could be captured from a garment or from a printed picture of a garment, with the raw image including the garment and a scale reference, such as an A4 sheet of paper.

In some embodiment, custom design network or server 1422 provides customized garment design generation services, using systems and methods as described with reference to FIGS. 1 to 13B. One or more components shown in 1475 may be implemented as individual modules within custom design network 1422. For example, measurement from photo engine 1412, data store 1415, and digital camera 1432. Alternatively, such components may be implemented locally within computing device 1455.

Custom design network or server 1422 and garment manufacturing network 1426 may each be any network or combination of networks of computing devices that communicate with one another. For example, custom design network 1422 and garment manufacturing network 1426 may be implemented using one or any combination of general purpose processors, ASIC or RISC processors, memories, storage units, data bus links, a LAN (local area network), WAN (wide area network), telephone network (Public Switched Telephone Network (PSTN), Session Initiation Protocol (SIP), 3G, 4G LTE), wireless network, point-to-point network, star network, token ring network, hub network, WiMAX, Wi-Fi, peer-to-peer connections like Bluetooth, Near Field Communication (NFC), Z-Wave, ZigBee, or other appropriate configuration of data networks, including the Internet. In other implementations, other networks may be used such as an intranet, an extranet, a virtual private network (VPN), a non-TCP/IP based network, any LAN or WAN or the like.

Similar to user input device 118 shown in FIG. 1, computing device 1455 provides an interface to interact with the user, receive user inputs, and display design output to the user. In some embodiments, the customized garment design process may be performed locally on computing device 1455, where custom design network 1422 provides network communication services to other modules shown in 1475. In some embodiments, part of the customized garment design process may be performed locally on computing device 1455, while other parts are performed on a networked server located within custom design network 1422. For example, computing device may analyze an input data to determine a preferred garment category, while custom design network 1422 may perform other necessary steps discussed with reference to FIG. 5. The division of functions between computing device 1455 and custom design network 1422 is an implementation choice, and does not limit the scope of the present invention.

Thus, the present invention may be implemented in a client server environment. In some embodiments, the entire system may be implemented and offered to end-users and/or operators over the Internet, in a cloud implementation. No local installation of software or hardware would be needed, and the end-users and operators would be allowed access to the systems of the present invention directly over the Internet, using either a web browser such as 1465, or similar software on a client, which client could be a desktop, laptop, mobile device, and so on. This eliminates any need for custom software installation on the client side and increases the flexibility of delivery of the service (software-as-a-service), and increases user satisfaction and ease of use. Various business models, revenue models, and delivery mechanisms for the present invention are envisioned, and are all to be considered within the scope of the present invention.

In general, the method executed to implement the embodiments of the invention, may be implemented as part of an operating system or a specific application, component, program, object, module or sequence of instructions referred to as "computer program(s)" or "computer code(s)." The computer programs typically comprise one or more instructions set at various times in various memory and storage devices in a computer, and that, when read and executed by one or more processors in a computer, cause the computer to perform operations necessary to execute elements involving the various aspects of the invention. Moreover, while the invention has been described in the context of fully functioning computers and computer systems, those skilled in the art will appreciate that the various embodiments of the invention are capable of being distributed as a program product in a variety of forms, and that the invention applies equally regardless of the particular type of machine or computer-readable media used to actually effect the distribution. Examples of computer-readable media include but are not limited to recordable type media such as volatile and non-volatile memory devices, floppy and other removable disks, hard disk drives, optical disks (e.g., Compact Disk Read-Only Memory (CD ROMS), Digital Versatile Disks, (DVDs), etc.), and digital and analog communication media.

Customization for Garment Sizing and Measurements

Some embodiments of the present invention may include customizing the design of a garment or part or all of an outfit not only for style but also for size. Even in other embodiments with an emphasis on the style only, size information may help in determining the user's body shape type and thus in improving the design for a flattering garment or outfit for the body shape or type of the user.

To obtain sizing information for the desired customized garment design, the most straightforward way is to receive user body measurements or garment measurements through direct user input. Body measurement information may alternatively be obtained from three-dimensional body scanning, algorithmic computation based on answers to questions from the user, algorithmic computation based on a user photo, and transfer of data from a professional tailor. Similarly, garment measurements may alternatively be obtained from algorithmic computation based on answers to questions from the user, algorithmic computation based on a user photo, and transfer of data from a professional tailor.

In some embodiments, garment measurements may be obtained by making use of the fact that individuals often already own a garment that fits them extremely well, and may be used as a reference for making new garments that fits equally well. Such a garment may be referred to as a "reference garment," "favorite garment," "best-fit garment" or a "preferred garment." In some embodiments, a user may measure the reference garment manually and upload the collected measurements to the customized garment design system. However, this is a time-consuming and likely inaccurate process. Instead, in some embodiments, the user may provide photos of one or more reference garments. One aspect of the present invention relates to the recognition that all information a customized garment design system or custom clothing manufacturer needs to create a garment with a fit based upon the reference garment may be provided by an image of the garment, and a scale reference. The scale reference not only provides dimensional information but also permits perspective correction to be applied to the user-generated image.

Embodiments of the present invention may replicate such a reference or favorite garment using the general process described in FIG. 5. In some cases, embodiments of the present invention may replicate not only the style, but also the fit and sizing of a favorite garment, possibly in its entirely, or by modifying only certain aspects of the garment, for example, changing a fabric color while keeping the same cut as before. The idea of a favorite garment with a best-fit also complements the idea about a preferred cut: a user may prefer a certain cut of a specific feature because that cut is flattering to his or her body shape. For example, a pear-shaped user may prefer A-line skirts to pencil skirts because A-line skirts are more slimming for the figure. In what follows, the process of determining garment measurements from an input photo of a favorite garment is discussed.

Figure 15:
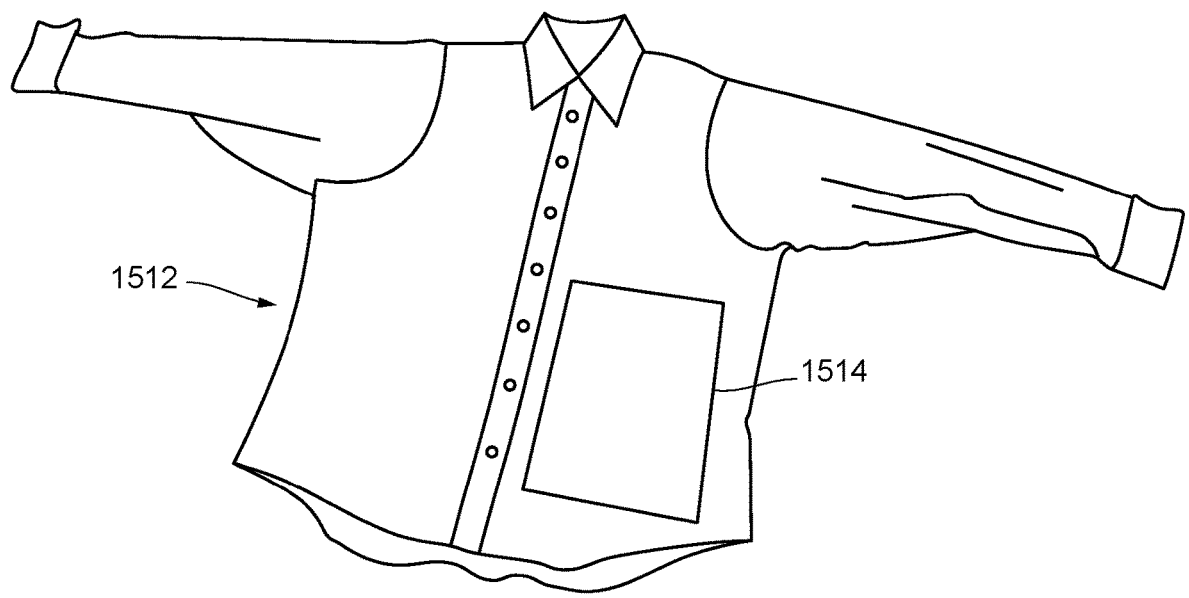
FIG. 15 is a raw image of a favorite garment with a scale reference, according to one embodiment of the present invention.

FIG. 15 illustrates a raw image 1500 of a favorite garment 1512 with a scale reference being provided by a reference rectangle 1514 in the raw image, according to one embodiment of the present invention. In this example, image 1500 may be captured by the owner of the garment. The owner may consider it a favorite garment because the owner likes the way it looks, feels, and fits. The owner would like another garment made which provides the same fit as the favorite garment. In this example, raw image 1500 was captured using a camera, capable of being connected to the Internet for transfer of images, to facilitate transfer of measurements of the favorite garment to a custom clothing manufacturer.

In preparation for capturing an image of the favorite garment, a rectangular reference object, for example an 8.5×11 sheet of paper or a credit card, may be placed on or in near proximity to the garment. Raw image 1500 in FIG. 15 includes the image of reference rectangle 1514. Reference rectangle 1514 in raw image 1500 is shown as a non-rectangular quadrilateral due to the orientation at which raw image 1500 was captured. In this example, reference rectangle 1514 is placed on garment 1512; it could also be placed only partially on garment 1512 or it could be positioned separate from, but near, garment 1512 so that it remains within raw image 1500. As is evident in FIG. 15, the shape of reference rectangle 1514 in FIG. 15 is a non-rectangular quadrilateral because of the non-perfect, skewed orientation at which the image of garment 1512 was captured. In this example, reference rectangle 1514 acts as a scale reference.

Figure 16:
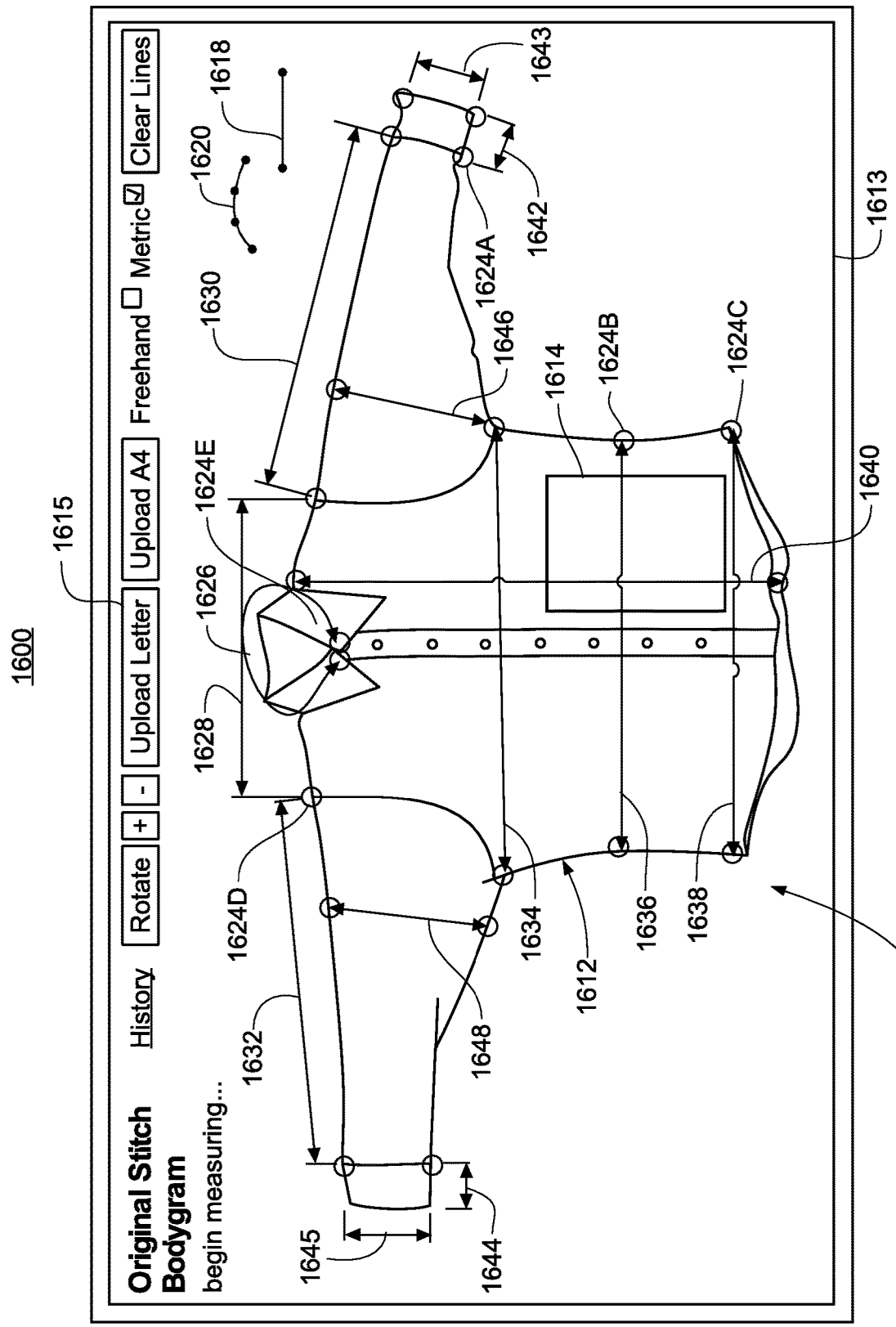
FIG. 16 is a screenshot of an adjusted image of the garment of FIG. 14, together with exemplary line measurement tools, according to one embodiment of the present invention.

Perspective correction of the raw image results in an adjusted image that includes the scale reference viewable as a true rectangle, a quadrilateral with four right angles, and is rotated relative to the raw image. FIG. 16 illustrates adjusted image 1600 of garment 1512 of FIG. 15. Reference rectangle 1614 in FIG. 16 is shown as a true rectangle with opposite sides being the same length and with 90° angles at its corners—the scale reference.

In one example, to reproduce a favorite shirt, up to twelve different measurements may be made available. These measurements may include, but are not limited to collar, shoulder, left sleeve, right sleeve, chest, waist, hip, length, left cuff, right cuff, left bicep, and right bicep.

FIG. 16 illustrates screen capture 1600 of a screen 1613 showing an adjusted image 1605 of the favorite shirt, together with exemplary line measurement tools, created by using the scale reference and a hardware processor and applying perspective correction, the reference rectangle being shown as a true rectangle through the application of perspective correction. Screen 1613 may be displayed on a user device or an operator device in different embodiments of the present invention. In some embodiments, the user, a system operator, or a garment engineer may position the ends of the line measurement tool on measurement reference positions on the adjusted image of the garment. FIG. 16 also shows measurement lines terminating at measurement reference positions on the adjusted image, according to one embodiment of the present invention. FIG. 16 also includes two examples of line measurement tools: a straight-line measurement tool 1618 and a curved-line measurement tool 1620. Line measurement tools 1618, 1620 are used to connect pairs of measurement reference positions 1624A, 1624B, 1624C, 1624D, 1624E (denoted by open circles) with measurement lines. In this example, twelve different measurement lines are created. Curved line measurement tool 1620 is used to create collar measurement line 1626. Straight line measurement tool 1618 is used to create each of the following measurement lines: shoulder measurement line 1628, left sleeve measurement line 1630, right sleeve measurement line 1632, chest measurement line 1634, waist measurement line 1636, hip measurement line 1638, length measurement line 1640, left cuff measurement line 1642, left cuff diameter 1643, right cuff measurement line 1644, left cuff diameter 1645, left bicep measurement line 1646, and right bicep measurement line 1648. A greater or lesser number of measurement lines and different measurement lines can be used according to the particular type or style of the garment. The selection of the measurement reference positions 1624A, 1624B, 1624C, 1624D, 1624E (denoted by open circles) for the measurement lines may depend in large part on the patternmaking software used with the equipment, typically a fabric cutting machine, used in creating the garment.

The size and aspect ratio of the reference rectangle may be determined via different approaches, explicit or automatically determined. A user or operator may identify the reference rectangle used, such as an A4 or 8.5×11 paper or other object, a 3×5 notecard, or a ISO/IEC standard dimension credit card. Such input may be collected via input menu items such as "Upload Letter" icon 1615. A rectangle scoring algorithm, further described later, may find the explicitly identified rectangle. That is, the measurement-from-photo engine 1412 may receive dimensions of the reference rectangle. Another option would be to allow the software to guess/determine the size of the reference rectangle based upon characteristics of the captured image when compared to a data store of common document sizes. Multiple rectangles in a picture can be found, one selected and its dimensions deduced from a list of allowed dimensions and aspect ratios. Or, the size and rounded corners as well as any text or logo on the reference rectangle could indicate that it is a credit card. In one use case, the customer could select from a supplied list of common items which could be used as a reference rectangle, such as a credit card, a dollar bill, or a sheet of standard sized paper.

In one implementation, the transformation from the raw image shown in FIG. 15 to the adjusted image of FIG. 16, which shows perspective correction, includes receiving the raw image of a garment and a scale reference, and recognizing the scale reference.

Using the scale reference and a hardware processor, perspective correction gets applied to adjust the raw image and produce an adjusted image. In one implementation, an open source library of programming functions and methods, such as CV2 provided by OpenCV, can be used to implement the steps in the process, which includes locating perspectives of rectangles in the raw image, scoring the figures located to identify a quadrilateral that corresponds to the reference rectangle, and completing a four point transform of points in the located quadrilateral to form a rectangle with right angles at the corners. A Gaussian blur algorithm can be used to reduce image noise.

Using the dimensions of the adjusted image the set of destination points can be constructed to obtain a bird's eye view, or a top-down view, of the image, after finding squares in the image by searching for four-sided contours, and then scoring and sorting the contours relative to a variety of factors including aspect ratio with respect to the overall image. In some cases, the search for squares can be challenging due to the existence of checkerboard patterns in the surface on which the favorite garment rested when the image was captured, or if the favorite garment includes a plaid pattern in the fabric. Continuing with the perspective correction process, after finding, scoring and sorting the contours, the resulting aspect ratio constraint is usable to produce an adjusted image.

The width of adjusted image 1600 is computed as the maximum distance between the bottom-right and bottom-left x-coordinates and the top-right and top-left x-coordinates. The height of the adjusted image is computed as the maximum distance between the top-right and bottom-right coordinates y-coordinates and the top-left and bottom-left y-coordinates.

Using the adjusted image in conjunction with a straight-line measurement tool and a curved-line measurement tool such as those shown in FIG. 16, the scale of the scale reference may be determined and is usable with a line measurement tool.

The adjusted image and the line measurement tool may be displayed on a display. The user, a system operator, or a garment engineer may position the ends of the line measurement tool on measurement reference positions on the adjusted image of the garment. In some embodiments, the system may perform image recognition and automatically position the ends of the line measurement tool on measurement reference points, where such positions may be accepted and confirmed, or corrected and adjusted by the user, system operator, or garment engineer manually. Then, the garment distance between the measurement reference positions on the adjusted image of the garment may be generated using the line measurement tool. After repeating the process of receiving n positions for the ends of the line measurement tool, and generating the n+1 garment distances, the resulting measurements may be stored in garment distances data store 1415. The generated garment distance measurements may also be provided to garment manufacturing network 1426, for generating patterns for making the favorite garment, or to custom cloth cutting from patterns controller 1436 for cutting cloth for the favorite shirt.

In some embodiments, the measurement-from-photo engine 1412 may measure a favorite garment first, and then adjust the perspective and transform the garment distance parameters, as described next.

Figure 17:
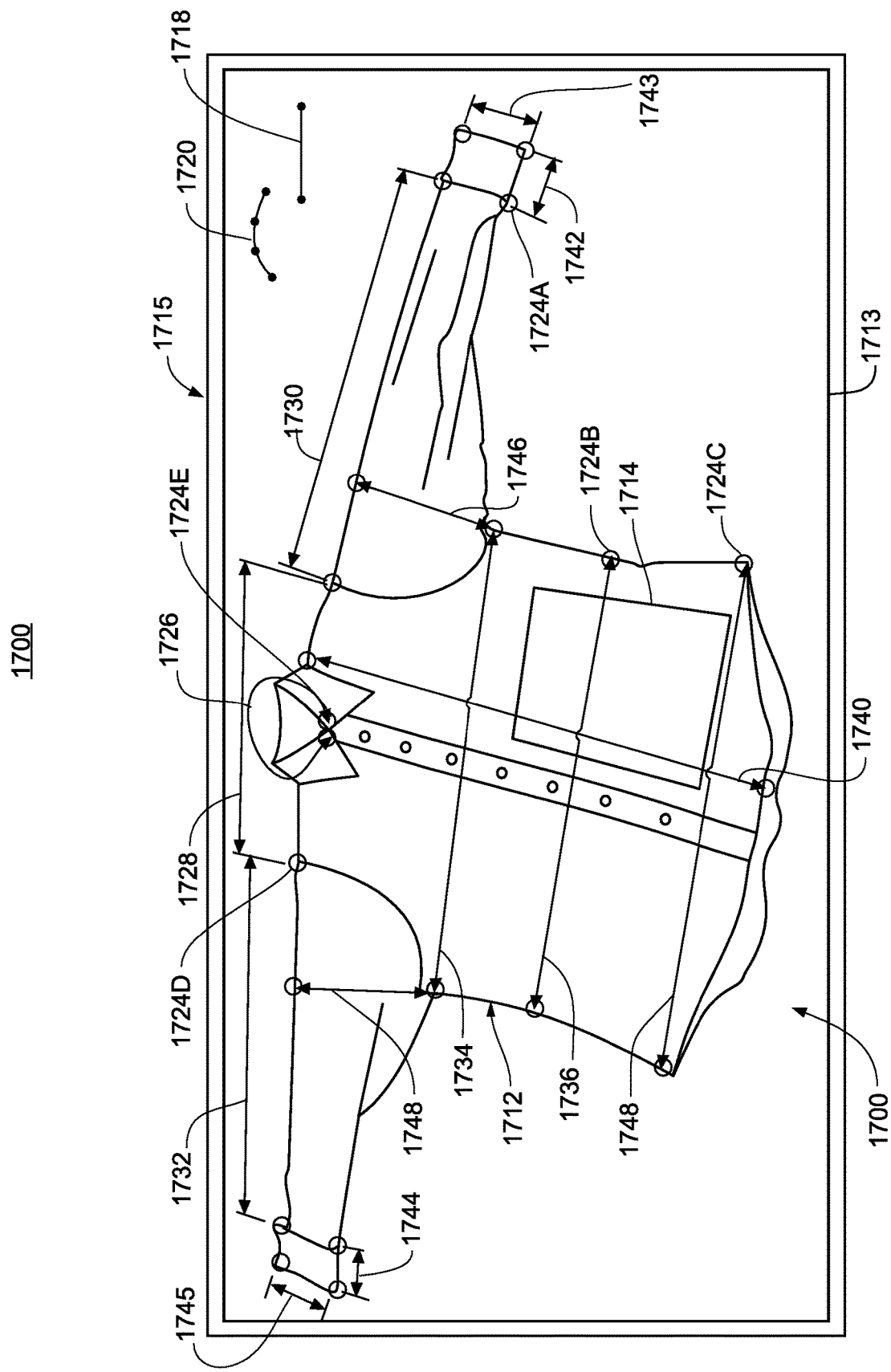
FIG. 17 shows measurement tools and measurement reference positions for an unadjusted drawing from the image shown in FIG. 14, according to one embodiment of the present invention.

FIG. 17 shows a raw image of the favorite shirt with measurements 1700 as it would be displayed on a screen 1713 of a display 1715, according to one embodiment of the present invention. FIG. 17 also includes two examples of line measurement tools: a straight-line measurement tool 1718 and a curved-line measurement tool 1720. Line measurement tools 1718, 1720 are used to connect pairs of measurement reference positions 1724A, 1724B, 1724C, 1724D, 1724E (denoted by open circles) with measurement lines. In this example, twelve different measurement lines are created. Curved line measurement tool 1720 is used to create collar measurement line 1626. Straight line measurement tool 1718 is used to create each of the following measurement lines: shoulder measurement line 1728, left sleeve measurement line 1730, right sleeve measurement line 1732, chest measurement line 1734, waist measurement line 1736, hip measurement line 1738, length measurement line 1740, left cuff measurement line 1742, left cuff diameter 1743, right cuff measurement line 1744, left cuff diameter 1745, left bicep measurement line 1746, and right bicep measurement line 1748. A greater or lesser number of measurement lines and different measurement lines can be used according to the particular type or style of the garment. The selection of the measurement reference positions 1724A, 1724B, 1724C, 1724D, 1724E (denoted by open circles) for the measurement lines will depend in large part on the patternmaking software used with the equipment, typically a fabric cutting machine, used in creating the garment.

The measurement-from-photo engine 1412 receives a raw image of a garment 1512 and a scale reference 1514; causes display of the raw image and a line measurement tool on a display 1715; receives user input comprising first and second points, that position ends of the line measurement tool on measurement reference positions on the raw image of the garment; and generates a pair of garment distance parameters based on the measurement reference positions on the raw image of the garment. This method includes repeating the receiving user input and the generating garment distance parameters steps n times to generate at least n+1 garment distances, with n being an integer equal to at least three. The measurement-from-photo engine 1412 may recognize the scale reference 1514 and, using the scale reference 1514, applies perspective correction to adjust the raw image and produce an adjusted image; and determines a perspective corrected scale of the adjusted image from the scale reference for use producing garment distances. Then the garment distance parameters are transformed using the processor and the perspective corrected scale to produce garment distances; and the garment distances are stored for use in producing a custom garment with a fit based on the garment in the raw image. In some use cases, generating a pair of garment distance parameters comprises generating a distance and an angle orientation of a segment between the ends of the line measurement tool.

In some embodiments, measurement-from-photo engine 1412 may adjust the perspective using measurements from stereographic images of a garment and scale reference, as described next. In this scenario, measurement-from-photo engine 1412 receives first and second raw stereographic images of a garment, optionally including a scale reference, with an indication of lens system characteristics sufficient for scaling a field of view in the raw stereographic images. Using a hardware processor, measurement-from-photo engine 1412 may determine distances from the lens system to at least three points in the raw stereographic image pair and applies a perspective correction based on the distances, to produce at least one adjusted image. A plane defined by the three points may be adjusted to be perpendicular to the view of the camera, between the camera and a reference point such as the center of the raw image. The properties of the lens system may be used to determine what a one percent, one pixel or one degree divergence from the center represents. Measurement-from-photo engine 1412 determines a scale of the adjusted image from at least one of the distances combined with the lens system characteristics for use with the line measurement tool; and causes display of the adjusted image and the line measurement tool on a display, such as a monitor or an optical head-mounted display—in one example a virtual reality headset: Oculus Rift. The stereo images can be used for perspective adjustment and a single, non-stereoscopic image used for measurement.

Distance to three points on a plane may be alternatively be determined using an image and accompanying depth map from a so-called time-of-flight camera. The depth map allows selection of three or more points in the image to define (or over-define) a plane. The perspective correction may proceed as described earlier, based on the three points. Information about the lens system is used by the time-of-flight camera when preparing the depth map. The scale of the image may be determined by combining the depth map with the reasonable assumption that the garment has been positioned on a flat surface. For a discussion of alternative approaches to determining positions in 3D imaging, see, e.g., Larry Li, "Time-of-Flight Camera—An Introduction", Technical White Paper SLOA 190B (rev. May 2014), which is incorporated by reference herein.

The stereographic image-based method includes measurement-from-photo engine 1412 receiving user input that positions ends of the line measurement tool on measurement reference positions on the adjusted image of the garment; and generating a garment distance between the measurement reference positions on the adjusted image of the garment using the line measurement tool; and repeating the receiving user input and garment distance generating steps n times to generate n+1 garment distances, with n equal to at least three. The generated garment distances can be stored for use in producing a custom garment with a fit based on the garment in the raw image, similar to methods described earlier.

In another use case, the generation of garment distance parameters based on the measurement reference positions on the raw image displayed from the stereographic images may be completed, and then the perspective may be transformed using a hardware processor. Distances from the lens system to at least three points in the raw stereographic images may be determined, and a perspective correction based on the distances may be applied, to produce at least one adjusted image. For linear transformations, photo perspective and scale, order and number of linear transformations applied is changeable without affecting the outcome. As described for earlier use cases, garment distances can be stored for use in producing a custom garment with a fit based on the garment in the raw image.

Some embodiments may include a method of submitting a template for manufacture of a custom garment comprising arranging a garment in a display orientation; placing a reference rectangle on or near the garment in the display orientation; capturing a raw image of the garment together with the reference rectangle, the raw image having a perspective; electronically submitting the raw image to a custom clothing manufacturing process with an identification of the reference rectangle sufficient for scaling of the reference rectangle in a perspective-adjusted version of the raw image.

For other embodiments, the method may include submitting a template for manufacture of a custom garment including arranging a garment in a display orientation; capturing a pair of raw stereographic images of the garment through a lens system, the raw images having a perspective; electronically submitting the raw stereographic images to a custom clothing manufacturing process with an identification of optical characteristics of the lens system sufficient for scaling a field of view in the raw stereographic images to produce a perspective-adjusted and scaled version of the raw stereographic images.

In another embodiment or implementation of the disclosed technology, the disclosed method for determining measurements for clothing may be utilized for quality control purposes. For example, a manufacturing company that employs quality control for ensuring standard dimensions and tolerances in their produced garments may use the measured garment distances to verify that batches of garments meet the required tolerances for standard, pre-defined size measurements. For some use cases, garment manufacturers can implement automated sizing on newly completed garments before they ship the garments to customers.

Another use case for the disclosed technology includes a commercial distributor of garments who determines the best standard sizing to distribute to the shopper, based on the measurements determined for the image of the garment provided to the distributor by the shopper. In one example, a distributor may confirm that the dimensions measured, of the garment distances from the garment image submitted by the shopper, are sufficient for a slim fit, a regular fit, a plus size, a petite size or a tall fit.

System Flow

FIG. 18 shows an illustrative flowchart 1800 for an example workflow for determining measurements for custom clothing manufacture. Flowchart 1800 may be implemented at least partially with a database system, e.g., by one or more processors configured to receive or retrieve information, process the information, store results, and transmit the results. Other implementations may perform the steps in different orders and/or with different, fewer or additional steps than the ones illustrated in FIG. 18. The actions described later can be subdivided into more steps or combined into fewer steps to carry out the method described using a different number or arrangement of steps.

In some cases, as the reader will appreciate, a re-arrangement of steps will achieve the same results only if certain other changes are made as well. In other cases, as the reader will appreciate, a re-arrangement of steps will achieve the same results only if certain conditions are satisfied. Furthermore, it will be appreciated that the flow charts herein show only steps that are pertinent to an understanding of the invention, and it will be understood that numerous additional steps for accomplishing other functions can be performed before, after and between those shown.

Upon initialization at step 1805, measurement-from-photo engine 1412 first receives a raw image of a garment and a scale reference at step 1810, and recognizes the scale reference.

At step 1820, measurement-from-photo engine 1412 uses the scale reference and a hardware processor to apply perspective correction to adjust the raw image and produce an adjusted image.

At step 1830, measurement-from-photo engine 1412 determines a scale of the adjusted image from the scale reference for use with a line measurement tool, and causes display of the adjusted image and the line measurement tool on a display device.

At step 1840, measurement-from-photo engine 1412 receives user input that positions ends of the line measurement tool on measurement reference positions on the adjusted image of the garment.

At step 1850, measurement-from-photo engine 1412 generates a garment distance between the measurement reference positions on the adjusted image of the garment using the line measurement tool.

At step 1860, measurement-from-photo engine 1412 repeats the receiving user input and the garment distance generating steps n times to generate at least n+1 garment distances, n being an integer equal to at least 3.

At step 1870, the measurement-from-photo engine 1412 stores the at least n+1 garment distances for use in producing a custom garment with a fit based on the garment in the raw image. The overall process terminates at step 1890.

Scale Reference Recognition

As discussed previously, a scale reference such as 1514 may be detected and recognized from a user-loaded raw image for perspective correction, adjustment of the raw image, and determination of a perspective-corrected scale of the adjusted image for garment sizing distance measurements. In some embodiments, scale reference detection and recognition may be carried out manually, where a user or operator may identify the four corners of the scale reference object, while also providing dimension information for the object. In some embodiments, scale reference recognition may be carried out automatically via computer vision algorithms that analyze changes in color, intensity, brightness, or other similar metrics to identify edges, boundaries, corners, and dimensions of the scale reference object. For example, the system may first run an edge detection algorithm to identify a set of boundaries for objects present in the image, then an object detection algorithm to identify a quadrilateral present in the image as the scale reference.

These edge and object detection algorithms may perform especially well when the scale reference is placed on a surface having a significant color or lighting contract, such as when a piece of white, letter-sized paper is placed against a dark-colored, or patterned garment. To ensure a white scale reference placed against a white or light-colored garment can also be recognized correctly, some embodiments of the present invention employ a shadow detection algorithm. As photos are generally taken at an angle, rather than exactly parallel to the lens, shadows are commonly present and utilized by embodiments of the present invention for scale reference object recognition.

Measurement Accuracy

To illustrate the accuracy level of customized garment sizing measurements achievable by embodiments of the present invention, Tables 1, 2 and 3 below show comparisons of measurements on several test shirts. Tables 1 and 2 compare shirt measurements obtained by an embodiment of the present invention from a user-uploaded photo, to measurements obtained manually by the user from the shirt. In the user-upload photo, the shirt is laid out as in FIG. 15, and a letter sized sheet of paper is placed against the shirt as a scale reference. Measurements are performed on different parts, or features of the shirt, including front body length, waist width, hip width, chest width, cuff width, collar circumference, bicep width, shoulder width, and sleeve length. Absolute values of the differences in measurements are shown as a deviation in Tables 1 and 2, and used to estimate the accuracy of the measurements.

Measurements from a long-sleeved shirt, numbered Shirt 1, are shown in Table 1, while measurement from a short-sleeved shirt, numbered Shirt 2, are shown in Table 2. Shirt 2 does not have a cuff, although a cuff width may still be measured from the photo, at the distal edge of the short sleeve. Also shown are average deviations and average accuracies. Both achieve accuracies within 97% of the manually measurement values.

TABLE 1

Comparison of measurements for a long sleeve shirt (Shirt 1)

|  | From Photo (in) | From Shirt (in) | Deviation (in) | Accuracy |
|---|---|---|---|---|
| Length | 30.29 | 31 | 0.71 | 97.7% |
| Waist | 21.67 | 21.5 | 0.17 | 99.2% |
| Hip | 23.01 | 22.6 | 0.41 | 98.2% |
| Chest | 22.28 | 22 | 0.28 | 98.7% |
| Cuff (L) | 4.52 | 4.25 | 0.27 | 93.7% |
| Collar | 15.87 | 16 | 0.13 | 99.2% |
| Bicep | 8.19 | 8.5 | 0.31 | 96.4% |
| Shoulder | 19.22 | 19.5 | 0.28 | 98.6% |
| Sleeve | 31.74 | 31 | 0.74 | 97.6% |
| Average | — | — | 0.05 | 97.7% |

TABLE 2

Comparison of measurements for a short sleeve shirt (Shirt 2)

|  | From Photo (in) | From Shirt (in) | Deviation (in) | Accuracy |
|---|---|---|---|---|
| Length | 31.79 | 32 | 0.21 | 99.3% |
| Waist | 19.47 | 19.85 | 0.38 | 98.1% |
| Hip | 20.96 | 21 | 0.04 | 99.8% |
| Chest | 20.62 | 21 | 0.38 | 98.2% |
| Cuff | 7.23 | — | — | — |
| Collar | 15.44 | 15.8 | 0.36 | 97.7% |
| Bicep | 7.72 | 7.9 | 0.18 | 97.7% |
| Shoulder | 17.6 | 18 | 0.4 | 97.8% |
| Sleeve | 18.79 | 19 | 0.21 | 98.9% |
| Average | — | — | 0.27 | 98.4% |

Table 3 below compares measurement accuracies in percentages for 10 different shirts of various color, pattern, size, and fit. Also listed are fabric characteristics including color and pattern for each shirt. Measurements for Shirt 1 (S1) and Shirt 2 (S2) are listed as well.

As can be seen from Table 3, measurement accuracies may be achieved for greater than 93%, when averaged over different features for each shirt. On the other hand, cuff, collar, and bicep measurements are generally slightly less accurate. For one, the relatively smaller dimension of these features translates to higher percentage errors when the same amount of deviations is present, compared to other shirt features. For two, features like collar circumference and bicep width are less well defined than others when measured manually by hand. For three, as color and shadow assist in the recognition of shirt features, either through the naked eye or through computer vision algorithms, light colored shirts generally can be measured more accurately than dark colored shirts.

TABLE 3

Percentage Accuracy of measurements from uploaded photos

| % | S1 | S2 | S3 | S4 | S5 | S6 | S7 | S8 | S9 | S10 |
|---|---|---|---|---|---|---|---|---|---|---|
| Color | White/pink | White/navy | Gray | Maroon | Black | White/orange | White | White/blue | Black | Black |
| Pattern | Striped | Plaid | none | none | none | checkered | none | stripe | none | none |
| Length | 97.7 | 99.3 | 98.1 | 99.1 | 99.0 | 98.1 | 98.1 | 98.7 | 99.7 | 96.0 |
| Waist | 99.2 | 98.1 | 97.3 | 98.8 | 97.8 | 99.2 | 99.2 | 98.7 | 98.5 | 99.5 |
| Hip | 98.2 | 99.8 | 98.3 | 95.2 | 98.3 | 97.9 | 97.9 | 98.5 | 92.3 | 99.1 |
| Chest | 98.7 | 98.2 | 97.6 | 97.2 | 94.1 | 96.9 | 96.9 | 99.9 | 99.1 | 99.96 |
| Cuff | 93.7 | — | 93.4 | 97.3 | 97.5 | 97.1 | 97.1 | 97.5 | 96.6 | 86.0 |
| Collar | 99.2 | 97.7 | 93.3 | 97.5 | 97.6 | 99.3 | 99.3 | 93.5 | 96.6 | 84.1 |
| Bicep | 96.4 | 97.7 | 95.4 | 96.3 | 94.0 | 94.9 | 94.9 | 77.1 | 84.4 | 89.4 |
| Shoulder | 98.6 | 97.8 | 98.0 | 99.6 | 98.6 | 98.6 | 98.6 | 98.8 | 98.5 | 92.2 |
| Sleeve | 97.6 | 98.9 | 99.0 | 98.7 | 99.3 | 96.8 | 96.8 | 97.9 | 97.0 | 92.4 |
| Average | 97.7 | 98.4 | 96.7 | 97.7 | 97.4 | 97.7 | 97.7 | 95.6 | 95.9 | 93.2 |

Other Examples

Figure 19:
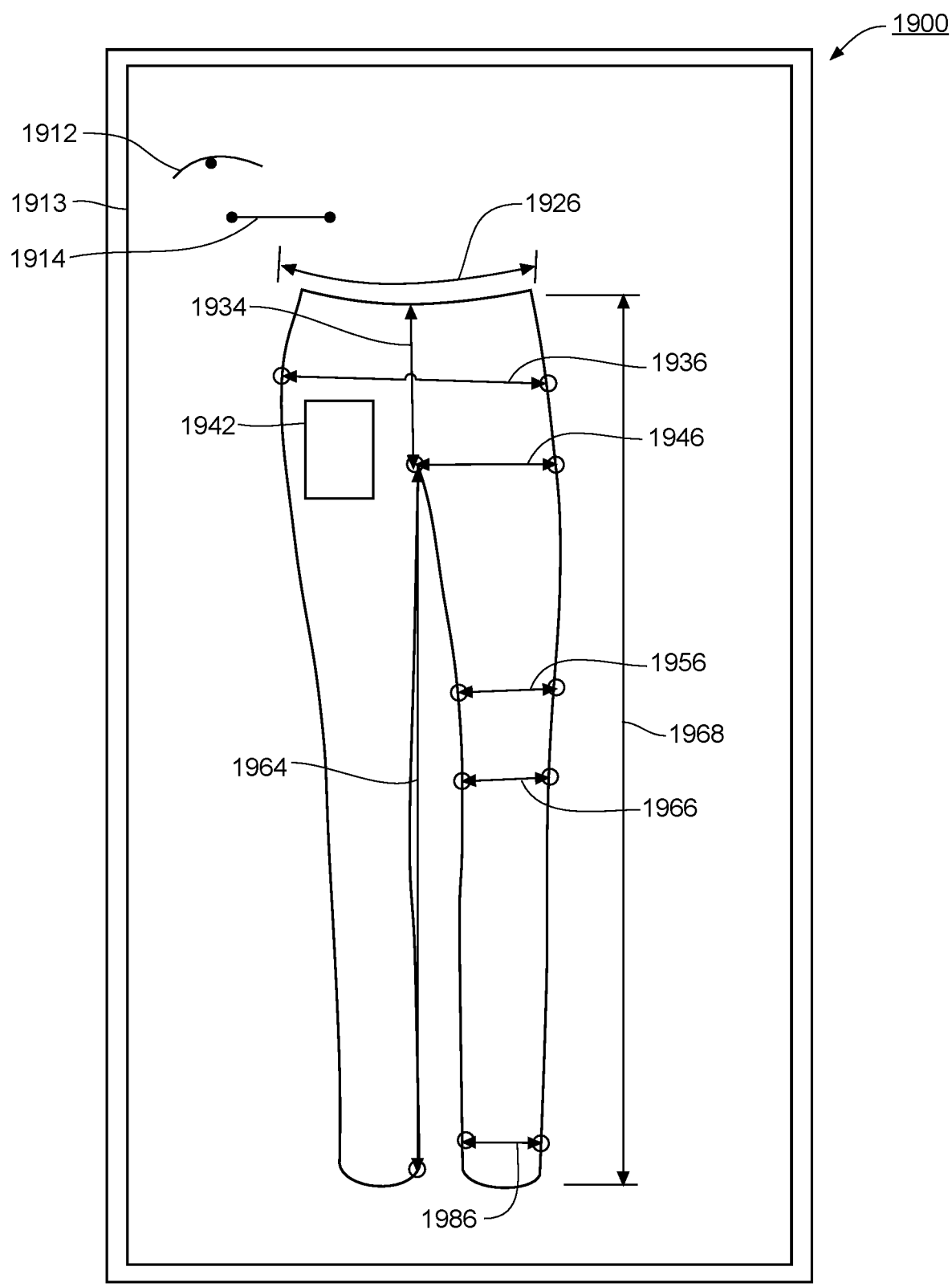
FIG. 19 is an adjusted image of a pair of favorite pants, according to one embodiment of the present invention.

FIG. 19 shows an adjusted image 1900 of a favorite pair of pants with measurements as it would be displayed on a screen 1913 of a display with dimensions useful for requesting a favorite pair of pants, together with exemplary line measurement tools, created by using the scale reference and a hardware processor and applying perspective correction, the reference rectangle being shown as a true rectangle through the application of perspective correction, according to one embodiment of the present invention. Reference rectangle 1942 in FIG. 19 is shown as a true rectangle with opposite sides being the same length and with 90° angles at its corners—the scale reference. Adjusted image FIG. 19 also includes two examples of line measurement tools: a straight-line measurement tool 1914 and a curved-line measurement tool 1912. As described for the earlier example garment images, line measurement tools 1912, 1914 are used to connect pairs of measurement reference positions. In this example, nine different measurement lines are created. Curved line measurement tool 1912 is used to create waist measurement line 1926. Straight line measurement tool 1914 is used to create each of the following measurement lines: waist to crotch 1934, width at hips 1936, pant leg width at crotch 1946, pant leg width at thigh 1956, pant leg width at knee 1966, pant leg width at bottom seam 1986, pant total length 1968, and inseam length 1964. A greater or lesser number of measurement lines and different measurement lines can be used according to the particular type or style of the garment.

Figure 20:
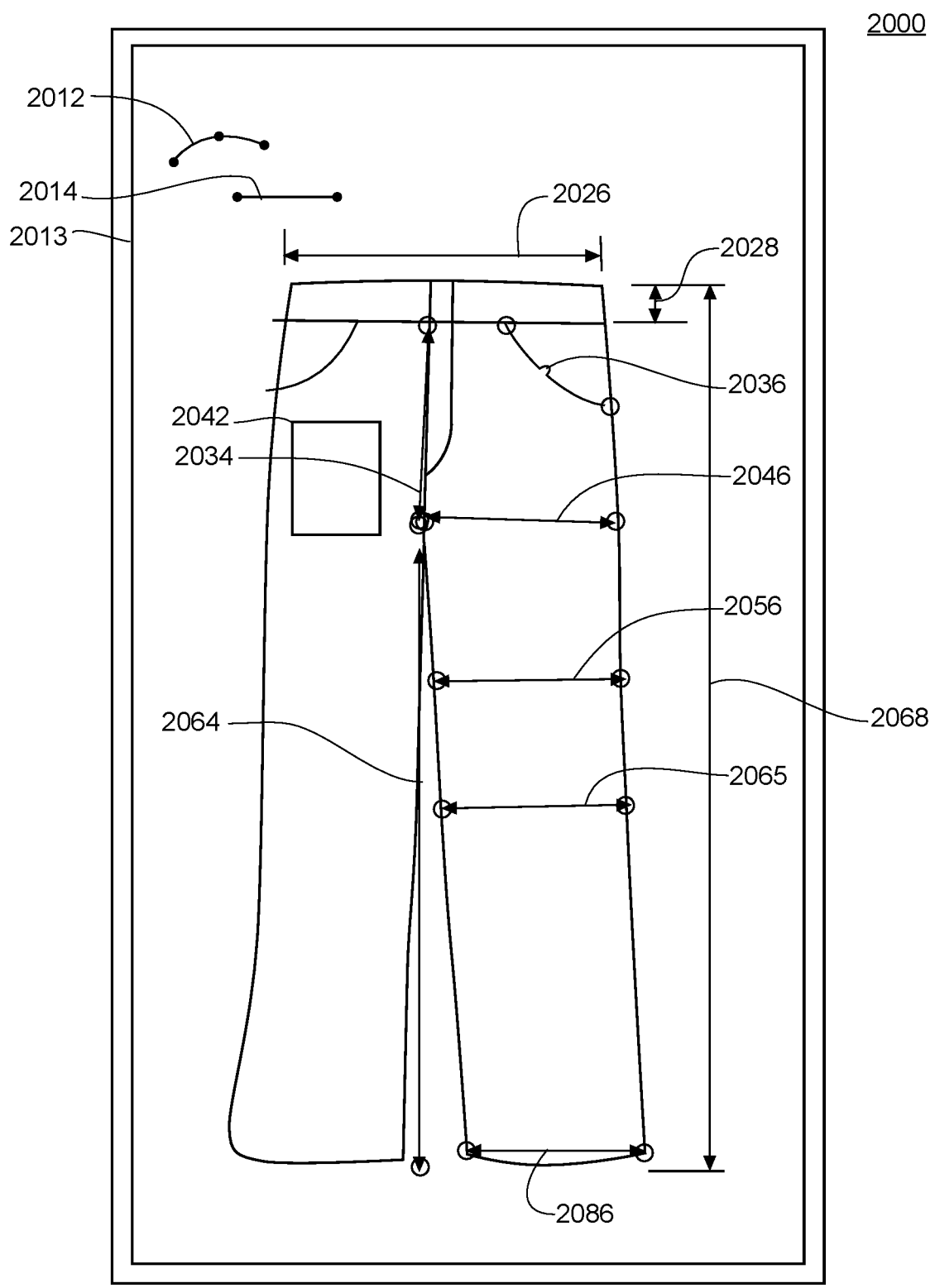
FIG. 20 is an adjusted image of a second pair of favorite pants, with different styles, according to one embodiment of the present invention.

FIG. 20 shows an adjusted image 2000 of a second style of favorite pair of pants with measurements as it would be displayed on a screen 2013 of a display, with dimensions useful for requesting a favorite pair of pants very different from the pair of pants displayed in FIG. 19. Reference rectangle 2042 in FIG. 20 is shown as a true rectangle with opposite sides being the same length and with 90° angles at its corners, the scale reference. Adjusted image FIG. 20 also includes two examples of line measurement tools: a straight-line measurement tool 2014 and a curved-line measurement tool 2012. As described for the earlier example garment images, line measurement tools 2012, 2014 are used to connect pairs of measurement reference positions. In this example, curved line measurement tool 2012 is used to create the measurement for pocket stitching curvature 2036. Straight line measurement tool 2014 is used to create each of the following measurement lines: waist measurement line 2026, waistband width 2028, waist to crotch 2034, width at hips 2036, pant leg width at crotch 2046, pant leg width at thigh 2056, pant leg width at knee 2065, pant leg width at bottom seam 2086, pant total length 2068, and inseam length 2064. Note that a comparison of the relative relationships between the measurements in the two pants figures in FIG. 19 and FIG. 20 yield different design parameters.

Figure 21:
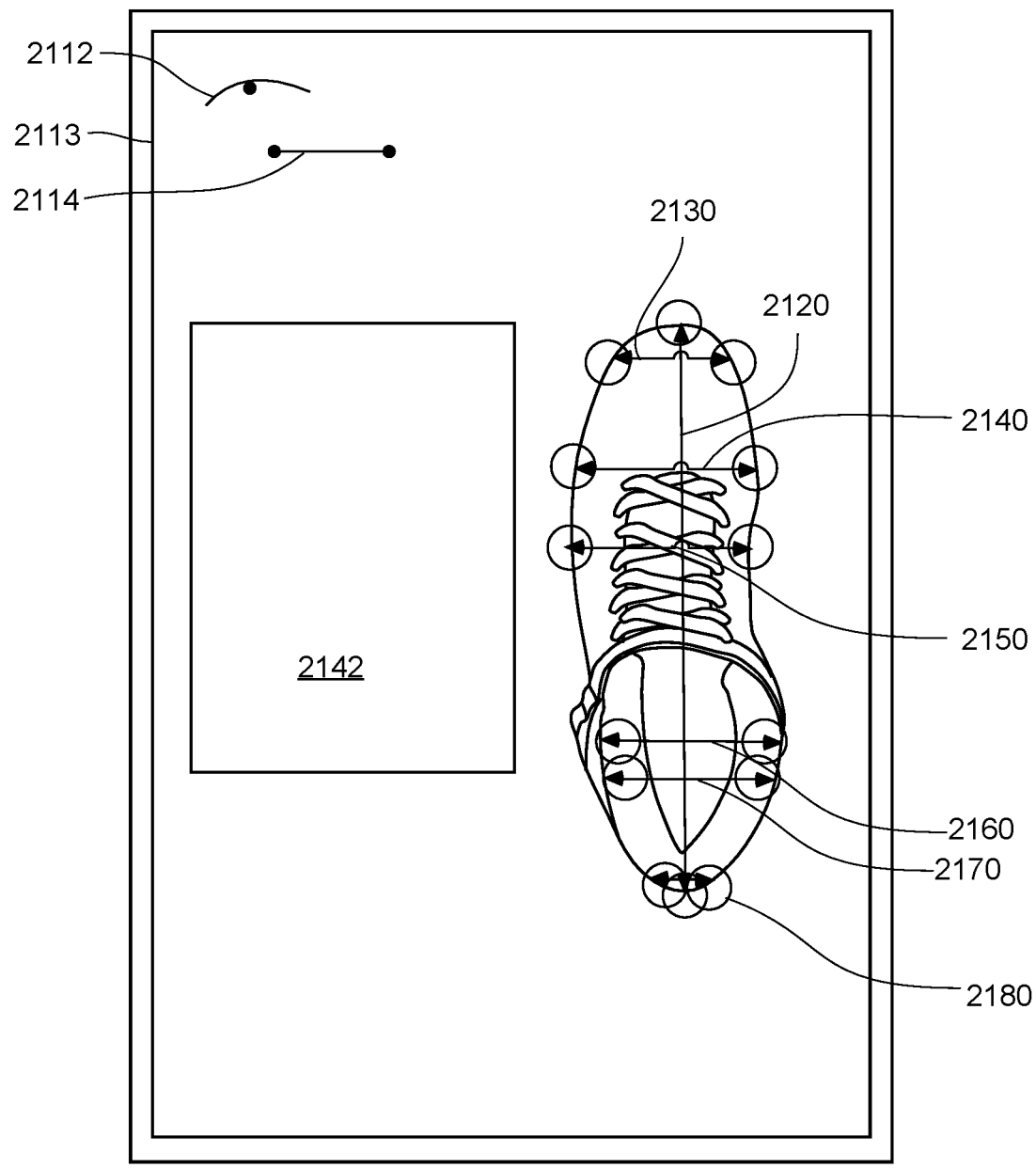
FIG. 21 shows an adjusted image of a sneaker, according to one embodiment of the present invention.

FIG. 21 shows an adjusted image 2100 of a sneaker with measurements as it would be displayed on a screen 2113 of a display with dimensions useful for requesting a favorite pair of sneakers, together with exemplary line measurement tools, created by using the scale reference and a hardware processor and applying perspective correction, the reference rectangle being shown as a true rectangle through the application of perspective correction, according to one embodiment of the present invention. Reference rectangle 2142 in FIG. 21 is shown as a true rectangle with opposite sides being the same length and with 90° angles at its corners, the scale reference. Adjusted image FIG. 21 also includes one example of line measurement tools: a straight-line measurement tool 2114. As described for the earlier example garment images, line measurement tools 2114 are used to connect pairs of measurement reference positions. In this example, straight line measurement tool 2114 is used to create each of the following measurement lines: shoe length 2120, a first width near the toe 2130, a second width near the ball of the sole 2140, a third width just below the ball of the sole 2150, a fourth width just in front of the heel 2160, a fifth width at the heel 2170, and a sixth width at the back of the heel 2180.

Figure 22:
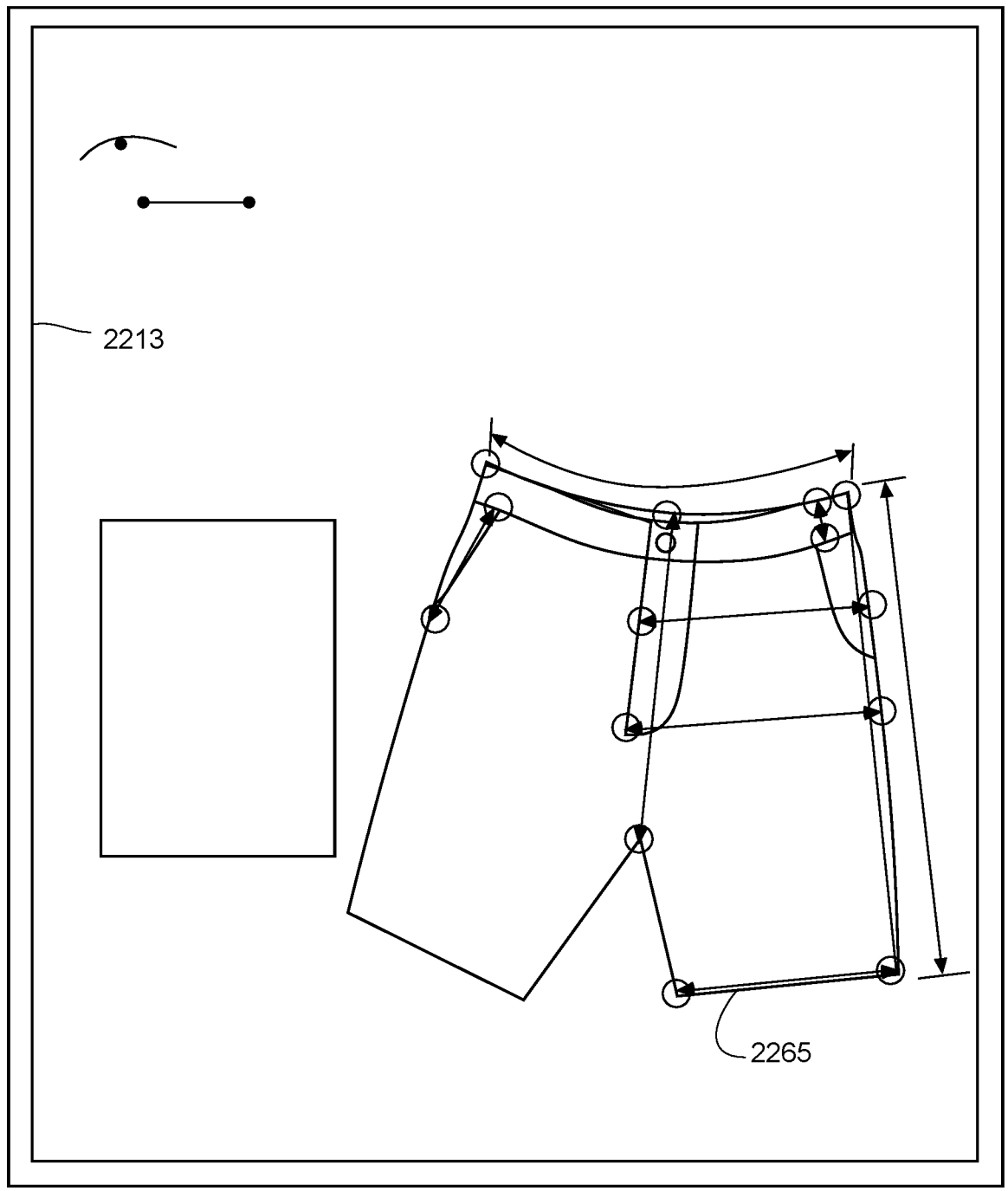
FIG. 22 shows an adjusted image of a pair of shorts, according to one embodiment of the present invention.

FIG. 22 shows an adjusted image 2200 of a pair of shorts with measurements as it would be displayed on a screen 2213 of a display with dimensions useful for requesting a favorite pair of shorts, according to one embodiment of the present invention. All measurements are analogous to the ones in the pants shown FIG. 20 except that short leg width at knee 2265 is already the width at the bottom seam, so that there is a total of one measurement less than the case in FIG. 20.

Figure 23:
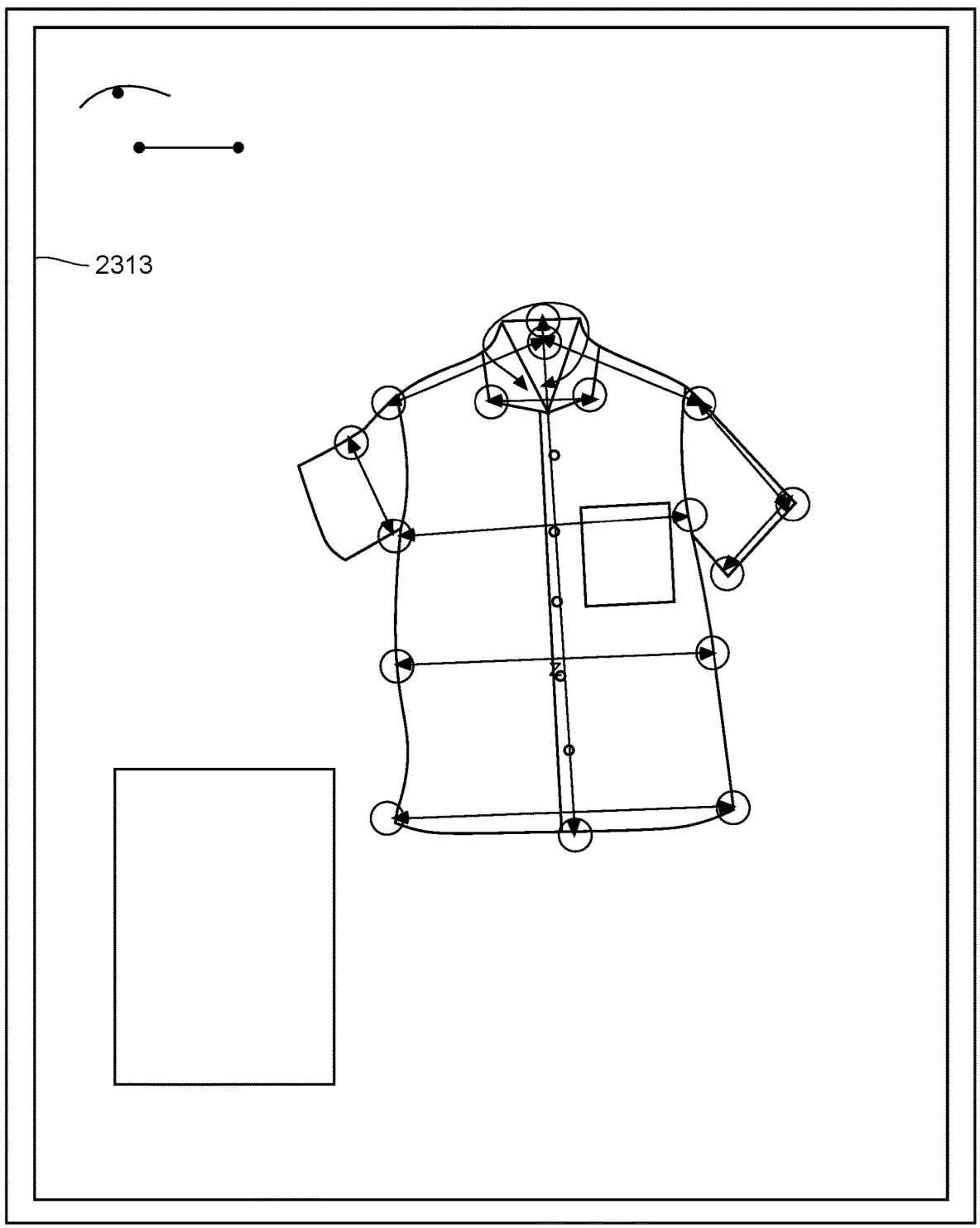
FIG. 23 shows an adjusted image of a short-sleeved shirt, according to one embodiment of the present invention.

FIG. 23 shows an adjusted image 2300 of a short-sleeved shirt with measurements as it would be displayed on a screen 2313 of a display with dimensions useful for requesting a favorite short sleeved shirt, according to one embodiment of the present invention. All the measurements are analogous to the ones in shirt shown FIG. 17 except that there is no left cuff measurement line or right cut measurement line here.

Figure 24:
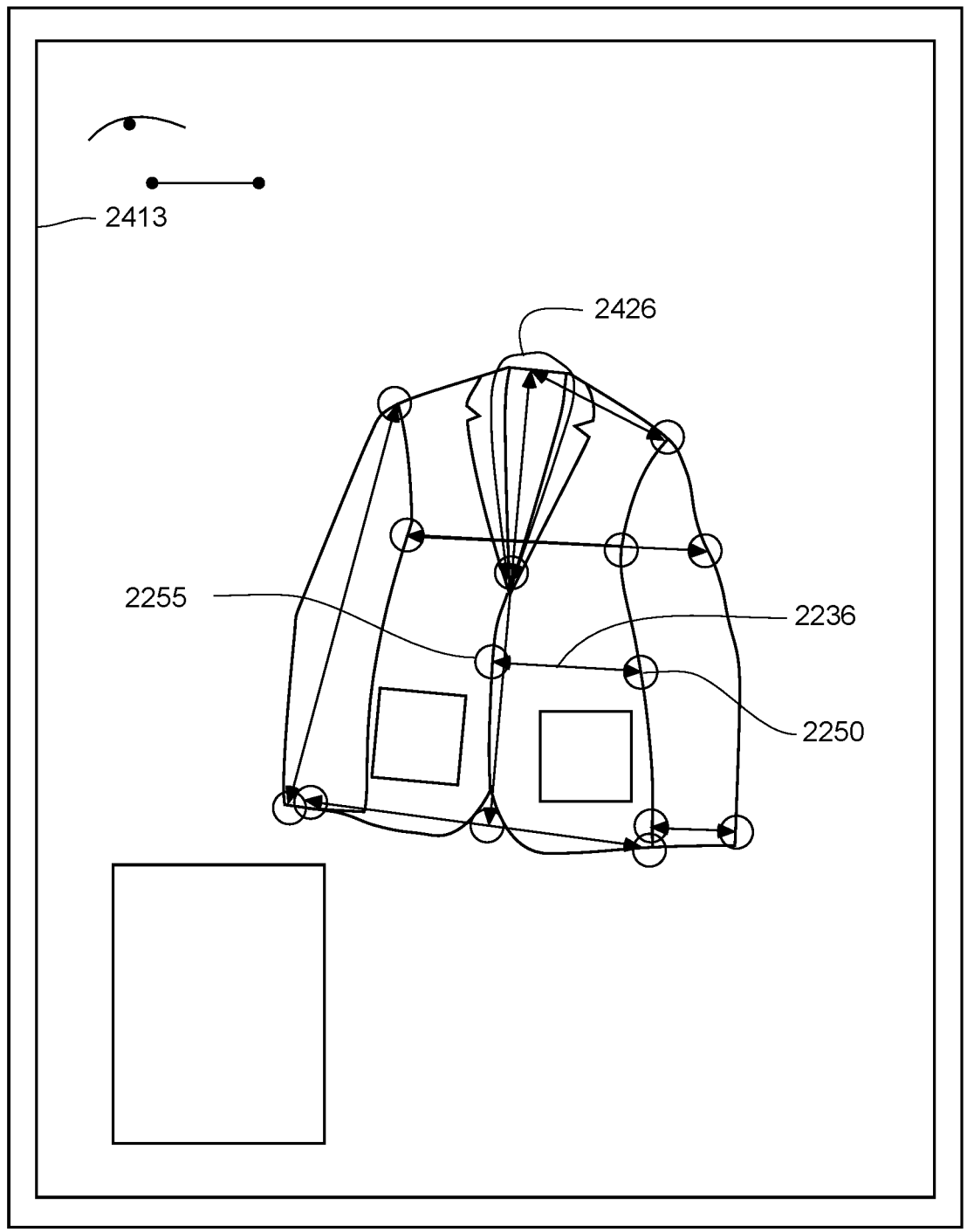
FIG. 24 shows an adjusted image of a suit jacket, according to one embodiment of the present invention.

FIG. 24 shows an adjusted image 2400 of a suit jacket with measurements as it would be displayed on a screen 2413 of a display with dimensions useful for requesting a favorite short sleeved shirt, according to one embodiment of the present invention. All the measurements are analogous to the ones in shirt shown FIG. 17 except that the collar design is different and collar measurement line 2426 is expected to be much larger than that for a shirt. Another difference is that waist measurement line 2436 is made from the side 2450 to the jacket opening 2455 instead of a waist measurement line across the whole garment as waist measurement line 1736 in FIG. 17.

Figure 25:
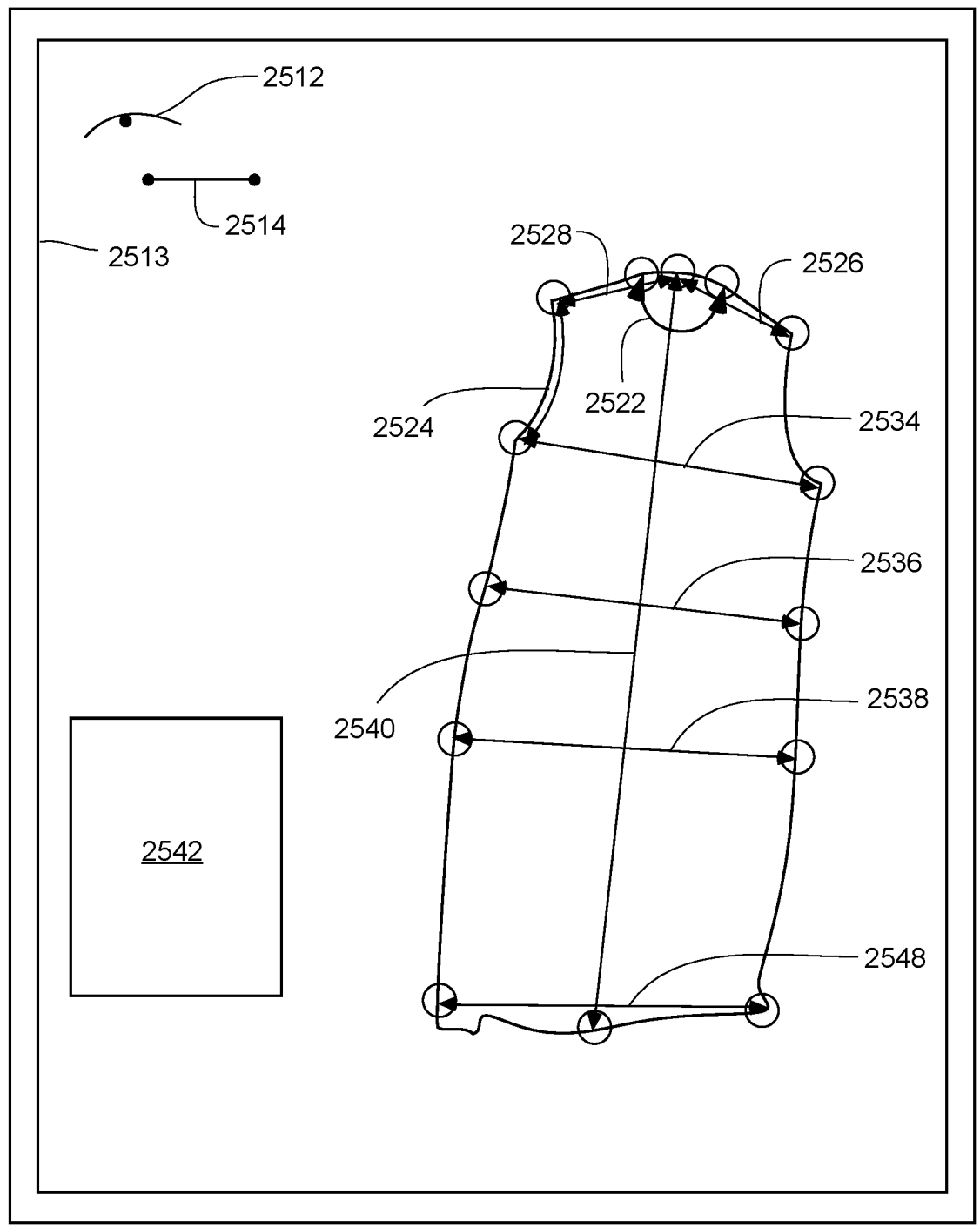
FIG. 25 shows an adjusted image of a dress, according to one embodiment of the present invention.

FIG. 25 shows an adjusted image 2500 of a dress with measurements as it would be displayed on a screen 2513 of a display with dimensions useful for requesting a favorite dress, according to one embodiment of the present invention. Reference rectangle 2542 in FIG. 25 is shown as a true rectangle with opposite sides being the same length and with 90° angles at its corners, the scale reference. Adjusted image FIG. 25 also includes two examples of line measurement tools: a straight-line measurement tool 2514 and a curved-line measurement tool 2512. As described for the earlier example garment images, line measurement tools 2512, 2514 are used to connect pairs of measurement reference positions. In this example, curved line measurement tool 2512 is used to create collar measurement line 2522 and armhole curvature 2524. Straight line measurement tool 2514 is used to create each of the following measurement lines: left center-to-shoulder measurement line 2526, right center-to-shoulder measurement line 2528, chest measurement line 2534, waist measurement line 2536, hip measurement line 2538, length measurement line 2540, and bottom hem measurement line 2548.

Figure 26:
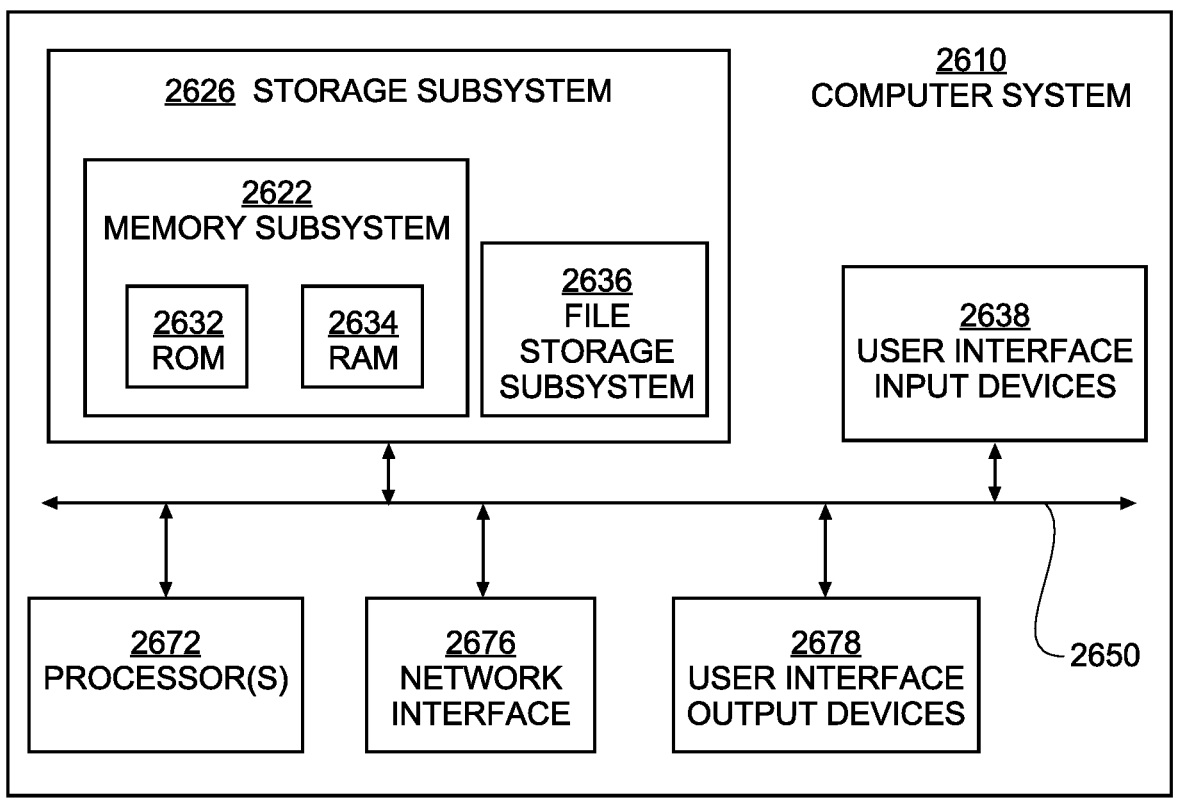
FIG. 26 shows an exemplary computer system for determining measurements for custom clothing manufacture, according to one embodiment of the present invention.

FIG. 26 shows a block diagram 2600 for an exemplary computer system 2610 for implementing customized garment design and measurement methods as disclosed herein, according to some embodiments of the present invention. Computer system 2610 may be adapted for use as user device 118 in FIG. 1, computing device 1455 in 1475, custom design network/server 1422 in 1475, or other appropriate stand-alone or integrated modules and systems disclosed herein.

Computer system 2610 typically includes at least one processor 2672 that communicates with a number of peripheral devices via bus subsystem 6. Processor 2672 may be general purpose, or an ASIC or RISC processor. It may be an FPGA or other logic or gate array. It may include graphic processing unit (GPU) resources. Peripheral devices may include a storage subsystem 2626 including, for example, memory devices and a file storage subsystem, user interface input devices 2638, user interface output devices 2678, and a network interface subsystem 2676. The input and output devices allow user interaction with computer system 2610. Network interface subsystem 2676 provides an interface to outside networks, including an interface to corresponding interface devices in other computer systems.

User interface input devices 2638 may include a keyboard, pointing devices such as a mouse, trackball, touchpad, or graphics tablet, a scanner, a touch screen incorporated into the display, audio input devices such as voice recognition systems and microphones; and other types of input devices. In general, use of the term "input device" is intended to include the possible types of devices and ways to input information into computer system 2610.

User interface output devices 2678 may include a display subsystem, a printer, a fax machine, or non-visual displays such as audio output devices. The display subsystem may include a cathode ray tube (CRT), a flat-panel device such as a liquid crystal display (LCD), a projection device, or some other mechanism for creating a visible image. The display subsystem may also provide a non-visual display such as audio output devices. In general, use of the term "output device" is intended to include the possible types of devices and ways to output information from computer system 2610 to the user or to another machine or computer system.

Storage subsystem 2624 stores programming and data constructs that provide the functionality of some or all of the modules and methods described herein. These software modules are generally executed by processor 2672 alone or in combination with other processors.

Memory 2622 used in the storage subsystem can include a number of memories including a main random-access memory (RAM) 2634 for storage of instructions and data during program execution and a read only memory (ROM) 2632 in which fixed instructions are stored. A file storage subsystem 2636 can provide persistent storage for program and data files, and may include a hard disk drive, a floppy disk drive along with associated removable media, a CD-ROM drive, an optical drive, or removable media cartridges. The modules implementing the functionality of certain implementations may be stored by file storage subsystem 2636 in the storage subsystem 2626, or in other machines accessible by the processor.

Bus subsystem 2650 provides a mechanism for letting the various components and subsystems of computer system 2610 communicate with each other as intended. Although bus subsystem 2650 is shown schematically as a single bus, alternative implementations of the bus subsystem may use multiple busses.

Computer system 2610 can be of varying types including a workstation, server, computing cluster, blade server, server farm, or any other data processing system or computing device. Due to the ever-changing nature of computers and networks, the description of computer system 2610 depicted in FIG. 26 is intended only as one example. Many other configurations of computer system 2610 are possible having more or fewer components than the computer system depicted in FIG. 26.

Conclusions

One of ordinary skill in the art knows that the use cases, structures, schematics, and flow diagrams may be performed in other orders or combinations, but the inventive concept of the present invention remains without departing from the broader scope of the invention. Every embodiment may be unique, and methods/steps may be either shortened or lengthened, overlapped with the other activities, postponed, delayed, and continued after a time gap, such that every user is accommodated to practice the methods of the present invention.

Although the present invention has been described with reference to specific exemplary embodiments, it will be evident that the various modification and changes can be made to these embodiments without departing from the broader scope of the invention. Accordingly, the specification and drawings are to be regarded in an illustrative sense rather than in a restrictive sense. It will also be apparent to the skilled artisan that the embodiments described above are specific examples of a single broader invention which may have greater scope than any of the singular descriptions taught. There may be many alterations made in the descriptions without departing from the scope of the present invention.

What is claimed is:

1. A method for generating a customized garment design, comprising:
    retrieving a user signal about a user;
    identifying a user style comprising at least a preferred garment category for the user by analyzing the user signal;
    retrieving a group of features for the preferred garment category, wherein each of the features is associated with at least one style variable;
    for each of the style variables, identifying at least one preferred style value based on the user signal;
    generating one or more candidate garment feature sets by selecting one or more combinations of preferred style values for each style variable; and
    generating the customized garment design by selecting a garment feature set from the one or more candidate garment feature sets.

2. The method of claim 1, wherein at least one style variable associated with at least one of the features is selected from the group consisting of a cut variable and a fabric variable.

3. The method of claim 1, wherein each preferred style value is associated with a score computed based on the user signal, and wherein the score indicates an affinity to the user.

4. The method of claim 3, wherein each candidate garment feature set is associated with a feature set score computed from style value scores associated with the selected preferred style values.

5. The method of claim 4, wherein the selected garment feature set has a highest feature set score.

6. The method of claim 4, wherein each feature set score is further computed from at least one inter-style score adjustment.

7. The method of claim 1, further comprising:
    providing a graphical user interface to enable a human operator to adjust the features and/or garments in the generated customized garment design.

8. The method of claim 1,
    wherein the preferred garment category is a shirt, and
    wherein each of the features for the shirt is selected from the group consisting of collar, collar band, cuff, armhole, yoke, placket, lower front body, upper front body, pocket, front placket, back body, and hem/shirt tail, seam style, embroidery, button, zipper, and Velcro.

9. The method of claim 1,
    wherein the preferred garment category is a dress, and
    wherein each of the features for the dress are selected from the group consisting of neckline, neck band, bodice, corset, center front, apex, waistline, skirt, pocket, placket, chemise, shoulder seam, arm, armhole, armhole ridge, and hemline, seam style, embroidery, buttons, Velcro, zippers, belts, tassels, flowers, beads, sequins, piping, and laces.

10. The method of claim 1, further comprising:
    specifying at least one body measurement of the user for generating the customized garment design, by a process selected from the group consisting of receiving direct user input, three-dimensional body scanning, algorithmic computation based on answers to questions from the user, algorithmic computation based on a user photo, and transfer of data from a professional tailor.

11. The method of claim 1, further comprising
    specifying at least one garment measurement for generating the customized garment design, by a process selected from the group consisting of receiving direct user input, algorithmic computation based on answers to questions from the user, algorithmic computation based on a user photo, and transfer of data from a professional tailor.

12. The method of claim 1,
    wherein the at least one user signal comprises at least one facial feature, and
    wherein the at least one facial feature is selected from the group consisting of skin tone, facial bone structure, hair color, and eye color.

13. The method of claim 1, further comprising:
    retrieving public data related to the identified user style, wherein for each of the style variables, the identifying of the at least one preferred style value is further based on the retrieved public data.

14. The method of claim 1,
    wherein the at least one user signal is retrieved by analyzing user data, and
    wherein the user data is received from the user and/or from a third-party source.

15. The method of claim 14, wherein the user data comprises one or more of a photo of the user, a photo of a garment, a specification of the preferred garment category, a description of a favorite style, a description of one or more of the pluralities of features, a description of a current mood, user social media statuses, social media comments made by the user, social media comments on the user's posts, and a text description of a desired garment design.

16. The method of claim 14, further comprising:
    determining whether the user data comprises at least one garment photo displaying a preferred garment;
    in response to determining that the user data comprises at least one garment photo displaying a preferred garment,
        analyzing the at least one garment photo to determine a group of reference features for the preferred garment; and determining a garment sub-category within the preferred garment category for generating the customized garment design, based on the group of reference features.

17. The method of claim 14,
wherein the analyzing of the user data comprises determining the user's body shape, and
wherein the identifying of the preferred garment category is based on the user's body shape.

18. The method of claim 1, wherein the user style further comprises a preferred garment style.

19. The method of claim 18, wherein the preferred garment style is determined from the preferred garment category.

20. The method of claim 18, wherein the preferred garment category is determined from the preferred garment style.

21. The method of claim 18, further comprising:
according to the preferred garment style, determining a preferred accessory category for a customized accessory design that accompanies the customized garment design, wherein the preferred accessory category is a category of a feature that cannot be described by cut or fabric.

22. The method of claim 21, further comprising:
retrieving public data related to the preferred accessory category;
retrieving a group of accessory features for the preferred accessory category from an internal database and/or public data;
for each of the group of accessory features, identifying at least one preferred style value, by analyzing the user signal and/or the public data, wherein each preferred style value is associated with a style value score computed based on the user signal, and wherein the style value score indicates an affinity to the user;
generating one or more candidate accessory feature sets by selecting one preferred style value for each of the group of accessory features, wherein each candidate accessory feature set is associated with an accessory feature set score computed from style value scores associated with the selected preferred style values; and
generating the customized accessory design by selecting a candidate accessory feature set with a highest feature set score.

23. The method of claim 1,
wherein the preferred user style comprises a preferred outfit style, and
wherein a customized outfit design having the preferred outfit style comprises at least the customized garment design.

24. The method of claim 23, wherein the customized outfit design comprises a second customized garment design.

25. The method of claim 24, further comprising:
generating one or more candidate outfit feature sets by combining candidate garment feature sets associated with each customized garment design, wherein a candidate outfit feature set score for each candidate outfit feature set is computed from feature set scores for each customized garment design in the outfit, and inter-garment score adjustments; and
generating the customized outfit design by selecting a candidate outfit feature set with a highest feature set score.

26. The method of claim 24, further comprising:
according to the preferred outfit style, determining a preferred accessory category for a customized accessory design that accompanies the outfit, wherein the preferred accessory category is a category of a feature that cannot be described by cut or fabric.

27. A system for generating a customized garment design, comprising:
a server having access to at least one processor; and
a non-transitory physical storage medium for storing program code and accessible by the server, the program code when executed by the processor, causes the processor to:
retrieve a user signal about a user;
identify a user style comprising at least a preferred garment category for the user by analyzing the user signal;
retrieve a group of features for the preferred garment category, wherein each of the features is associated with at least one style variable;
for each of the style variables, identify at least one preferred style value based on the user signal;
generate one or more candidate garment feature sets by selecting one or more combinations of preferred style values for each style variable; and
generate the customized garment design by selecting a garment feature set from the one or more candidate garment feature sets.

28. The system of claim 27, wherein at least one style variable associated with at least one of the features is selected from the group consisting of a cut variable and a fabric variable.

29. The system of claim 27, wherein each preferred style value is associated with a score computed based on the user signal, and wherein the score indicates an affinity to the user.

30. A non-transitory computer-readable storage medium for generating a customized garment design, the storage medium comprising program code stored thereon, that when executed by a processor, causes the processor to:
retrieve a user signal about a user;
identify a user style comprising at least a preferred garment category for the user by analyzing the user signal;
retrieve a group of features for the preferred garment category, wherein each of the features is associated with at least one style variable;
for each of the style variables, identify at least one preferred style value based on the user signal;
generate one or more candidate garment feature sets by selecting one or more combinations of preferred style values for each style variable; and
generate the customized garment design by selecting a garment feature set from the one or more candidate garment feature sets.

* * * * *